(12) United States Patent
Ocker

(10) Patent No.: US 12,254,914 B2
(45) Date of Patent: *Mar. 18, 2025

(54) MEMORY CELL WITH ACCESS DEVICE AND MEMORY CAPACITOR STRUCTURES

(71) Applicant: Ferroelectric Memory GmbH, Dresden (DE)

(72) Inventor: Johannes Ocker, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 0 days.

This patent is subject to a terminal disclaimer.

(21) Appl. No.: 18/530,182

(22) Filed: Dec. 5, 2023

(65) Prior Publication Data

US 2024/0127876 A1   Apr. 18, 2024

Related U.S. Application Data

(63) Continuation of application No. 17/743,881, filed on May 13, 2022, now Pat. No. 11,887,644, which is a
(Continued)

(51) Int. Cl.
*G11C 11/22* (2006.01)
*H10B 53/30* (2023.01)

(52) U.S. Cl.
CPC ........ *G11C 11/221* (2013.01); *G11C 11/2273* (2013.01); *G11C 11/2275* (2013.01); *H10B 53/30* (2023.02)

(58) Field of Classification Search
CPC ....... G11C 11/418; G11C 11/412; G11C 8/12; G11C 5/025; G11C 7/1087; G11C 7/1093;
(Continued)

(56) References Cited

U.S. PATENT DOCUMENTS 5,559,733 A    9/1996   McMillan et al.
5,598,366 A *  1/1997   Kraus .................. G11C 11/22
                                                  365/189.11
(Continued)

FOREIGN PATENT DOCUMENTS

CN    1246709 A      3/2000
JP    2005259224 A   9/2005

OTHER PUBLICATIONS

Ocker, U.S. Appl. No. 17/743,881, filed May 13, 2022, Notice of Allowance and Fees Due, Sep. 6, 2023.
(Continued)

*Primary Examiner* — Khamdan N. Alrobaie
(74) *Attorney, Agent, or Firm* — Synergy IP Group AG; Natalie Albrecht

(57) ABSTRACT

A memory cell arrangement is provided that may include: one or more memory cells, each memory cell of the one or more memory cells including: a field-effect transistor structure; a plurality of first control nodes; a plurality of first capacitor structures, a second control node; and a second capacitor structure including a first electrode connected to the second control node and a second electrode connected to a gate region of the field-effect transistor. Each of the plurality of first capacitor structures includes a first electrode connected to a corresponding first control node of the plurality of first control nodes, a second electrode connected to the gate region of the field-effect transistor structure, and a spontaneous-polarizable region disposed between the first electrode and the second electrode of the first capacitor structure.

20 Claims, 39 Drawing Sheets

Related U.S. Application Data continuation of application No. 17/085,084, filed on Oct. 30, 2020, now Pat. No. 11,335,391.

(58) Field of Classification Search
CPC .... G11C 7/18; G11C 8/06; G11C 8/10; G11C 8/18; G11C 11/41; G11C 11/413; G11C 11/416; G11C 7/065

See application file for complete search history.

(56) References Cited

U.S. PATENT DOCUMENTS

| | | | |
|---|---|---|---|
| 6,058,049 A * | 5/2000 | Kye | G11C 5/147 365/189.09 |
| 6,251,720 B1 | 6/2001 | Thakur et al. | |
| 6,510,073 B1 | 1/2003 | Lee et al. | |
| 6,898,105 B2 | 5/2005 | Sakai et al. | |
| 7,656,693 B2 | 2/2010 | Nakamura et al. | |
| 8,605,477 B2 | 12/2013 | Takemura | |
| 10,978,129 B1 | 4/2021 | Müller | |
| 11,049,541 B2 | 6/2021 | Müller | |
| 11,081,159 B1 | 8/2021 | Jähne et al. | |
| 11,101,291 B2 | 8/2021 | Mennenga et al. | |
| 11,158,361 B2 | 10/2021 | Müller | |
| 11,189,331 B1 | 11/2021 | Benoist et al. | |
| 11,195,589 B1 | 12/2021 | Ocker et al. | |
| 11,289,145 B2 | 3/2022 | Ocker | |
| 11,309,034 B2 | 4/2022 | Mennenga et al. | |
| 11,309,792 B2 | 4/2022 | Iqbal et al. | |
| 11,309,793 B2 | 4/2022 | Iqbal | |
| 11,335,391 B1 | 5/2022 | Ocker | |
| 11,380,400 B2 | 7/2022 | Noack | |
| 11,380,695 B2 | 7/2022 | Ocker | |
| 11,387,254 B2 | 7/2022 | Noack | |
| 11,393,518 B1 | 7/2022 | Ocker | |
| 11,437,402 B2 | 9/2022 | Noack | |
| 11,443,792 B1 | 9/2022 | Iqbal et al. | |
| 11,475,935 B1 | 10/2022 | Ocker | |
| 11,508,426 B1 | 11/2022 | Ocker | |
| 11,508,428 B2 | 11/2022 | Noack et al. | |
| 11,508,756 B2 | 11/2022 | Mennenga et al. | |
| 11,527,551 B2 | 12/2022 | Ocker | |
| 11,594,271 B2 | 2/2023 | Noack et al. | |
| 11,594,542 B2 | 2/2023 | Polakowski | |
| 11,605,435 B2 | 3/2023 | Schenk | |
| 11,610,903 B2 | 3/2023 | Schenk | |
| 11,626,164 B2 | 4/2023 | Noack | |
| 11,682,461 B2 | 6/2023 | Mennenga et al. | |
| 11,688,447 B2 | 6/2023 | Ocker | |
| 2001/0043484 A1 | 11/2001 | Fujimori | |
| 2002/0012264 A1 | 1/2002 | Ishiwara | |
| 2002/0089870 A1 | 7/2002 | Honda | |
| 2002/0089877 A1 | 7/2002 | Yi et al. | |
| 2003/0141528 A1 * | 7/2003 | Ito | H10B 53/00 257/295 |
| 2004/0090816 A1 | 5/2004 | Forbes | |
| 2009/0207649 A1 | 8/2009 | Tang et al. | |
| 2011/0249500 A1 | 10/2011 | Cha | |
| 2012/0182789 A1 | 7/2012 | Saito | |
| 2014/0016399 A1 | 1/2014 | Lu et al. | |
| 2015/0016180 A1 | 1/2015 | Lu et al. | |
| 2015/0098266 A1 | 4/2015 | Chen et al. | |
| 2016/0293640 A1 | 10/2016 | Yamazaki | |
| 2018/0033486 A1 | 2/2018 | Chen | |
| 2019/0130956 A1 | 5/2019 | Muller et al. | |
| 2020/0357880 A1 | 11/2020 | Xu et al. | |
| 2021/0082801 A1 | 3/2021 | Ho et al. | |
| 2021/0217454 A1 | 7/2021 | Ocker | |
| 2021/0375867 A1 | 12/2021 | Chiang et al. | |
| 2022/0122995 A1 | 4/2022 | Ocker et al. | |
| 2022/0122996 A1 | 4/2022 | Ocker et al. | |
| 2022/0139437 A1 | 5/2022 | Ocker | |
| 2022/0139931 A1 | 5/2022 | Ocker | |
| 2022/0139932 A1 | 5/2022 | Polakowski | |
| 2022/0139934 A1 | 5/2022 | Müller | |
| 2022/0139936 A1 | 5/2022 | Ocker | |
| 2022/0139937 A1 | 5/2022 | Müller et al. | |
| 2022/0270659 A1 | 8/2022 | Ocker | |
| 2022/0374202 A1 | 11/2022 | Villa et al. | |
| 2022/0376114 A1 | 11/2022 | Müller | |
| 2023/0041759 A1 | 2/2023 | Noack et al. | |
| 2023/0046259 A1 | 2/2023 | Iqbal | |
| 2023/0135718 A1 | 5/2023 | Minh et al. | |
| 2023/0170029 A1 | 6/2023 | Sivero | |
| 2023/0189531 A1 | 6/2023 | Müller | |
| 2023/0189532 A1 | 6/2023 | Müller | |
| 2023/0223066 A1 | 7/2023 | Müller | |
| 2023/0247842 A1 | 8/2023 | Müller | |
| 2023/0284454 A1 | 9/2023 | Ocker et al. | |
| 2023/0335174 A1 | 10/2023 | Kuzmanov | |
| 2023/0360684 A1 | 11/2023 | Sivero | |
| 2023/0371268 A1 | 11/2023 | Müller | |
| 2023/0402083 A1 | 12/2023 | Schenk | |
| 2024/0032305 A1 | 1/2024 | Kashir et al. | |
| 2024/0032306 A1 | 1/2024 | Ocker | |
| 2024/0032307 A1 | 1/2024 | Müller et al. | |
| 2024/0172451 A1 | 5/2024 | Schenk | |

OTHER PUBLICATIONS

Ocker, U.S. Appl. No. 17/743,881, filed May 13, 2022, Non-Final Rejection, Mar. 30, 2023.
Ocker, U.S. Appl. No. 17/743,881, filed May 13, 2022, Final Rejection, Jul. 27, 2023.
Ocker, U.S. Appl. No. 17/085,111, filed Oct. 30, 2020, Notice of Allowance and Fees Due, Jun. 2, 2022.
Ocker, U.S. Appl. No. 17/085,111, filed Oct. 30, 2020, Notice of Allowance and Fees Due, Apr. 28, 2022.
Ocker, U.S. Appl. No. 17/085,100, filed Oct. 30, 2020, Notice of Allowance and Fees Due, Oct. 13, 2022.
Ocker, U.S. Appl. No. 17/085,100, filed Oct. 30, 2020, Notice of Allowance and Fees Due, Oct. 3, 2022.
Ocker, U.S. Appl. No. 17/085,100, filed Oct. 30, 2020, Non-Final Rejection, Jun. 2, 2022.
Ocker, U.S. Appl. No. 17/085,084, filed Oct. 30, 2020, Notice of Allowance and Fees Due, Feb. 9, 2022.
Ocker, U.S. Appl. No. 17/085,084, filed Oct. 30, 2020, Non-Final Rejection, Nov. 24, 2021.
First Office Action, CN Application No. 202111230166.9, dated Dec. 7, 2023, 5 pages.
First Office Action Search Report, CN Application No. 202111230166.9, dated Dec. 7, 2023, 3 pages.
English translation for First Office Action, CN Application No. 202111230166.9, dated Dec. 7, 2023, 5 pages.

* cited by examiner

1102 Forming one or more field-effect transistor structures

1104 Forming an electrode layer stack above the one or more field-effect transistor structures, wherein the electrode layer stack includes at least a first electrode layer, a second electrode layer, and an electrically isolating interlayer disposed between the first electrode layer and the second electrode layer

1106 Forming one or more recesses into the electrode layer stack, each of the one or more recesses corresponding to one of the one or more field-effect transistor structures, wherein the one or more recesses extend at least through the first electrode layer, the electrically isolating interlayer, and the second electrode layer

1108 Partially filling the one or more recesses with a memory material, the memory material at least covering a sidewall of each of the one or more recesses

1110 At least partially filling a remaining space in each of the one or more recesses with an electrode material, wherein, in each of the one or more recesses, a portion of the memory material is disposed between a portion of the electrode material and at least one of the first electrode layer and/or the second electrode layer, wherein the electrode material in each of the one or more recesses is electrically conductively connected to a gate of a field-effect transistor structure of the one or more field-effect transistor structures corresponding to the recess

1202
Applying a control voltage to a first control node selected from a plurality of first control nodes of a memory cell, each of the plurality of first control nodes being connected to a corresponding first capacitor structure of a plurality of first capacitor structures of the memory cell 1204
Applying a lever voltage to a second control node of the memory cell, the second control node being connected to a second capacitor of the memory cell 1206
Applying a bit-line voltage to a third control node of the memory cell, the third control node being connected to at least one source/drain region of a transistor of the memory cell

MEMORY CELL WITH ACCESS DEVICE AND MEMORY CAPACITOR STRUCTURES

BENEFIT CLAIM

This application claims the benefit under 35 U.S.C. § 120 as a Continuation of application Ser. No. 17/743,881, filed May 13, 2022, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

TECHNICAL FIELD

Various aspects relate to a memory cell arrangement and a method thereof, e.g., a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 8 shows a schematic flow diagram of a method for manufacturing a memory cell arrangement, according to various aspects;

FIG. 9 shows a schematic flow diagram of a method for operating a memory cell arrangement, according to various aspects.

DESCRIPTION

Figure 1A:
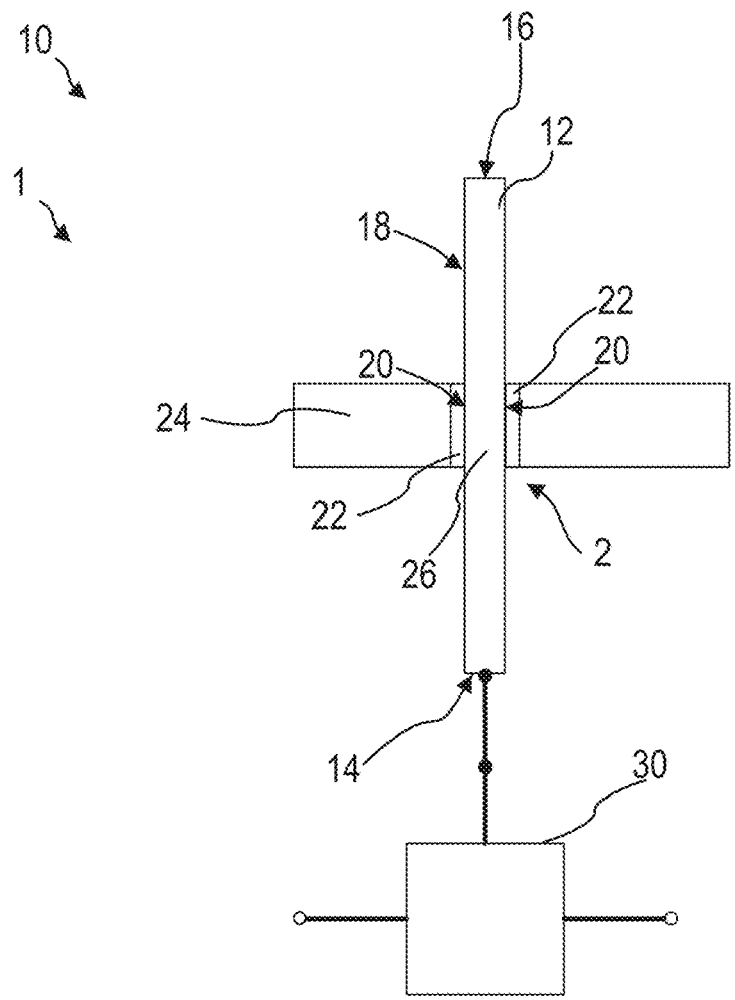
FIGS. 1A, 1B, 2A, 3A, 3C, and 3D each schematically show a memory cell arrangement, according to various aspects.
Figure 1A:
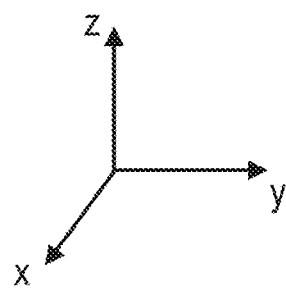

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that corresponding element of the second group of elements is unambiguously assigned to the element of the first group of elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more bitline voltages", "one or more wordline voltages", "one or more leverline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "leverline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or VBL) may be varied depending on the intended operation of the memory cell arrangement. Analogously, a wordline voltage (referred to as $V_{WL}$ or VWL), a plateline voltage (referred to as $V_{PL}$ or VPL), and/or sourceline voltage (referred to as $V_{SL}$ or VSL) may be varied depending on the intended operation of a memory cell arrangement. A voltage provided to a node or terminal may be defined by the respective potential applied to that node or terminal relative to the base voltage (referred to as $V_B$) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell). As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 µA. In some aspects, the constant-current threshold voltage, $V_{th(ci)}$, may be determined based on the following equation:

$$V_{th(ci)} = V_{GS} \text{ (at } I_D = I_{D0} \cdot W/L\text{).}$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g., intrinsic) property of the field-effect transistor or of the field-effect transistor based memory cell.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

According to various aspects, a memory cell may be addressed via a corresponding access device. An access device may include or may be, for example, a field effect transistor (FET), such as an n-type or p-type field-effect transistor, a transmission gate, such as an n-type-based or p-type-based transmission gate, or the like. An access device may have a threshold voltage associated therewith. A threshold voltage of an access device (e.g., a field-effect transistor) may be defined by the properties of the access device (e.g., the field-effect transistor), such as the material(s), the doping(s), etc., and it may thus be a (e.g., intrinsic) property of the access device.

According to various aspects, a memory cell may have at least two distinct states associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, an anti-ferroelectric or antiferroelectric-based memory cell, a remanent-polarizable memory cell, a spontaneous-polarizable memory cell, a capacitor or capacitor-based memory cell, and/or a ferroelectric-capacitor or ferroelectric-capacitor-based memory cell ("FeCAP"). A memory cell may include at least a first memory state and a second memory state. In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g., associated with a logic "1") and the high threshold voltage state may be an electrically non-conducting state or at least less conducting than the low threshold voltage state (e.g., associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

For example, a phase-change memory cell may include a phase change portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a spontaneously-polarizable memory cell (e.g., a remanent-polarizable memory cell) may include a spontaneously-polarizable portion (also referred to as spontaneous-polarizable portion, e.g., a remanent-polarizable portion). The spontaneous-polarizable portion may be used to implement memory functions, e.g., in a memory cell. Therefore, according to various aspects, a memory cell may be implemented as a capacitor structure, e.g., as a spontaneous-polarizable capacitor (e.g., a remanent-polarizable capacitor). In general, a spontaneous polarization may be present in a material portion (e.g., a material layer) in the case that the material may have a non-zero electrical polarization, P, upon applying an electric field, E; therefore, a certain value for the material portion may be detected. For example, a spontaneous polarization may be a ferroelectric polarization or an antiferroelectric polarization. In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity may be a concept to describe a remanent polarization of a material similar to the concept of ferromagnetism that is used to describe remanent magnetization in magnetic materials. In general, anti-ferroelectricity may be a concept to describe a non-remanent but spontaneous polarization of a material similar to anti-ferromagnetism used to describe a non-remanent but spontaneous magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure.

In a usual capacitor structure, the amount of charge stored therein may be used to define a memory state (e.g., first amount of charge stored in the capacitor structure may define a first memory state and a second amount of charge stored in the capacitor structure may define a second memory state.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state". For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily. For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g., associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell (also referred to as ferroelectric capacitor—"FeCAP") may include a capacitor structure including a ferroelectric material as a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$ and/or ferroelectric $ZrO_2$. Ferroelectric $HfO_2$ may include any form of hafnium oxide that may exhibit ferroelectric properties. The ferroelectric material may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In some aspects, a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, platelines, and/or source-lines. All memory cells that are not intended to be written may see a voltage that is at least less than the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "NOR" or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include one or more memory cells, each of the one or more memory cells including: an electrode pillar having a bottom surface and a top surface; a memory material portion surrounding a lateral surface portion of the electrode pillar; an electrode layer surrounding the memory material portion and the lateral surface portion of the electrode pillar, wherein the electrode pillar, the memory material portion, and the electrode layer form a capacitive memory structure; and a field-effect transistor structure including a gate structure, wherein the bottom surface of the electrode pillar faces the gate structure and is electrically conductively connected to the gate structure, and wherein the top surface of the electrode pillar faces away from the gate structure.

According to various aspects, a memory cell arrangement may include one or more memory cells, each of the one or more memory cells including: an electrode pillar extending from a bottom surface of the electrode pillar to a top surface of the electrode pillar; one or more memory material portions, each of the one or more memory material portions surrounding a respective first lateral surface portion of the electrode pillar; one or more first electrode layers, each of the one or more first electrode layers surrounding a corresponding memory material portion of the one or more memory material portions and the first lateral surface portion of the electrode pillar associated with the corresponding memory material portion; wherein each of the first electrode layers, the corresponding memory material portion, and the electrode pillar form a respective capacitive memory structure; a dielectric material portion surrounding a second lateral surface portion of the electrode pillar different from each of the first lateral surface portions; a second electrode layer surrounding the dielectric material portion and the second lateral surface portion of the electrode pillar, wherein the electrode pillar, the dielectric material portion, and the second electrode layer form a capacitive lever structure; and a field-effect transistor structure including a gate structure, wherein the gate structure faces the bottom surface of the electrode pillar and is electrically conductively connected to the electrode pillar.

According to various aspects, a memory cell arrangement may include one or more memory cells, each of the one or more memory cells including: a field-effect transistor structure; a plurality of control nodes; a plurality of capacitor structures, each of the plurality of capacitor structures including a first electrode connected to a corresponding control node of the plurality of control nodes, a second electrode connected to a gate region of the field-effect transistor structure, and a spontaneous-polarizable region disposed between the first electrode and the second electrode of the capacitor structure.

According to various aspects, a memory cell arrangement may include one or more memory cells, each of the one or more memory cells including: a field-effect transistor structure; a plurality of first control nodes; a plurality of first capacitor structures, each of the plurality of first capacitor structures including a first electrode connected to a corresponding first control node of the plurality of first control nodes, a second electrode connected to a gate region of the field-effect transistor structure, and a spontaneous-polarizable region disposed between the first electrode and the second electrode of the first capacitor structure; a second control node; and a second capacitor structure including a first electrode connected to the second control node and a second electrode connected to the gate region of the field-effect transistor.

FIG. 1A illustrates schematically a cross-section of an exemplary memory cell 1 according to various aspects. A memory cell arrangement 10 may include one or more memory cells, such as the memory cell 1. The memory cell 1 may include an electrode pillar 12. The electrode pillar 12 may have a bottom surface 14 and a top surface 16. The bottom surface 14 may be substantially parallel to an x-y-plane. The top surface 16 may be substantially parallel to the x-y-plane. The x-y-plane may be defined by a lateral plane (in some aspects referred to lateral dimension) of a substrate the memory cell arrangement 10 may be disposed on, above, and/or in. The x-y-plane may be defined by a lateral plane of a chip the memory cell arrangement 10 may be disposed on, above, and/or in. For example, the x-y-plane may be defined by an in-plane direction of the substrate and/or the chip. The electrode pillar 12 may extend substantially perpendicular to the x-y-plane, e.g., in z-direction. The z-direction may correspond to an out-of-plane direction (in some aspects referred to as vertical dimension) of the substrate and/or chip. For example, a height of the substrate and/or chip may be given by a z-coordinate. The bottom surface 14 may have a base geometry of one of the following: a circle, a square, a triangle, a parallelogram, a trapezoid, an ellipse, a polygon, an n-gon, etc. The top surface 16 may have a base geometry of one of the following: a circle, a square, a triangle, a parallelogram, a trapezoid, an ellipse, a polygon, an n-gon, etc. The bottom surface 14 and the top surface 16 may define any geometric body or frustum of a geometric body having a bottom surface and a top surface as an electrode pillar. For example, the bottom surface 14 and the top surface 16 each may be of a circle shape and the electrode pillar 12 may be a cylinder or a frustum of a cone (in some aspects referred to circle frustum). For example, the bottom surface 14 and the top surface 16 each may be of a square shape and the electrode pillar 12 may be a cube, a cuboid, a rectangular prism, a frustum of a pyramid (in some aspects referred to square frustum), etc. According to various aspects, the electrode pillar 12 may have a cylindrical shape, such as a circular cylindrical shape or a prismatic shape. A cylinder in general may have a bottom surface and top surface with the same shape and size. The shape and size is not limited. A cylinder with a circular shaped bottom and top surface may be referred to as circular cylinder, sometimes commonly named as cylinder. A cylinder with an n-gonal (e.g., polygonal, e.g., n greater than 2) shaped bottom and top surface may be referred to as prism. A cylinder may include a truncated cylinder. According to various aspects, the electrode pillar 12 may have a frustum shape. A frustum may be a frustum of a pyramid or a cone. A frustum may include a truncated frustum.

According to various aspects, the bottom surface 14 and the top surface 16 may be substantially parallel to each other. The electrode pillar 12 may have a height defined by a distance between the bottom surface 14 and the top surface 16. For example, the height of the electrode pillar 12 may be a distance in z-direction. The electrode pillar 12 may have a lateral surface 18. The lateral surface 18 may be defined by the geometry of the electrode pillar 12. The lateral surface may include all sides (e.g., side surfaces) of the electrode pillar, excluding the bottom surface 14 and the top surface 16. For example, in the case the electrode pillar 12 is a body of rotation, such as a cylinder, the lateral surface 18 may include one side surface. For example, in the case the bottom surface 14 and the top surface 16 are shaped as an n-gon, the lateral surface 18 may include "n" side surfaces. Illustratively, the body defined by the bottom surface 14, the top surface 16, and the lateral surface 18 may have a short side defined by the bottom surface and/or top surface and a long side defined by the lateral surface (e.g., a height of the lateral surface). The width of the electrode pillar 12 may be defined by the shape of the bottom surface 14 and/or the top surface 16. For example, in the case of a circular shape, the width of the electrode pillar 12 may be defined by the diameter of the circle. For example, in the case of an n-gon, the width of the electrode pillar 12 may be defined by the distance between two opposite sides or two substantially opposite sides of the n-gon. The width of the electrode pillar 12 may be a maximum extend of the electrode pillar 12 in the x-direction and/or y-direction. The width of the electrode pillar 12 may be a maximum extend of the electrode pillar 12 perpendicular to the height direction (e.g., the z-direction). The electrode pillar 12 may include or may consist of Cu, Au, Ag, W, Al, Ru, Ti, TiN, Ta, TaN, Co, CoN, Nb, NbN, Pd, Pt, Ir, IrO$_2$, RuO$_2$, Poly-Si etc.

The memory cell 1 may include a memory material portion 22 (e.g., a spontaneous-polarizable portion, e.g., a remanent-polarizable portion). A memory material may include a phase-change material, a spontaneous-polarizable material, a remanent-polarizable material, or the like. In the following, in various aspects the memory material is described exemplarily as being a remanent-polarizable material. However, it is noted that this serves as an example and that any other material that has at least two distinct states associated therewith may be used as a memory material, such as any kind of spontaneous-polarizable material (e.g., a ferroelectric memory material, e.g., an antiferroelectric material, etc.). The memory material portion 22 may surround a portion 20 of the lateral surface 18 (in some aspects referred to as lateral surface portion 20). The lateral surface portion 20 may include respective portions of one or more sides of the electrode pillar 12. According to various aspects, the memory material portion 22 may perimeterally surround (e.g., completely perimeterally surround) the lateral surface portion 20 of the electrode pillar 12. For example, the electrode pillar 12 may have a cylindrical shape and the lateral surface portion 20 may be defined by an arc of the circle (e.g., the complete perimeter of the circle), given by the cylindrical shape, within the x-y-plane, and a height of the lateral surface portion 20 may be defined by z-coordinates. In this case, the lateral surface portion 20 may be a curved surface. For example, the bottom surface 14 and/or the top surface 16 of the electrode pillar 12 may have an n-gon shape and the lateral surface portion 20 may be defined by one or more sides of the electrode pillar 12 (e.g., all sides in case the lateral surface portion 20 completely perimeterally surrounds the electrode pillar 12) within the x-y-plane, and a height of the lateral surface portion 20 may be defined by a z-coordinate (e.g., in z-direction). According to various aspects, a surface of the memory material portion 22 may face the lateral surface portion 20. The surface of the memory material portion 22 facing the lateral surface portion 20 may be substantially parallel to the lateral surface portion 20. The surface of the memory material portion 22 facing the lateral surface portion 20 may be substantially coaxial to the lateral surface portion 20. For example, in the case the electrode pillar 12 has a cylindrical shape, the surface of the memory material portion 22 facing the lateral surface portion 20 may be shaped as an arc of a circle, and the arc of the circle may be substantially coaxial to the arc of the circle defined by the lateral surface portion 20. For example, in the case the electrode pillar 12 has a polygonal shape, the surface of the memory material portion 22 facing the lateral surface portion 20 may include one or more surface portions and each surface portion may be substantially coaxial to one of the sides of the polygon-shaped lateral surface portion 20. According to various aspects, the memory material portion 22 may directly contact the electrode pillar 12. For example, a surface of the memory material portion 22 may directly contact the lateral surface portion 20 of the electrode pillar 12.

The memory cell 1 may include an electrode layer 24. The electrode layer 24 may surround the memory material portion 22. The electrode layer 24 may surround the lateral surface portion 20. For example, the electrode layer 24 may perimeterally surround (e.g., completely perimeterally surround) the memory material portion 22. According to various aspects, a surface of the electrode layer 24 may face the lateral surface portion 20. The surface of the electrode layer 24 facing the lateral surface portion 20 may be substantially parallel to the lateral surface portion 20. The surface of the electrode layer 24 facing the lateral surface portion 20 may be substantially coaxial to the lateral surface portion 20. For example, in the case the electrode pillar 12 has a cylindrical shape, the surface of the m electrode layer 24 facing the lateral surface portion 20 may be shaped as an arc of a circle, and the arc of the circle may be substantially coaxial to the arc of the circle defined by the lateral surface portion 20. For example, in the case the electrode pillar 12 has a polygonal shape, the surface of the electrode layer 24 facing the lateral surface portion 20 may include one or more surface portions and each surface portion may be substantially coaxial to one of the sides of the polygon-shaped lateral surface portion 20. The memory material portion 22 may be disposed between the surface of the electrode layer facing the lateral surface portion 20 and the lateral surface portion 20. According to various aspects, the electrode layer 24 may directly contact the memory material portion 22. For example, a surface of the electrode layer 24 may directly contact the memory material portion 22. The electrode layer 24 may have a width defined in x-direction and/or y-direction greater than a height defined in z-direction. The electrode layer 24 may have a planar shape. The electrode layer 24 may be disposed in an angle to the electrode pillar 12. The angle between the electrode layer 24 and the electrode pillar 12 may be between about 45° to about 90°. The electrode layer 24 may be disposed in an angle with respect to the z-direction. Illustratively, the electrode pillar 12 may extend in or along a first direction (e.g., z-direction) and the electrode layer 24 may extend along a second direction (e.g., x-direction and/or y-direction) different from the first direction. According to various aspects, the electrode layer 24 may be perpendicular to the x-y-plane. For example, the electrode layer 24 may be parallel to the lateral direction (e.g., in-plane direction) of the substrate and/or chip. For example, the electrode layer 24 may extend in the lateral direction of the substrate. According to various aspects, the memory cell arrangement 10 may include one or more metallization layers disposed on or above the substrate. The electrode layer 24 may be substantially parallel to the one or more metallization layers.

Illustratively, the electrode layer 24 may include a hole (e.g., a recess). The hole may extend from a first surface of the electrode layer 24 to a second surface of the electrode layer 24 opposite the first surface of the electrode layer 24. The electrode pillar 12 may be disposed within the hole of the electrode layer 24. The memory material portion 22 may be disposed at least within the hole of the electrode layer 24 in a gap between the electrode layer 24 and the lateral surface portion 20. It is noted that the term "a hole in a layer" may be understood in such a way that the hole is defined by the particular (e.g., patterned) structure of the layer and that the hole may or may not be filled with one or more materials. In several aspects, a hole may be provided in an electrode layer, wherein the hole is filled at least partially with a material that is different from the material of the electrode layer. The one or more material portions filling the hole may be part of a memory cell and may form, in conjunction with the electrode layer, a capacitive structure (e.g., a capacitive memory structure).

According to various aspects, the electrode pillar 12, the memory material portion 20, and the electrode layer 24 may form a capacitive memory structure 2 (in some aspects also referred to as memory capacitor or memory capacitor structure). The capacitive memory structure 2 may be configured having at least a first memory state and a second memory state (e.g., an LVT-state and a HVT-state) as described herein (e.g., to store a bit).

The memory cell 1 may include a transistor structure, e.g., a field-effect transistor structure 30. The field-effect transistor structure 30 may be a metal-oxide-semiconductor (MOS) field-effect transistor structure (e.g., referred to as MOS-FET). However, any other suitable transistor structure may be used in the same way or on a similar way. The field-effect transistor structure 30 may include a gate structure. The bottom surface 14 of the electrode pillar 12 may face the gate structure. The electrode pillar 12 (e.g., the bottom surface 14 of the electrode pillar 12) may be electrically conductively connected to the gate structure. The top surface 16 of the electrode pillar 12 may face away from the gate structure. A distance between the bottom surface 14 of the electrode pillar 12 and the gate structure may be smaller than a distance between the top surface 16 of the electrode pillar 12 and the gate structure. Illustratively, the bottom surface 14 may be closer to the gate structure than the top surface 16. A vertical distance between the electrode layer 24 and the gate structure may be substantially uniform. The vertical distance may be a distance perpendicular to the bottom surface 14 and/or the top surface 16. The electrode layer 24 may include or may consist of Cu, Au, Ag, W, Al, Ru, Ti, TiN, Ta, TaN, Co, CoN, Nb, NbN, Pd, Pt, Ir, IrO$_2$, RuO$_2$, Poly-Si etc.

Figure 1B:
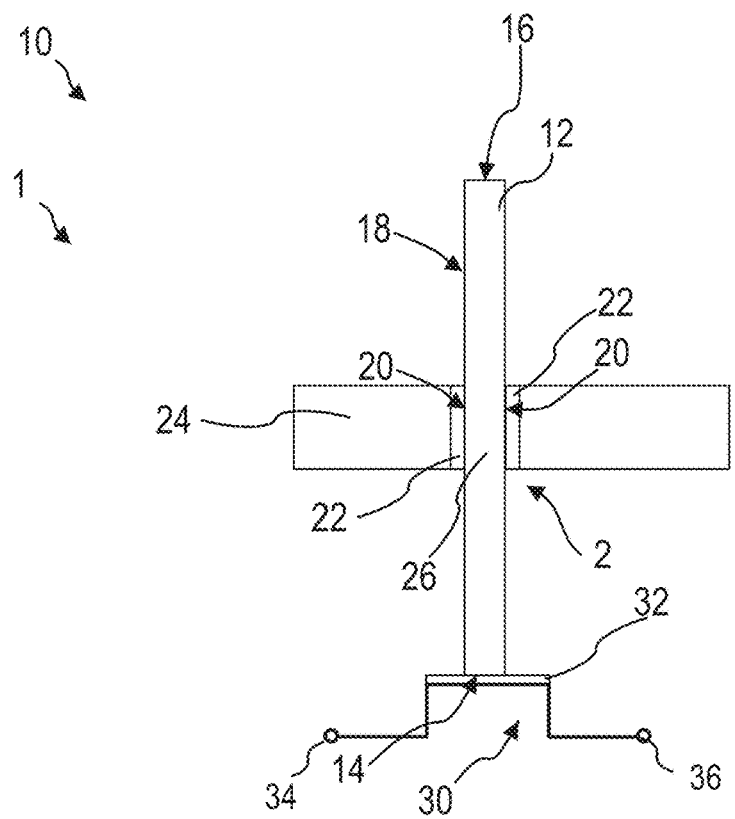
Figure 1B:
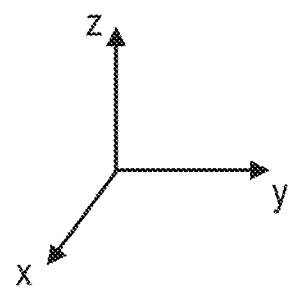

FIG. 1B schematically shows the memory cell arrangement 10 including a field-effect transistor structure 30 having a planar gate structure 32 according to various aspects. According to various aspects, the field-effect transistor structure 30 may include a first terminal 34 (e.g., a source terminal) and a second terminal 36 (e.g., a drain terminal). According to various aspects, the electrode layer 24 may be substantially parallel to the gate structure. For example, the electrode layer 24 may have a first surface and a second surface opposite the first surface and the first surface and/or the second surface may be substantially parallel to the gate structure (e.g., a surface of the gate structure). However, it is noted that the gate structure may have any kind of shape. For example, the field-effect transistor structure 30 may be or may include a Fin-FET structure and the gate structure may be U-shaped or U-like-shaped.

Figure 1C:
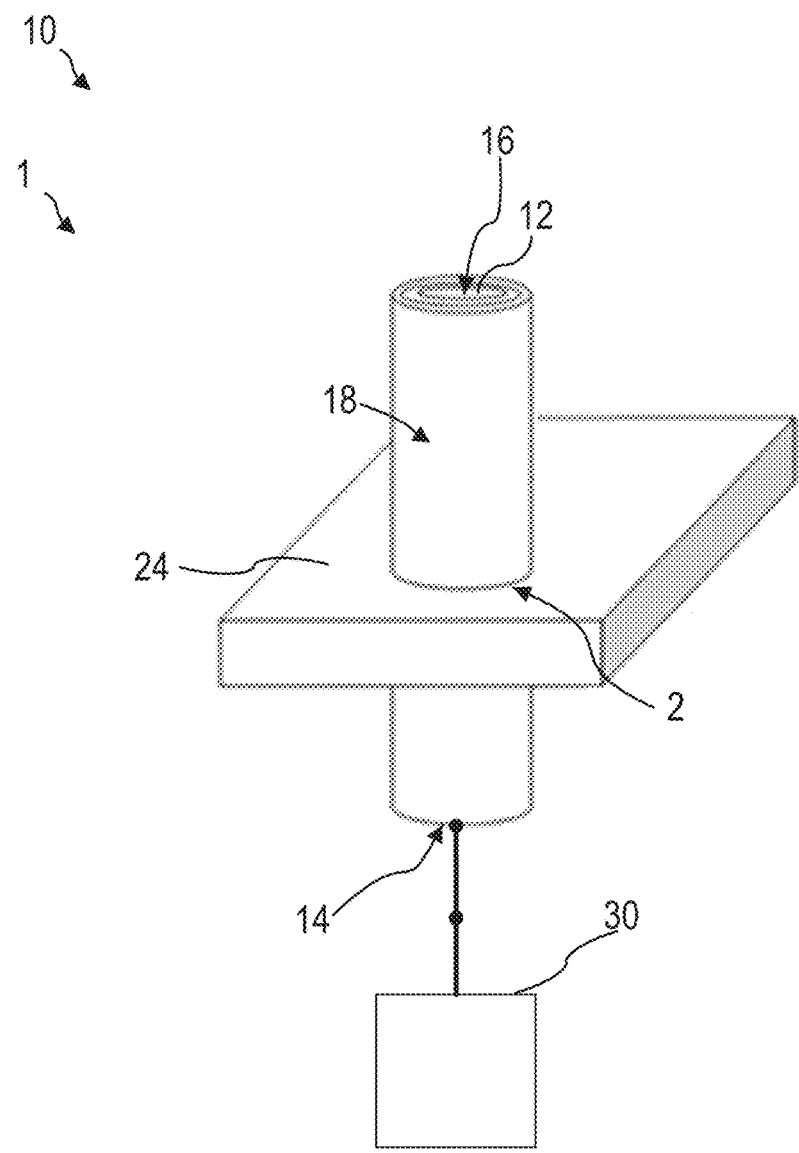
FIGS. 1C, 2B, and 3B each show a perspective view of a memory cell arrangement, according to various aspects.
Figure 1C:
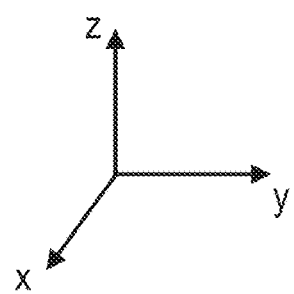

FIG. 1C exemplarily shows a perspective view of the memory cell arrangement 10 according to various aspects. The memory cell arrangement 10 may include the memory cell 1. The bottom surface 14 and the top surface 16 of the electrode pillar 12 each may have a circular shape and the electrode pillar 12 may have a cylindrical shape. The memory material portion 22 may completely perimeterally surround the lateral surface portion 20. In this example, a memory material layer may completely perimeterally surround the lateral surface 18 of the electrode pillar 12. The memory material layer may form the memory material portion 22. The memory material portion 22 may directly contact the electrode pillar 12. The electrode layer 24 may have a planar shape. The electrode layer 24 may completely perimeterally surround the electrode pillar 12 and the memory material portion 22. The electrode layer 24 may directly contact the memory material portion 22.

Figure 2A:
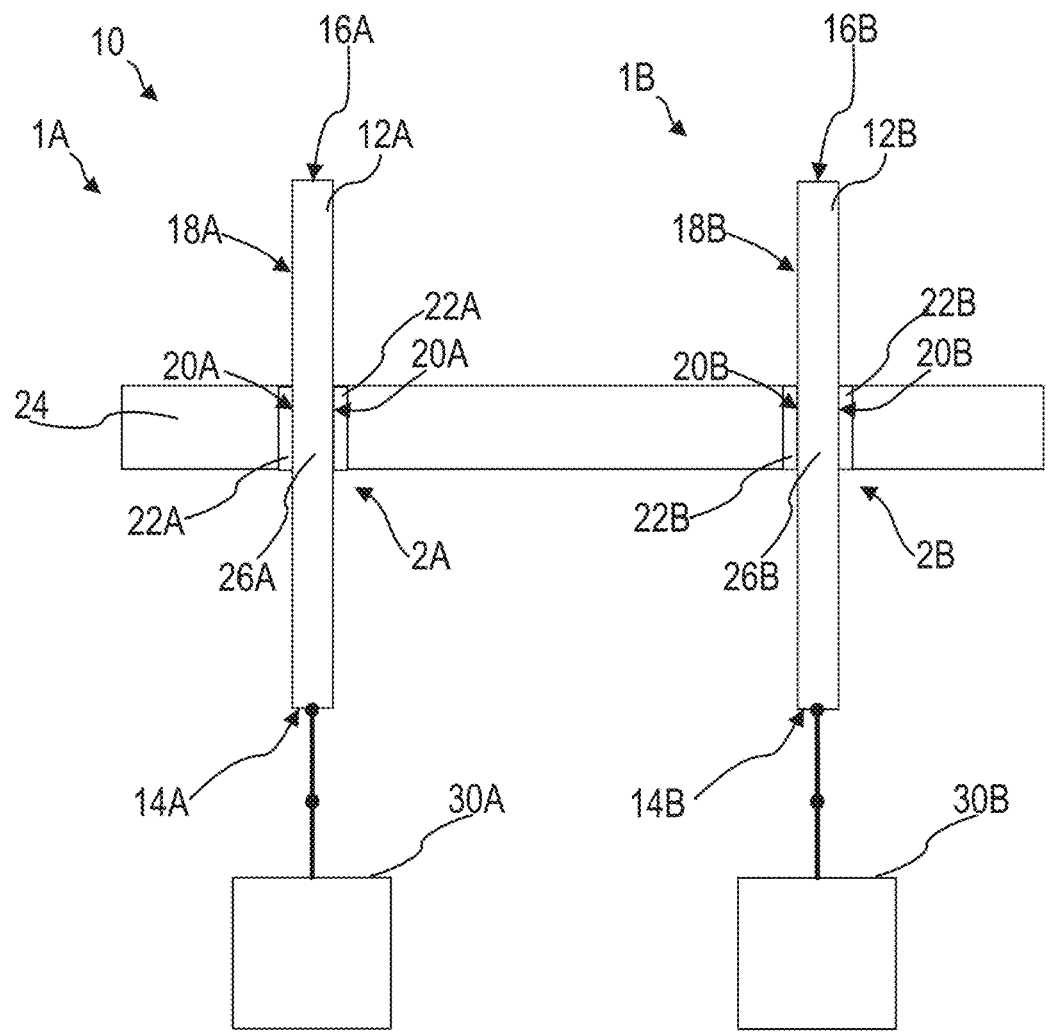
Figure 2A:
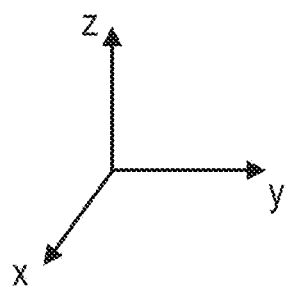
Figure 2B:
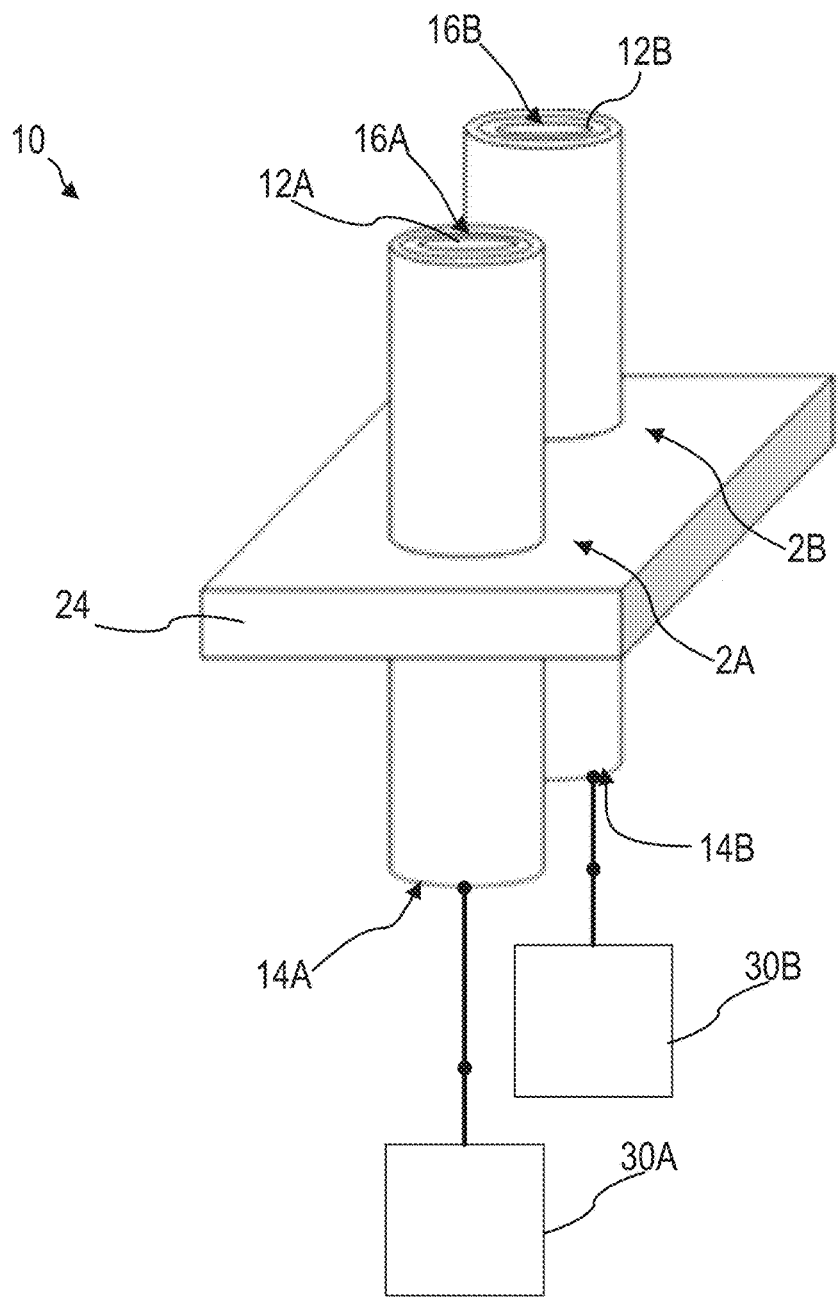
Figure 2B:
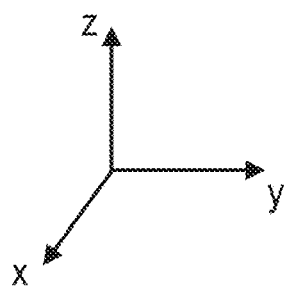

FIG. 2A schematically shows the memory cell arrangement 10 including a first memory cell 1A and a second memory cell 1B, according to various aspects. FIG. 2B exemplarily shows a perspective view of the memory cell arrangement 10 including the first memory cell 1A and the second memory cell 1B, according to various aspects. Each of the first memory cell 1A and the second memory cell 1B may be configured in accordance with the memory cell 1. According to various aspects, the memory cell arrangement 10 may include a common electrode layer 24. The common electrode layer 24 may provide the electrode layer 24 of each of the first memory cell 1A and the second memory cell 1B. According to various aspects, the electrode pillar 12A of the first memory cell 1A and the electrode pillar 12B of the second memory cell 1B may be spaced apart from one another.

Figure 3A:
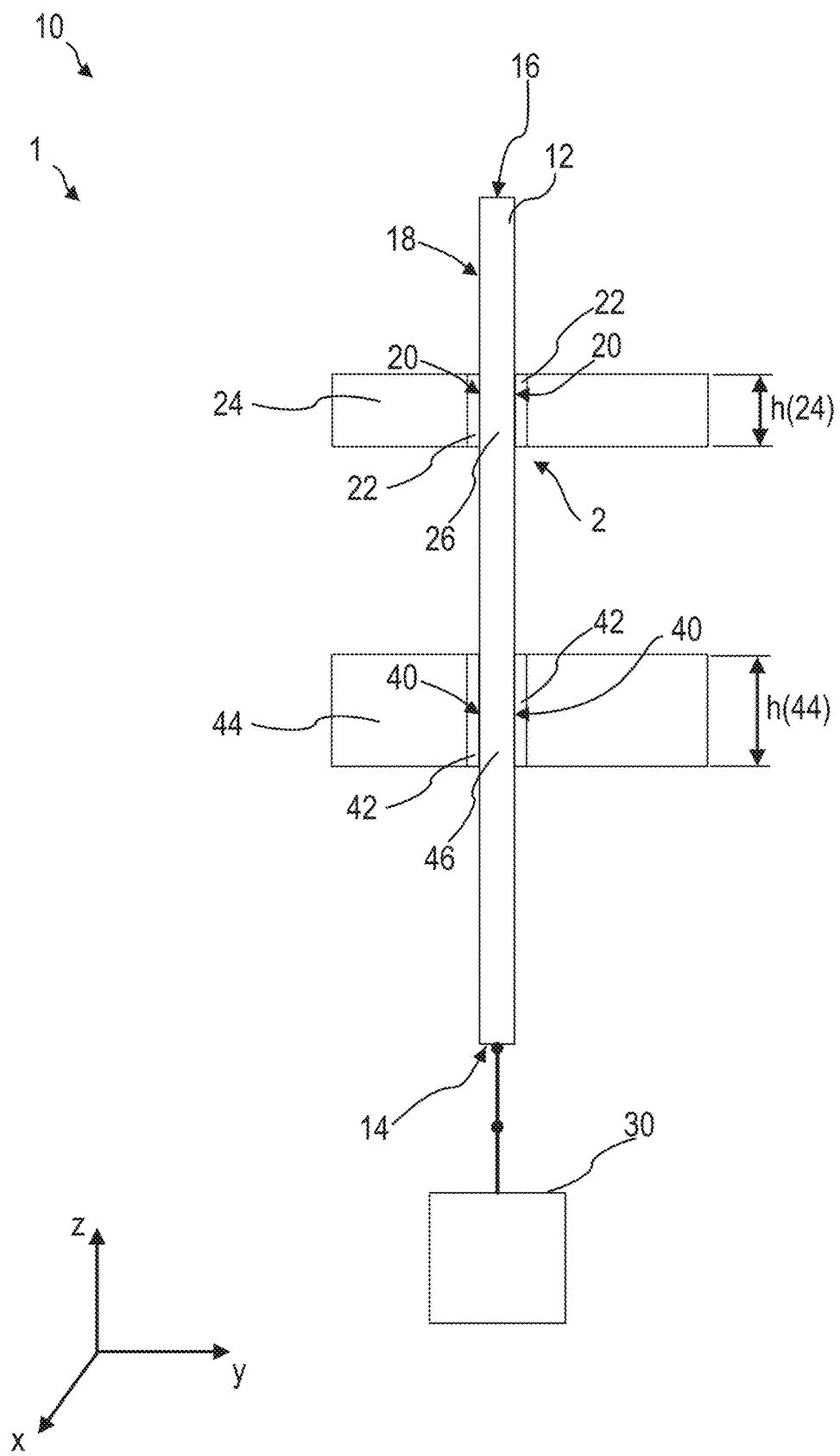
Figure 3B:
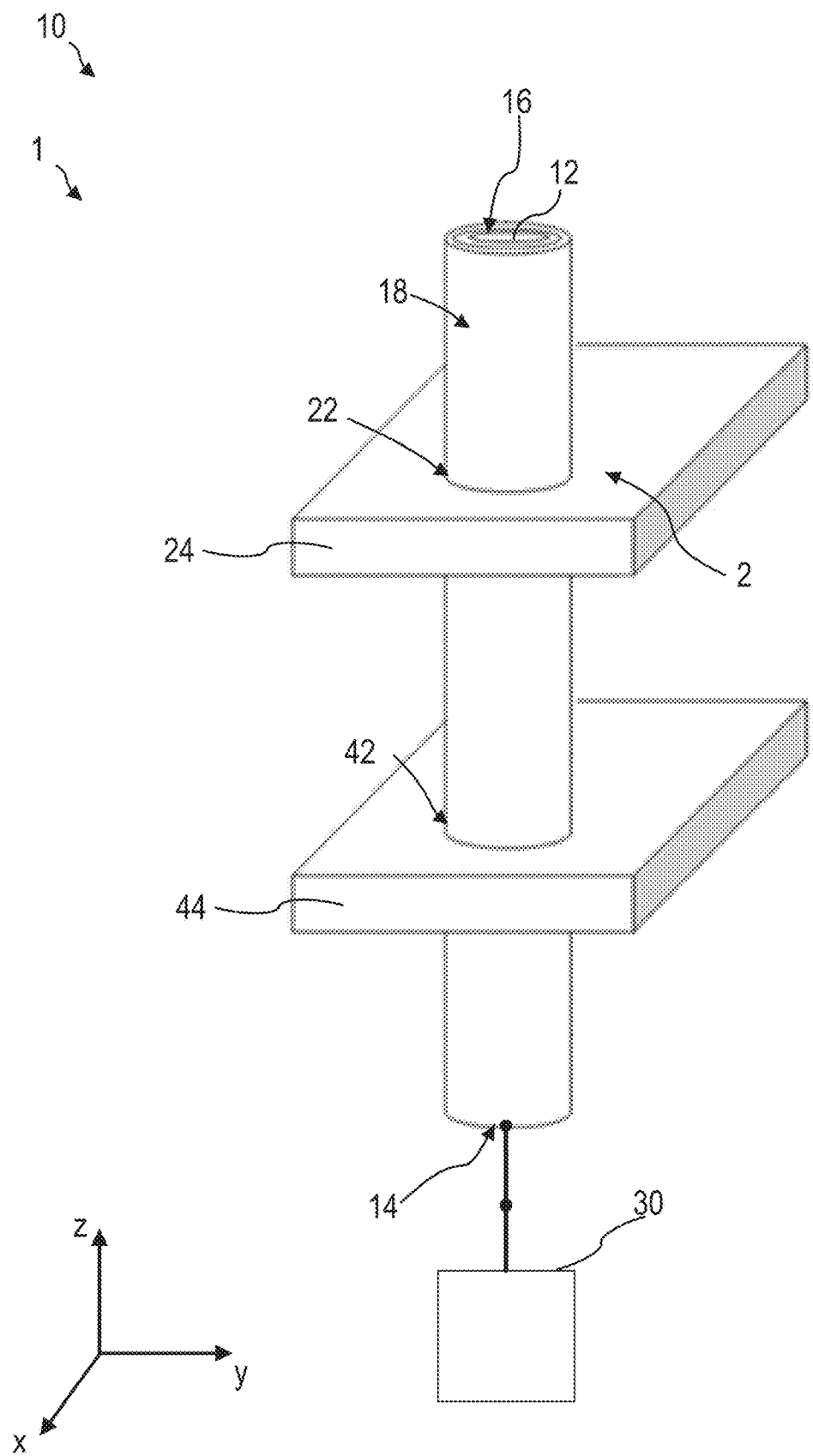

FIG. 3A schematically shows the memory cell arrangement 10 including two electrode layers, according to various aspects. FIG. 3B exemplarily shows a perspective view of the memory cell arrangement 10 including two electrode layers, according to various aspects. The electrode layer 24 may be a first electrode layer 24. The memory cell 1 may further include a second electrode layer 44. The memory cell 1 may include a dielectric material portion 42. The dielectric material portion 42 may surround (e.g., perimeterally surround, e.g., completely perimeterally surround) a second lateral surface portion 40 of the electrode pillar 12. The second lateral surface portion 40 may be different from the lateral surface portion 20 (in the following also referred to as first lateral surface portion 20). The second electrode layer 44 may surround the dielectric material portion 42 and the second lateral surface portion 40 of the electrode pillar 12. According to various aspects, geometrically the dielectric material portion 42 may be configured similar to the memory material portion 22, such as shape, alignment, geometric constraints, etc. According to various aspects, the second electrode layer 44 may be configured similar to the first electrode layer 24 with respect to geometric properties, material properties, etc. According to various aspects, the first electrode layer 24 may extend in a first plane (e.g., parallel to the x-y-plane) along a first direction (e.g., the y-direction) and the second electrode layer 44 may extend in a second plane (e.g., parallel to the x-y-plane, e.g., different from the first plane) along a second direction (e.g., the x-direction) different from the first direction. For example, the first electrode layer 24 and the second electrode layer 44 may extend in an angle with respect to each other of about 45° or more. The first electrode layer 24 and the second electrode layer 44 may be spaced apart from one another. According to various aspects, the memory cell arrangement 10 may include at least one interlayer (e.g., isolating interlayer, e.g., dielectric interlayer) disposed between the first electrode layer 24 and the second electrode layer 44. According to various aspects, a height h(24) of the first electrode layer 24 (e.g., defined in z-direction) may be different from a height h(44) of the second electrode layer 44 (e.g., defined in z-direction). For example, the height h(44) of the second electrode layer 44 may be greater than the height h(24) of the first electrode layer 24, or vice versa. The first electrode layer 24 may directly contact the memory material portion 22 and the second electrode layer 44 may directly contact the dielectric material portion 42. The contact area of the dielectric material portion 42 and the second electrode layer 44 may be greater than the contact area of the memory material portion 22 and the first electrode layer 24, or vice versa. The memory material portion 22 may directly contact the first lateral surface portion 20 and the dielectric material portion 42 may directly contact the second lateral surface portion 40. The contact area of the dielectric material portion 42 and the second lateral surface portion 40 may be greater than the contact area of the memory material portion 22 and the first lateral surface portion 20, or vice versa.

According to various aspects, a capacitance of the capacitive memory structure may be controlled by the height h(24) of the first electrode layer 24. According to various aspects, the electrode pillar 12, the dielectric material portion 42, and the second electrode layer 44 may form a capacitive structure. If not stated explicitly otherwise, a dielectric material portion as described herein may include a dielectric material that is not spontaneously polarizable. According to various aspects, the non-spontaneously-polarizable dielectric material portion 42, the electrode pillar 12, and the second electrode layer 44 may form the capacitive structure, in some aspects also referred to as capacitive lever structure. A capacitive lever structure (in some aspects also referred to as lever capacitor or lever capacitor structure) may include a non-spontaneously-polarizable dielectric material portion 42, if not explicitly stated otherwise. According to various aspects, a capacitance of the capacitive structure may be controlled by the height h(44) of the second electrode layer 44. According to various aspects, the capacitive memory structure 2 may have a first capacitance and the capacitive structure may have a second capacitance different from the first capacitance. According to various aspects, a ratio of the first capacitance and the second capacitance may be controlled by the height h(24) of the first electrode layer 24 and/or the height h(44) of the second electrode layer 44. Illustratively, the first capacitance, the second capacitance, and/or their ratio are tunable. Thus, the first capacitance, the second capacitance, and/or their ratio is controllable by controlling the thickness of the respective electrode layer(s). In some cases, preparing a layer (e.g., by deposition, e.g., by etching, etc.) may be more precise as compared to other techniques which may control a capacitance by means of controlling a width, e.g., a width may be controlled by lithography. For example, lithography may have a precision of about 5 nm, whereas preparing a layer may be precise down to atomic layers.

Illustratively, the second electrode layer 44 may include a hole (e.g., a recess). The hole may extend from a first surface of the second electrode layer 44 to a second surface of the second electrode layer 44 opposite the first surface of the second electrode layer 44. The electrode pillar 12 may be disposed within the hole of the second electrode layer 44. The dielectric material portion 42 may be disposed at least within the hole of the second electrode layer 44 in a gap between the second electrode layer 44 and the second lateral surface portion 40.

According to various aspects, the dielectric material portion 42 may include or may consist of a memory material. For example, the memory material portion 22 may be a first memory material portion and the dielectric material portion 42 may be a second memory material portion. In this case, the dielectric material portion 42 may include or may consist of a spontaneously-polarizable material and the capacitive structure including the dielectric material portion 42 may be a capacitive memory structure.

Figure 3C:
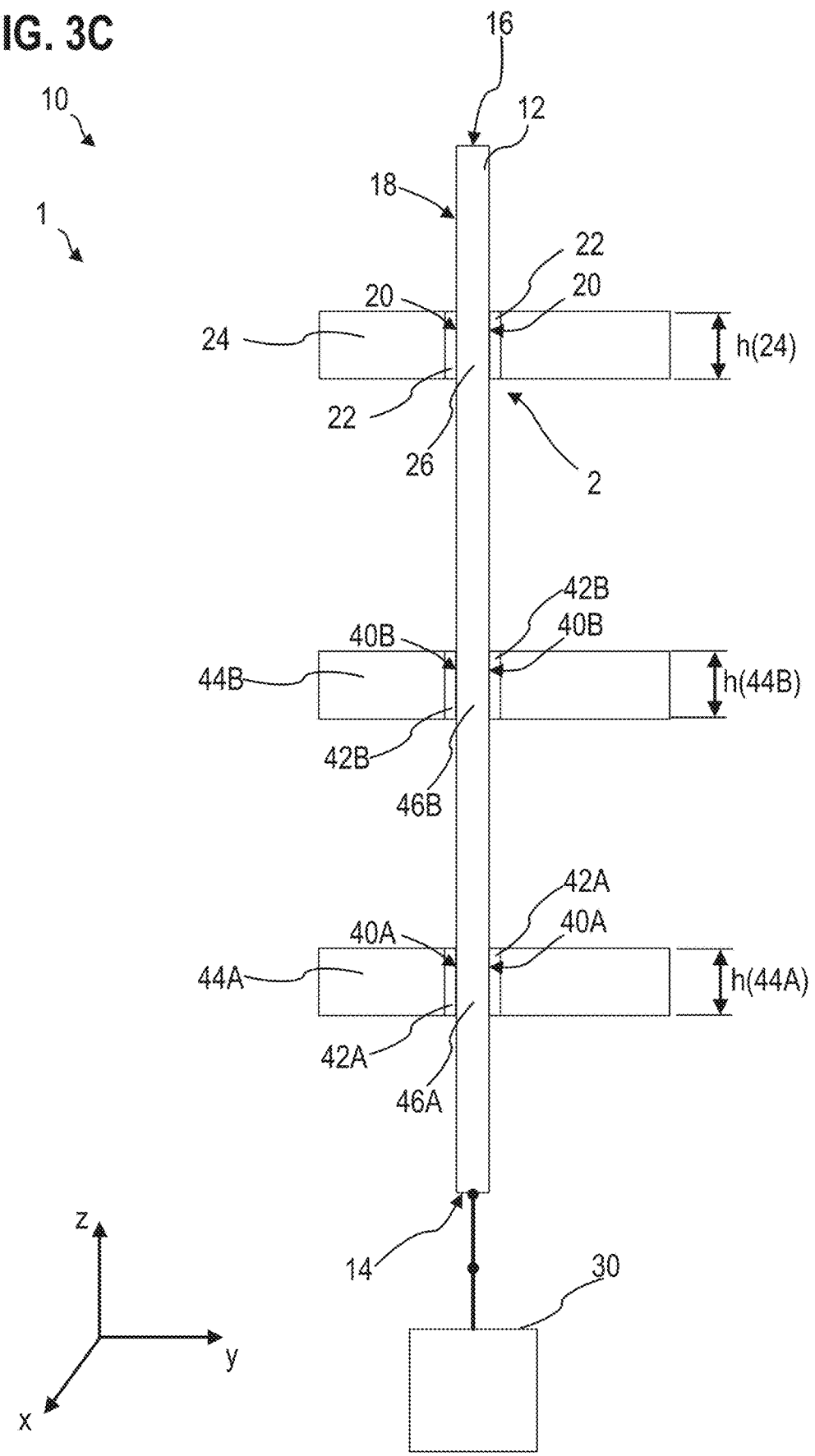

FIG. 3C schematically shows the memory cell arrangement 10 according to various aspects. The memory cell arrangement 10 may include an additional second electrode layer 44B. The memory cell 1 may include an additional dielectric material portion 42B. The additional dielectric material portion 42B may surround (e.g., perimeterally surround, e.g., completely perimeterally surround) an additional second lateral surface portion 40B of the electrode pillar 12. The additional second lateral surface portion 40B may be different from the second lateral surface portion 40 (in the following also referred to as second lateral surface portion 40A) and different from the first lateral surface portion 20.

According to various aspects, the additional dielectric material portion 42B may be configured similar to the dielectric portion 42 as described herein. According to various aspects, the additional electrode layer 44B may be configured similar to the electrode layer 44 as described herein. According to various aspects, a height h(44A) of the second electrode layer 44A may be greater than a height h(44B) of the additional second electrode layer 44B, or vice versa. According to various aspects, the electrode pillar 12, the additional dielectric material portion 42B, and the additional second electrode layer 44B may form an additional capacitive structure.

Figure 3D:
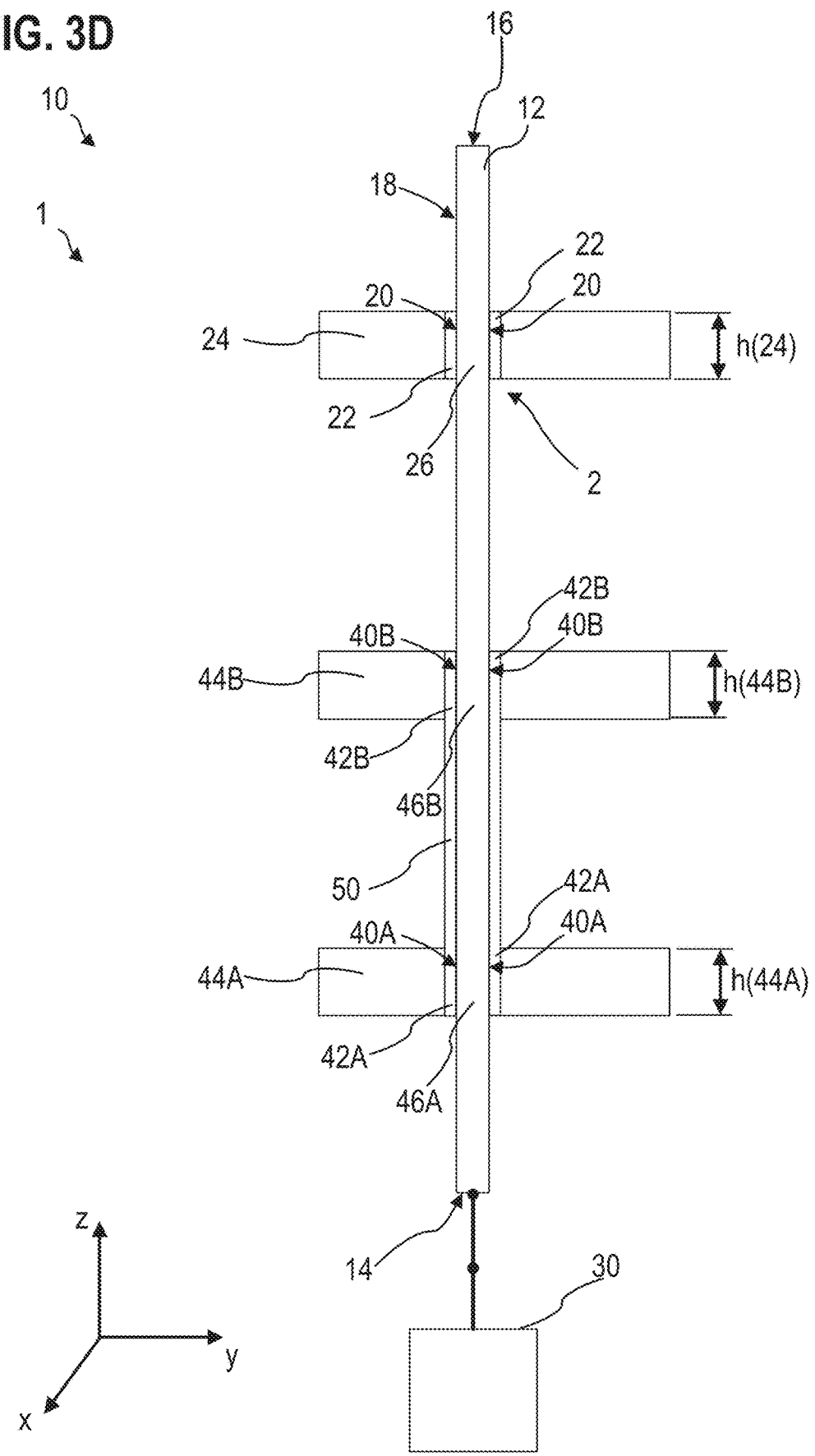

With respect to FIG. 3D, the memory cell 1 may include a dielectric material layer 50. The dielectric material layer 50 may substantially continuously surround (e.g., perimeterally surround, e.g., completely perimeterally surround) at least a part of the lateral surface 18 of the electrode pillar 12. The dielectric material layer 50 may provide the dielectric material portion 42A associated with the second electrode layer 44A and the additional dielectric material portion 42B associated with the additional second electrode layer 44B. According to various aspects, the dielectric material portion 42 may include or may consist of a memory material (e.g., a spontaneously-polarizable material). According to various aspects, the dielectric material layer 50 may provide the dielectric material portion 42A, the additional dielectric material portion 42B, and the memory material portion 24. In this case, a sum of the height h(44A) of the second electrode layer 44A and the height h(44B) of the additional second electrode layer 44B may be greater than the height h(24) of the first electrode layer 24. According to various aspects, the height h(44A) of the second electrode layer 44A and the height h(44B) of the additional second electrode layer 44B each may be greater than the height h(24) of the first electrode layer 24.

Figure 4A:
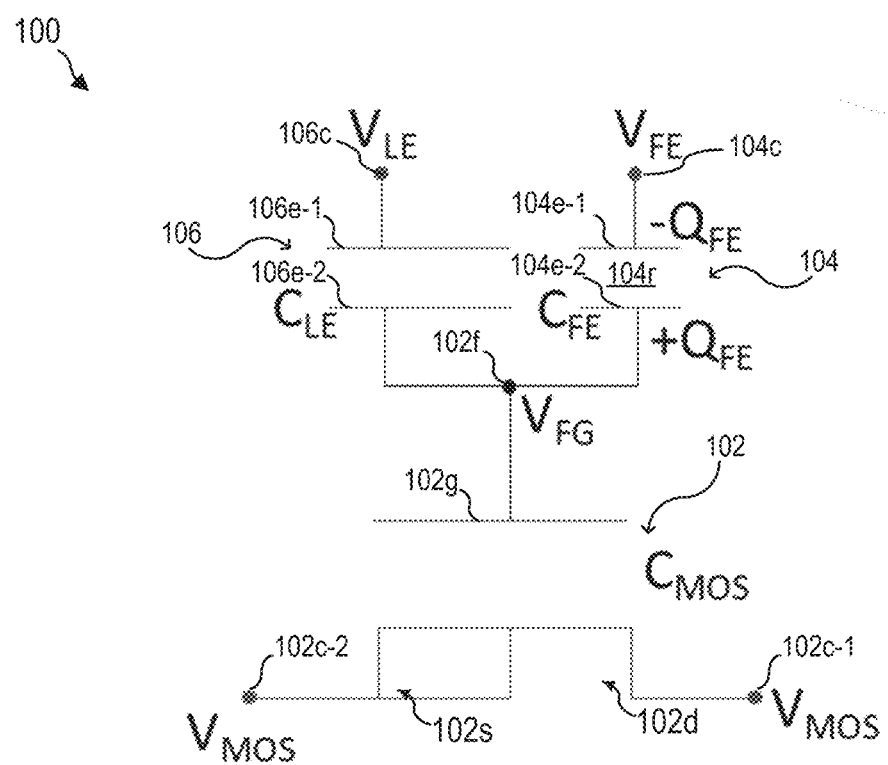
FIG. 4A schematically shows a memory cell, according to various aspects.

FIG. 4A schematically shows a memory cell 100 according to various aspects. The memory cell 100 may include a transistor structure, e.g., a field-effect transistor structure 102. The field-effect transistor structure 102 may be a metal-oxide-semiconductor (MOS) field-effect transistor structure 102 (e.g., referred to as MOSFET). However, any other suitable transistor structure may be used in the same way or on a similar way. According to various aspects, the memory cell 100 may include two capacitor structures, e.g., a first capacitor structure 104 and a second capacitor structure 106. Illustratively, the memory cell 100 may be configured as a 1T2C-cell (i.e. a memory cell that includes one transistor, 1T, and two capacitors, 2C). Illustratively, the memory cell 100 may be configured as a 1T2C-cell (i.e. a memory cell that includes one transistor, 1T, and two capacitors, 2C). According to various aspects, the first capacitor structure 104 may be a first capacitive memory structure. According to various aspects, the second capacitor structure 106 may be a capacitive lever structure. Therefore, even in the case that the second capacitor structure 106 includes one or more remanent-polarizable portions and/or one or more remanent-polarizable layers, these one or more remanent-polarizable portions and/or one or more remanent-polarizable layers may not be switched during operation as a lever capacitor. Illustratively, the second capacitor structure 106 may be effectively used as a dielectric (non-spontaneously polarizable) capacitor structure.

The memory cell 100 may include a first control node 104c (e.g., a node to be connected to a word-line, a node to apply a write voltage $V_{FE}=V_{PP}$, a node to apply a read-voltage $V_{FE}=V_G$, as examples) and a second control node 106c (e.g., a node to be connected to a lever-line, a node to apply a lever-voltage $V_{LE}$, as examples). The first capacitor structure 104 may include a first electrode 104e-1, e.g., connected to the first control node 104c of the memory cell 100. The first capacitor structure 104 may further include a second electrode 104e-2 connected to the field-effect transistor structure 102, e.g., to a gate structure or a gate node of the field-effect transistor structure 102. In some aspects, the field-effect transistor structure 102 may include a gate structure 102g to control the field-effect transistor structure 102, e.g., to control a current flow through the field-effect transistor structure 102 or to control a conductivity of a channel of the field-effect transistor structure 102. According to some aspects, the field-effect transistor structure 102 may include or may be a long channel MOSFET. A long channel MOSFET may include a channel length greater than about 50 nm. The memory cell 100 may include a gate node 102f at which a gate voltage $V_{FG}$ may be provided to control the field-effect transistor structure 102. The gate structure 102g of the field-effect transistor structure 102 may be configured to be electrically floating. According to various aspects, the second electrode 104e-2 of the first capacitor structure 104 may be connected to the gate node 102f.

According to various aspects, the first capacitor structure 104 may include a remanent-polarizable layer or region 104r disposed between the first electrode 104e-1 and the second electrode 104e-2. According to various aspects, the first capacitor structure 104 may have a layered design including one or more remanent-polarizable layers sandwiched between two electrode layers. One or more remanent-polarizable layers may be provided between the electrodes 104e-1, 104e-2 of the first capacitor structure 104. According to various aspects, the first capacitor structure may be a ferroelectric capacitor (also referred to as FeCAP). A FeCAP may be the storage element of the memory cell 100 used to bit-wise store information.

According to various aspects, the second capacitor structure 106 may include a first electrode 106e-1 connected to the second control node 106c and a second electrode 106e-2 connected to the field-effect transistor structure 102, e.g., to the gate of the field-effect transistor. According to various aspects, the second electrode 106e-2 of the second capacitor structure 106 may be connected to the gate node 102f.

According to various aspects, the second capacitor structure 106 may include an electrically isolating region 106i disposed between the first electrode 106e-1 and the second electrode 106e-2 of the second capacitor structure 106. According to various aspects, one or more dielectric layers (in other words one or more electrically insulating layers) may be provided between the electrodes 106e-1, 106e-2 of the second capacitor structure 106. In another aspect, one or more remanent-polarizable layers may be provided between the electrodes 106e-1, 106e-2 of the second capacitor structure 106. According to various aspects, the second capacitor structure may be a dielectric capacitor or a ferroelectric capacitor (also referred to as FeCAP). According to various aspects, the second capacitor structure 106 may have a layered design including one or more remanent-polarizable layers and/or one or more dielectric layer sandwiched between two electrode layers. However, if the integration would allow it, a gap between the electrodes 106e-1, 106e-2 of the second capacitor structure 106 may be provided that is free of any solid material. In this case, no dielectric material may be disposed between the electrodes 106e-1, 106e-2 of the second capacitor structure 106.

According to various aspects, the first capacitor structure 104 and the second capacitor structure 106 may include the same materials but may have a respective capacitance different from one another. In some aspects, the first capacitor structure 104 has a first capacitance $C_{FE}$ and the second capacitor structure 106 has a second capacitance $C_{LE}$, wherein the first capacitance $C_{FE}$ is different from the second capacitance $C_{LE}$. For example, the capacitance $C_{LE}$ of the second capacitor structure 106 may be at least 10% (e.g., 10%, e.g., more than 15%, e.g., more than 20%, e.g., more than 30%, e.g., more than 40%, etc.) different from the capacitance $C_{FE}$ of the first capacitor structure 104. As an example, the capacitance $C_{LE}$ of the second capacitor structure 106 may be greater than the capacitance $C_{FE}$ of the first capacitor structure 104. For example, the capacitance $C_{LE}$ of the second capacitor structure 106 may be at least 10% (e.g., 10%, e.g., more than 15%, e.g., more than 20%, e.g., more than 30%, e.g., more than 40%, etc.) greater than the capacitance $C_{FE}$ of the first capacitor structure 104. This may allow, for example, an effective readout of the memory cell 100 and, e.g., at the same time, an effective writing of the memory cell 100. As an example, a lever voltage $V_{LE}$ having a first voltage value may be applied at the second control node 106c during a readout process and a lever voltage $V_{LE}$ having a second voltage value may be applied at the second control node 106c during a write process, wherein the first voltage value may be different from the second voltage value.

There may be various options to modify a capacitance of a capacitor structure, e.g., a distance of the capacitor's electrodes may be decreased to increase the capacitance of the capacitor structure and vice versa. Another possibility may include increasing the effective area of the capacitor's electrodes to increase the capacitance of the capacitor structure. Still another possibility may include using a dielectric material disposed between the capacitor's electrodes, the higher the relative permittivity of the dielectric material the higher the capacitance of the capacitor structure. According to various aspects, an effective area of a capacitor structure may be determined by a geometrical vertical projection of one electrode of the capacitor structure to the other electrode of the capacitor structure. To increase the effective area of a capacitor structure (e.g., while remaining a comparatively low footprint) may be to configure the capacitor structure as a three-dimensional capacitor structure including at least one curved or angled portion.

According to various aspects, the memory cell 100 may include a third control node (e.g., a first source/drain node) 102c-1 coupled to a first region (e.g., to a first source/drain region) 102d of the field-effect transistor structure 102 and a fourth control node (e.g., a second source/drain node) 102c-2 coupled to a second region (e.g., to a second source/drain region) 102s of the field-effect transistor structure 102.

According to various aspects, the field-effect transistor structure 102 may have a third capacitance $C_{MOS}$ associated therewith. In some aspects, the capacitance $C_{MOS}$ of the field-effect transistor structure 102 may result at least partially from the gated design thereof. It may be noted that the first capacitor structure 104 and the second capacitor structure 106 are illustrated (e.g., in FIG. 4A) as single capacitors. However, the first capacitor structure 104 may include more than one capacitor, e.g., a capacitor arrangement including at least two capacitors (e.g., at least two FeCAPs) coupled in parallel between the first control node 104c and the gate node 102f. Further, the second capacitor structure 106 may include more than one capacitor, e.g., a capacitor arrangement including at least two capacitors (e.g., at least two dielectric capacitors, e.g., at least two ferroelectric capacitors) coupled in parallel between the second control node 106c and the gate node 102f.

According to various aspects, the second capacitor structure 106 may be a non-ferroelectric capacitor structure, i.e., another material than a ferroelectric material may be disposed between the two electrodes 106e-1, 106e-2 of the second capacitor structure 106. According to various aspects, the second capacitor structure 106 may be or may include a linear capacitor (such as a dielectric capacitor, as example). A linear capacitor may be configured to show a linear behavior in the current-voltage-characteristics, i.e. a linear I-V-curve.

In the following, one or more problems are described that would be relevant if the second capacitor structure 106 would not be included in the memory cell 100, i.e., relevant for a standard 1T1C memory cell having no lever capacitor structure included therein.

A 1T1C ferroelectric field-effect transistor (FeFET) may include a single ferroelectric capacitor (e.g., with a capacitance $C_{FE}$) connected to a gate of a single field-effect transistor structure (e.g., with a capacitance $C_{MOS}$). The charge created by the ferroelectric capacitor may modify the effective gate voltage to control the field-effect transistor. According to various aspects, the capacitances $C_{MOS}$ and $C_{FE}$ of the two elements may be adjusted and as a result, a voltage drop over the ferroelectric capacitor may be tuned to have either an efficient write operation or an efficient read operation, i.e., either to reduce the gate voltage or to reduce (e.g., minimize) read disturb, as explained in more detail below.

In a first case, the capacitance $C_{MOS}$ may be significantly greater than the capacitance $C_{FE}$. This may allow for a reduction of the write voltage $V_{PP}$. An advantage may be that the write voltage can be reduced, since most of the voltage may drop over the ferroelectric capacitor ($C_{FE}$). However, a disadvantage may be that—during a read operation—the read voltage $V_G$ may drop mainly over the ferroelectric capacitor ($C_{FE}$), which may reduce the control over the field-effect transistor structure ($C_{MOS}$). The field-effect transistor may in some cases not be controlled effectively in the case that the capacitance ratio of $C_{MOS}$ and $C_{FE}$ is high, because most of the voltage may drop over the ferroelectric capacitor ($C_{FE}$), which may potentially lead to a read disturb due to rewriting the memory state during reading. Furthermore, the capacitance of the field-effect transistor (e.g., of a MOSFET) may be non-linear, which may make it difficult to set a specific capacitance ratio $C_{MOS}/C_{FE}$.

In a second case, the $C_{FE}$ may be significantly greater than $C_{MOS}$. This may allow for a reduction of the read disturb. An advantage may be that a read disturb can be avoided, since most of the voltage may drop across the field-effect transistor ($C_{MOS}$). However, a disadvantage may be that during a write operation all the voltage may drop over the field-effect transistor, which increases the voltage that is necessary to write the memory cell. Further, the voltage drop over $C_{MOS}$ and $C_{FE}$ due to the ferroelectric charge may be increased with a decreasing $C_{MOS}/C_{FE}$ ratio, which may lead to a depolarization of the ferroelectric capacitor ($C_{FE}$).

Compared to commonly used approaches, the memory cell 100 described herein may include a lever capacitor structure in addition to the ferroelectric capacitor. In this case, the ferroelectric capacitor may be used to store the actual information in the memory cell and the lever capacitor may be used to modify the voltage regimes in the memory cell 100 for an improved operation. The lever capacitor (e.g., embodied by the second capacitor structure 106) may be used to modify the voltage distribution among the elements of the memory cell 100 so that reading and writing can be performed efficiently, as explained in more detail below.

According to various aspects, memory cell 100 including a lever capacitor ($C_{LE}$) is provided, e.g., wherein the lever capacitor ($C_{LE}$) may be used to change the voltage that drops over the ferroelectric capacitor during write and read. The use of a lever capacitor may allow, for example, a reduction of write voltages and an avoidance of a destructive read or any other read disturb. The lever capacitor may be a ferroelectric capacitor, a dielectric capacitor, e.g., any suitable capacitor structure. The ferroelectric capacitor that stores the actual information (e.g., embodied by the first capacitor structure 104) and the lever capacitor can be of different capacitances. The equation to calculate the floating gate potential may be given by as follows:

$$V_{FG} \approx (V_{FE}C_{FE} + V_{LE}C_{LE} + V_{MOS}C_{MOS} + Q_{FE})/(C_{FE} + C_{LE} + C_{MOS}),$$

wherein $V_{FE}$ may be the voltage applied to the ferroelectric capacitor, $V_{LE}$ may be the voltage applied to the level capacitor, $V_{MOS}$ may be the voltage applied to the field-effect transistor (e.g., to the source/bulk and drain of the field-effect transistor), $Q_{FE}$ may be the ferroelectric charge, $C_{LE}$ may be the capacitance of the lever capacitor, and $C_{FE}$ may be the capacitance of the ferroelectric capacitor (see FIG. 4A).

As an example, during a write operation, a voltage/potential $V_{PP}$ may be applied to the ferroelectric capacitor node such that $V_{FE}$ may be substantially equal to $V_{PP}$ whereas the lever capacitor and the field-effect transistor (e.g., embodied by the field-effect transistor structure 102) may be grounded such that $V_{SS}$ (a base voltage) may be substantially equal to $V_{LE}$ and such that $V_{LE}$ may be substantially equal to $V_{MOS}$. Depending on the lever capacitance $C_{LE}$ and the field-effect transistor capacitance $C_{MOS}$, the voltage drop over the ferroelectric capacitor may be tuned to $C_{MOS}+C_{LE}$ being substantially greater than $C_{FE}$ and most of the voltage $V_{PP}$ may drop over the ferroelectric capacitor. This may reduce the write voltage significantly and create a ferroelectric polarization charge $Q_{FE}$.

Under the assumption that $C_{MOS}+C_{LE}$ is substantially greater than $C_{FE}$, the equation to calculate the floating gate potential gives the following result:

$$V_{FG} \approx V_{FE}C_{FE}/(C_{LE}+C_{MOS}) \approx V_{SS}.$$

It may be noted that this goal can be achieved with a classical FeFET structure that has only one capacitor connected to the gate in the case that $C_{MOS}$ is chosen large enough. However, this may cause read disturb issues as described above. However, a read disturb may be prevented by using the configuration described herein with respect to the memory cell 100, as explained in more detail below.

During reading the memory cell (e.g., to detect the ferroelectric charge $Q_{FE}$), a read voltage $V_G$ may be applied to both the ferroelectric capacitor node (such that $V_{FE}$ may be substantially equal to $V_G$) and to the lever capacitor node (such that $V_{LE}$ may be substantially equal to $V_G$). However, a voltage that is lower than the read voltage $V_G$ may be applied to the lever capacitor node, e.g., a voltage in the range from $V_G/2$ to $V_G$. As an example, the read voltage may be applied to both the first control node 104c and the second control node 106c of the memory cell 100. Hence the capacitance divider provided by the two capacitors 104, 106 and the field-effect transistor structure 102 of the memory cell 100 may be changed by the applied voltages and provide the condition that $C_{MOS}$ may be significantly less than $C_{LE}+C_{FE}$ and, as a result, most of the voltage may drop over the field-effect transistor structure 102 that allows a non-destructive read.

According to various aspects, due to the additional terminal connected to the lever capacitor (e.g., due to the second control terminal 106c), it may be possible to change the effective capacitance divider of the memory cell 100 during write and/or read. This allows, for example, for an avoidance of the disadvantages described above with reference to a standard 1T1C memory cell. If $C_{LE}$ may be substantially greater than $C_{MOS}$ and if $C_{LE}$ may be substantially greater than $C_{FE}$, the non-linearity of the MOS capacitance may be reduced significantly in the case that the lever capacitor $C_{LE}$ is a linear capacitor.

Under the assumption that $C_{MOS}$ is substantially less than $C_{LE}+C_{FE}$, the equation to calculate the floating gate potential gives the following result:

$$V_{FG} \approx V_G + Q_{FE}/C_{LE}.$$

According to various aspects, the drain voltage applied to the third control node 102c-1 may be utilized to transfer charge over the inversion layer of the field-effect transistor structure 102 and to read out the ferroelectric state of the first capacitor structure 104.

During retention, all terminals (in other words all control nodes 102c-1, 102c-2, 104c, 106c) of the memory cell 100 may be grounded and the floating gate potential ($V_{FG}$) may depend mainly on the lever capacitance ($C_{LE}$) provided that $C_{LE}$ may be substantially greater than $C_{MOS}$ and if $C_{LE}$ may be substantially greater than $C_{FE}$, which may be utilized to reduce the depolarization field of the ferroelectric, as can be seen from the following equation:

$$V_{FG} \approx Q_{FE}/C_{LE}.$$

According to various aspects, the lever capacitance value may be selected accordingly to get a sufficiently high change in the gate voltage of the field-effect transistor during a read operation and a low floating gate potential during retention phase.

Figure 4B:
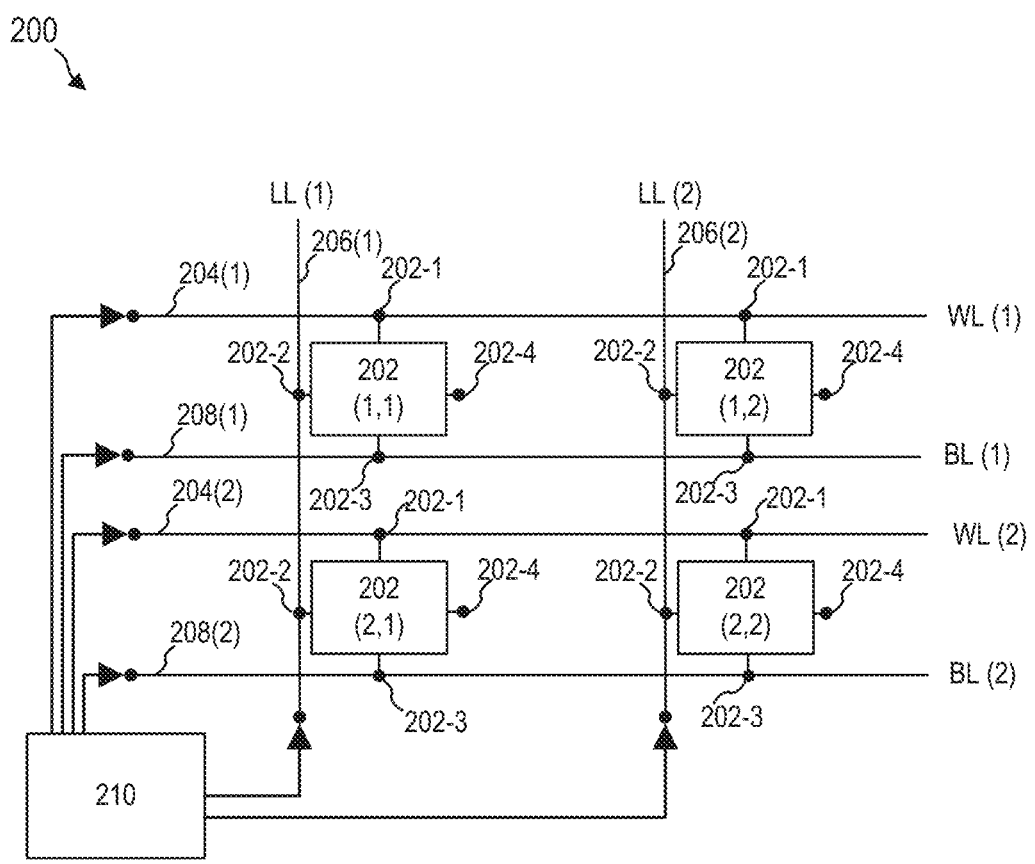
FIG. 4B schematically shows a memory cell arrangement, according to various aspects.

FIG. 4B illustrates schematically an exemplary configuration of a memory cell arrangement 200, according to various aspects. In some aspects, the memory cell arrangement 200 may include a plurality of memory cells 100, as described herein. However, other suitable memory cells may be used in the same or on a similar way. As an example, each memory cell 202 of the memory cell arrangement 200 may include a field-effect transistor structure (referred to as field-effect transistor, FET), a ferroelectric capacitor structure (referred to as ferroelectric capacitor, FeCAP), and an additional capacitor structure (referred to as lever capacitor, LeCAP). The additional capacitor structure may include or may be a ferroelectric capacitor, a dielectric capacitor, or any other suitable capacitor. In some aspects, the memory cells 202 of the memory cell arrangement 200 may be configured as described with reference to memory cell 100 illustrated in FIG. 4A. In another aspect, each memory cell 202 of the memory cell arrangement 200 may be configured so that the ferroelectric capacitor structure and the additional capacitor structure have the same capacitance. In some aspects, each memory cell 202 of the memory cell arrangement 200 may include two ferroelectric capacitors, wherein one of the two ferroelectric capacitors may be configured to store a charge representing the actual information (e.g., representing a logic "0" or a logic "1") of the memory cell 202 and wherein the other one of the two ferroelectric capacitors may be configured as a lever capacitor.

According to various aspects, each memory cell 202 of the memory cell arrangement 200 may include four nodes or, in other words, four terminals. The nodes/terminals may be used to address the memory cells 202 of the memory cell arrangement 200 to read and/or write the respective memory cells 202. As illustrated in FIG. 4B, each memory cell 202 may include a first control node 202-1, a second control node 202-2, a third control node 202-3, and a fourth control node 202-4. The first control node 202-1 may be connected to the ferroelectric capacitor of the memory cell 202. The second control node 202-2 may be connected to the lever capacitor of the memory cell 202. The third control node 202-3 may be connected to the field-effect transistor of the memory cell 202 (e.g., to a first source/drain region of the field-effect transistor, referred to as drain). The fourth control node 202-4 may be connected to the field-effect transistor of the memory cell 202 (e.g., to a second source/drain region of the field-effect transistor, referred to as source).

As an example, by applying respective voltages at the control nodes, an electrical behavior of the third control node 202-3 and the fourth control node 202-4 of the respective memory cell 202 may be controlled. As an example, a current flow between the third control node 202-3 and the fourth control node 202-4 may be controlled by applying respective voltages to the first control node 202-1 and the second control node 202-2. As another example, a voltage output at the third control node 202-3 may be controlled by applying respective voltages to the first control node 202-1 and the second control node 202-2).

According to various aspects, each memory cell of the plurality of memory cells 202 of the memory cell arrangement 200 may be a field-effect transistor (FET) based memory cell, and may include two source/drain regions and a gate region (also referred to as gate structure) to control a current flow between the two source/drain regions. In various aspects, each of the one or more memory cells 202 may include a field-effect transistor structure. As an example, each memory cell 202 may include a gate node, a source node, and a drain node. The gate node may be coupled to the gate region of the memory cell 202 via the first capacitor structure 104 (e.g., via the ferroelectric capacitor). The source node may be coupled to the source region of the memory cell. The drain node may be coupled to the drain region of the memory cell 202.

The memory cells 202 of the memory cell arrangement 200 may be arranged, for example, in a matrix architecture. The memory cells 202 may be arranged in a number, n, of columns, and in a number, m, of rows, with m and n integer numbers greater than 1. FIG. 4B illustrates two columns (e.g., a first column and a second column) and two rows (a first row and a second row) of a memory cell arrangement 200 including two memory cells 202 each, only as an example. The memory cell arrangement 200 may include any suitable number of memory cells 202, arranged in any suitable number, n, of columns, and in any suitable number, m, of rows. The memory cells 202 in each row may from a respective first subset of memory cells and the memory cells 202 in each column may from a respective second subset of memory cells.

According to various aspects, the memory cell arrangement 200 may include a plurality of control-lines 204, 206, 208 (e.g., one or more word-lines, WL, one or more bit-lines, BL, and one or more lever-lines, LL), coupled to the memory cells 202. The control-lines 204, 206, 208 may be used to supply voltages/potentials to control nodes of the memory cells 202. The plurality of control-lines 204, 206, 208 may be arranged in any suitable way defined, for example, by the desired matrix architecture of the memory cell arrangement 200.

According to various aspects, the first control node 202-1 of each memory cell 202 may be connected to a corresponding first control-line 204(1), 204(2) (e.g., to a corresponding word-line, WL). The second control node 202-2 of each memory cell 202 may be connected to a corresponding second control-line 206(1), 206(2) (e.g., to a corresponding lever-line, LL). According to various aspects, the third control node 202-3 of each memory cell 202 may be connected to a corresponding third control-line 208(1), 208(2) (e.g., to a corresponding bit-line, BL). According to various aspects, the fourth control node 202-4 of each memory cell 202 may be connected to a common control node (e.g., a common source-node or a common source region). However, if desired, the fourth control nodes 202-4 could be addressed via one or more corresponding fourth control-lines (not shown), e.g., via one or more corresponding source-lines (not shown). Illustratively, each memory cell 202 of the memory cell arrangement 200 may be unambiguously assigned to one word-line, WL, one lever-line, LL, and one bit-line, BL. According to various aspects, the memory cell arrangement 202 may include a set of word-lines, (e.g., a first word-line, WL(1), and a second word-line, WL(2), as an example), a set of bit-lines (e.g., a first bit-line, BL(1), and a second bit-line, BL(2), as an example), and a set of lever-lines (e.g., a first lever-line, LL(1), and a second lever-line, LL(2), as an example). The memory cell arrangement 200 may include any suitable number of control lines. According to various aspects, each word-line, WL, may be coupled to each memory cell 202 in a same row of memory cells 202. Each bit-line, BL, may be coupled to each memory cell 202 in a same row of memory cells 202. Each lever-line, LL, may be coupled to each memory cell 202 in a same column of memory cells 102. According to various aspects, the word-lines and the lever-lines may be connected to different subsets of memory cells 202 of the memory cell arrangement 200. According to various aspects, the bit-lines and the lever-lines may be connected to different subsets of memory cells 202 of the memory cell arrangement 200. According to various aspects, the bit-lines and the word-lines may be connected to same subsets of memory cells 202 of the memory cell arrangement 200.

According to various aspects, each memory cell 202 of the memory cell arrangement 200 may include a remanent-polarizable layer (as an example, each of the one or more memory cells 102 may include a FeCAP). Therefore, the memory state a memory cell 202 is residing in may be associated with one of at least two polarization states of the respective remanent-polarizable layer. A first threshold voltage, $V_{L-th}$, of the field-effect transistor of the memory cell 202 may be associated with a first (e.g., positive) residual polarization of the remanent-polarizable layer (e.g., it may be a function of the first residual polarization) and the second threshold voltage, $V_{H-th}$, of the field-effect transistor of the memory cell 202 may be associated with a second (e.g., negative) residual polarization of the remanent-polarizable layer (e.g., it may be a function of the second residual polarization).

According to various aspects, the memory cell arrangement 200 may include a control circuit 210. The control circuit 210 may be configured to carry out and/or instruct one or more read operations and/or one or more write operations associated with a reading and/or writing of the memory cells 202 of the memory cell arrangement 200. The control circuit 210 may be configured to supply one or more control signals (e.g., one or more read signals, one or more write signals, etc.) to the memory cells 202. Illustratively, one or more read signals and one or more write signals may be provided to the respective memory cell that is intended to be read and/or written. The control signals may be understood as any (e.g., constant or time-varying) potential or voltage provided at the respective nodes of the memory cells and/or to the control lines of the memory cell arrangement 200. According to various aspects, the control circuit 210 may include or may control one or more voltage supply circuits. The one or more voltage supply circuits may be used for supplying control voltages (e.g., a read voltage, $V_G$, a write voltage, $V_{PP}$, a base voltage, $V_{SS}$, as examples) to the control-lines 204, 206, 208 of the memory cell arrangement 200, e.g., for supplying voltages to the respective control nodes 201-1, 201-2, 201-3, 201-4 of the one or more memory cells 202. According to various aspects, the control circuit 210 may define a base voltage, e.g., $V_{SS}$, e.g., a ground voltage (for example 0 V) associated with the memory cell arrangement 200.

According to various aspects, during readout of a memory cell, a drain current, ID, may be created at the bit-line corresponding to the memory cell to be read out (e.g., by applying a readout voltage and a lever voltage accordingly), wherein the drain current may vary as a function of a gate-source voltage drop and, therefore, as a function of the memory state (e.g., LVT state or HVT state) the memory cell is residing in. As an example, a current flow through the memory cell may reflect the memory state the memory cell is residing in in the case that a gate-source voltage drop falls between the first threshold voltage, $V_{L-th}$, and the second threshold voltage, $V_{H-th}$.

In the following, one or more problems are described that may be relevant for a conventional AND architecture used to implement a memory cell arrangement based on standard 1T1C-FeFET memory cells having no lever capacitor structure included therein.

In general, ferroelectric transistors (FeFETs) may be organized in AND architectures, which may allow, for example, a single bit programming but only a word based erase. As an example, if the memory cells of the memory cell arrangement include long channel MOS transistors, only a whole row of memory cells may be erased at once. For short channel MOS transistors, where the depletion zone merges by applying a voltage to source and drain region, a bit erase may be possible. However, a high voltage at the source and drain regions has to be used during inhibition or during bit erase, which may cause substantial reverse junction leakages that increase the power consumption of the memory cell arrangement during operation.

Compared to commonly used approaches, the memory cells described herein may include at least two capacitors; and, in some aspects, the memory cells may be embed into an array to prevent disadvantages mentioned above, e.g., to prevent a substantial reverse junction leakage during a bit erase, to avoid substantial read and write disturbs, as examples.

Figure 4C:
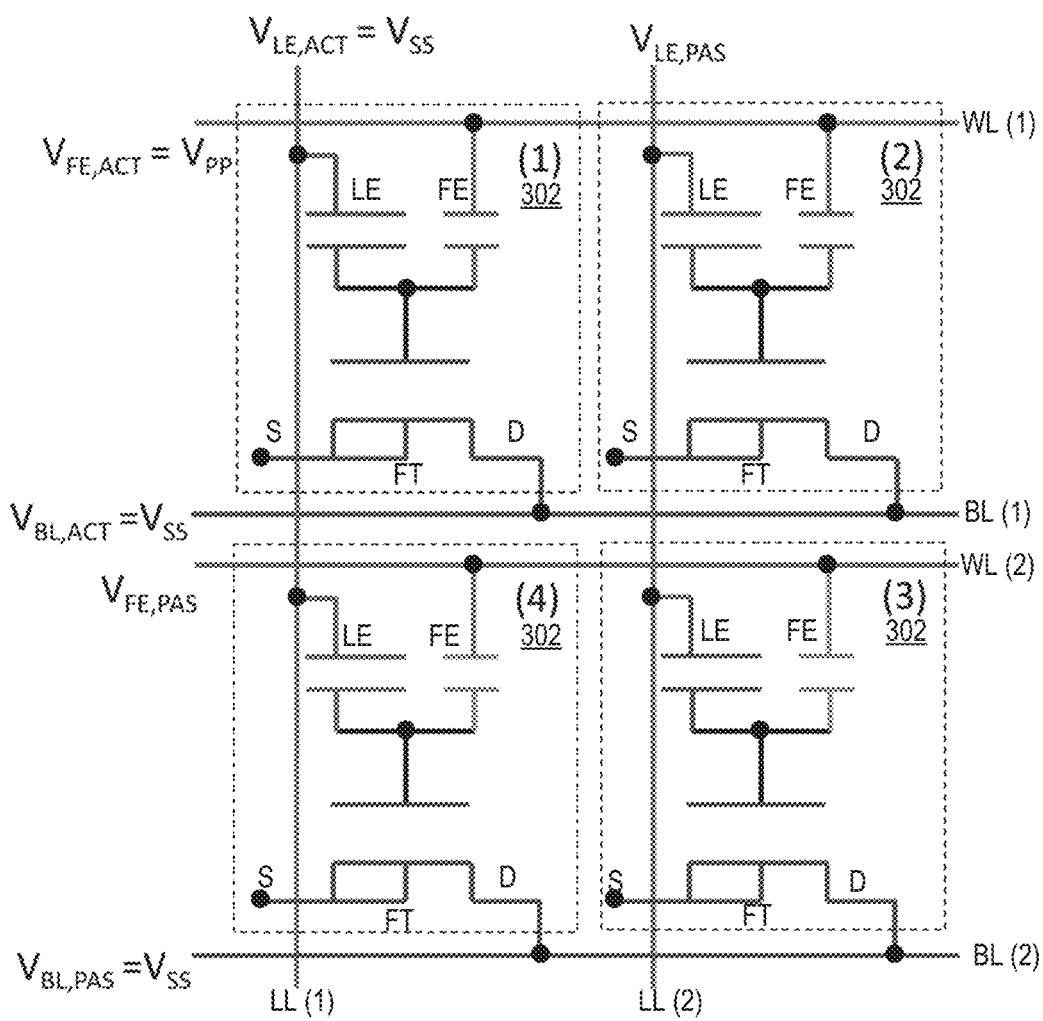
FIGS. 4C to 4H schematically show memory cell arrangements of various architectures and addressing schemes, according to various aspects.
Figure 4D:
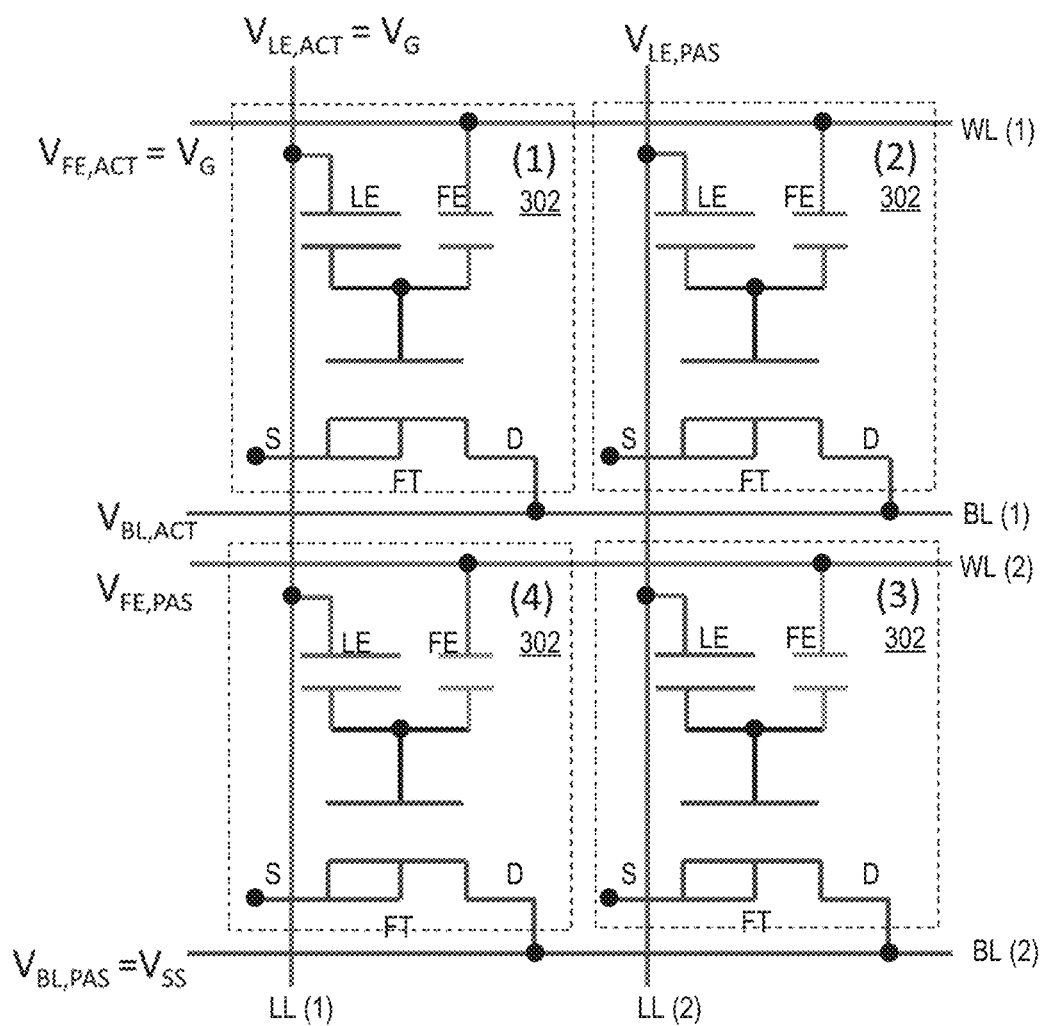

According to various aspects, the 1T2C memory cells of a memory cell arrangement (e.g., of memory cell arrangement 200 described herein with reference to FIG. 4A) may be organized as an array based on a NOR architecture, as illustrated in FIG. 4C and FIG. 4D.

FIG. 4C shows exemplarily a writing of a memory cell (1) of a memory cell arrangement 300, according to various aspects. The memory cell arrangement 300 may be configured in the same way or in a similar way as described herein with reference to the memory cell arrangement 200, see FIG. 4A. Each memory cell 302 of the memory cell arrangement 300 may include a lever capacitor LE, a ferroelectric capacitor FE, and a field-effect transistor FT. The lever capacitor LE of the respective memory cell 302 may be connected to a corresponding lever-line LL(1), LL(2) and to the floating gate of the field-effect transistor FT of the respective memory cell 302. The ferroelectric capacitor FE of the respective memory cell 302 may be connected to a corresponding word-line WL(1), WL(2) and to the floating gate of the field-effect transistor FT of the respective memory cell 302. The field-effect transistor FT may be connected with its source S to a common source potential and with its drain D to a corresponding bit-line BL(1), BL(2).

In this example, it may be assumed that only memory cell (1) of the memory cell arrangement 300 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V).

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns). According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 302 of the memory cell arrangement 300 may be prevented during writing the selected memory cell (1).

As an example, to avoid a disturbance of the memory cell (2) of the memory cell arrangement 300 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about $\frac{1}{2}*|V_{PP}|$ to about $|V_{PP}|$.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a negative voltage value and the second (passive) lever-voltage ($V_{LE, PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V.

According to various aspects, applying second (passive) lever-voltages ($V_{LE\ PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

As an example, to avoid disturb of the memory cells (3), (4) of the memory cell arrangement 300 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 300 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 300 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 300 can be erased. It is noted that some or all of the voltages described are only examples and that deviations from the described voltages may be possible.

As further described exemplarily above, the terminals of the memory cell 302 connected to the bit-line (e.g., connected to the source/drain regions of the field-effect transistor of the memory cell 302) may be kept at $V_{SS}$ (or at least close to $V_{SS}$) eliminating the power consumption from reverse junction leakage from bulk to source and drain during inhibition.

FIG. 4D shows exemplarily a reading of a memory cell (1) of the memory cell arrangement 300, according to various aspects. In this example, it may be assumed that only memory cell (1) of the memory cell arrangement 300 is intended to be read (is selected to be read, referred to as selected memory cell). To read the memory cell (1), a read voltage $V_G$ may be applied to the active word-line connected to the ferroelectric capacitor FE of the selected memory cell (1). In this case, the voltage ($V_{FE,ACT}$) applied to the corresponding word-line (WL(1)) may be the read voltage $V_G$.

Further, to read the memory cell (1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the memory cell (1), a potential/voltage greater than $V_{SS}$ may be applied to the active bit-line connected to the field-effect transistor FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V.

The bulk and source terminals of the field-effect transistors of the memory cells may be kept at a voltage at or close to $V_{SS}$ (e.g., a voltage of 0 V or in the range from about −0.25V to about 0.25 V).

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 302 of the memory cell arrangement 300 may be prevented during reading the selected memory cell (1).

As an example, to avoid disturb of the memory cell (2) of the memory cell arrangement 300 during reading the memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about $V_{SS}$ (e.g., 0 V) to about ½*|$V_G$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a positive voltage value and the second (passive) lever-voltage ($V_{LE\ PAS}$) may have a negative voltage value, or vice versa. According to an example, the first lever voltage $V_{LE,ACT}$ may have a voltage value of +0.6 V and the second lever voltage $V_{LE,PAS}$ may have a voltage value of −0.1 V.

According to various aspects, applying second (passive) lever-voltages ($V_{LE\ PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, to avoid disturb of the memory cells (3), (4) of the memory cell arrangement 300 during reading the memory cell (1), a voltage different from $V_G$ may be applied to the passive word-line connected to the ferroelectric capacitor FE of the non-selected memory cells (3), (4). A voltage different from $V_G$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 300 (in the following also referred to as inhibit voltage) may be bipolar. For example, the read voltage ($V_G$) may have a positive voltage value and the inhibit voltage ($V_{FE,PAS}$) may have a negative voltage value, or vice versa.

Further, to avoid disturb of the memory cells (3), (4) of the memory cell arrangement 300 during reading the memory cell (1), a base voltage (e.g., $V_{SS}$) or a voltage close to the base voltage may be applied to the passive bit-line connected to the field-effect transistor FT of the non-selected memory cells (3), (4). A voltage that equals the base voltage or that is close to the base voltage may be applied to all passive bit-lines connected to the field-effect transistors of the non-selected memory cells of the memory cell arrangement 300 that do not share the same bit-line (BL(1)) as the selected memory cell (1). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 300 can be read. It is noted that some or all of the voltages described are only examples and that deviations from the described voltages may be possible.

According to various aspects, the bulk and source terminals of the transistors of the memory cells 302 (that includes semiconductor material) may be kept at $V_{SS}$ but the active bit-line potential may be charged to a potential greater than $V_{SS}$ to detect a charge created by the ferroelectric capacitor FE.

According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NOR architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired. According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

Figure 4E:
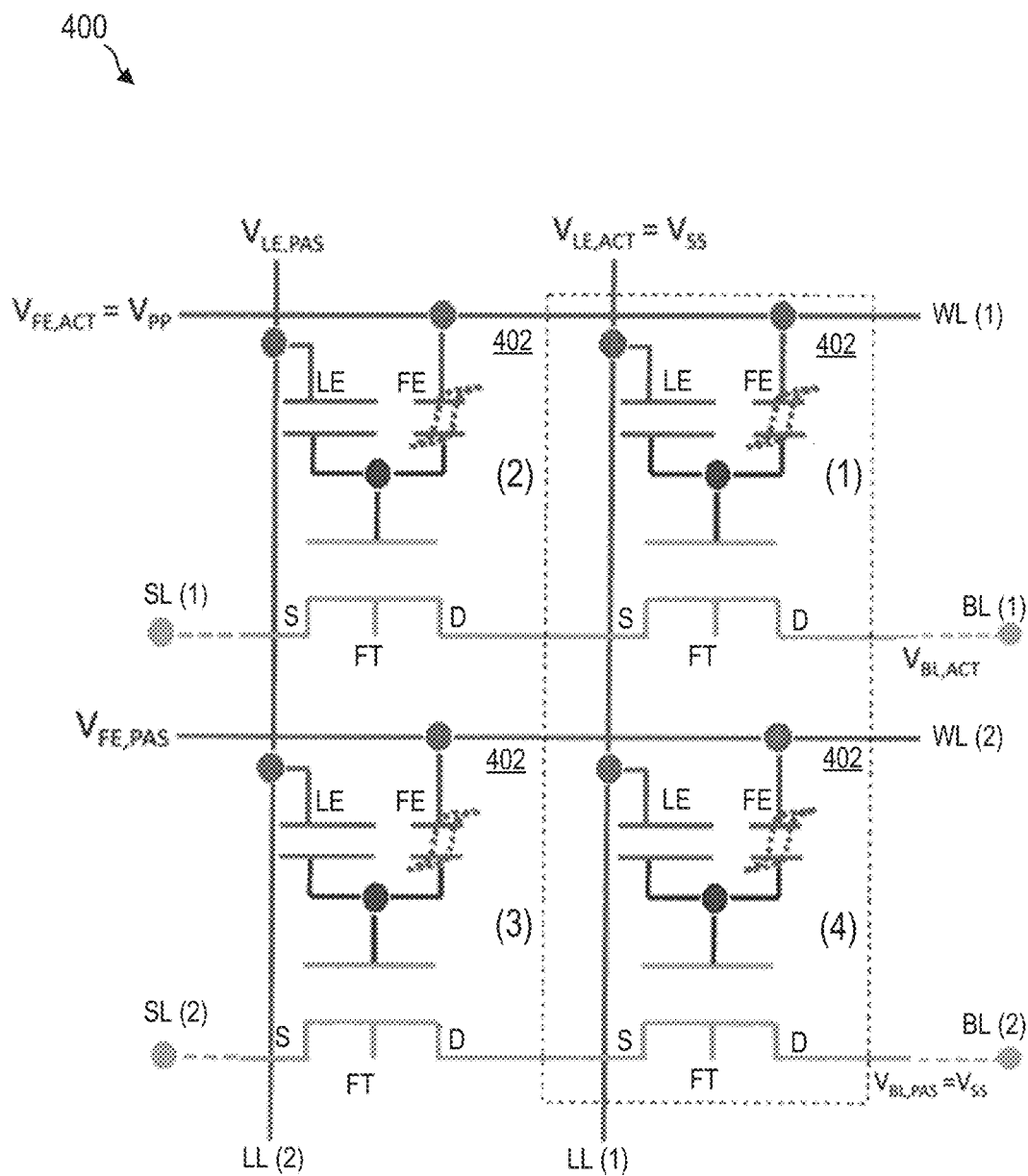
Figure 4F:
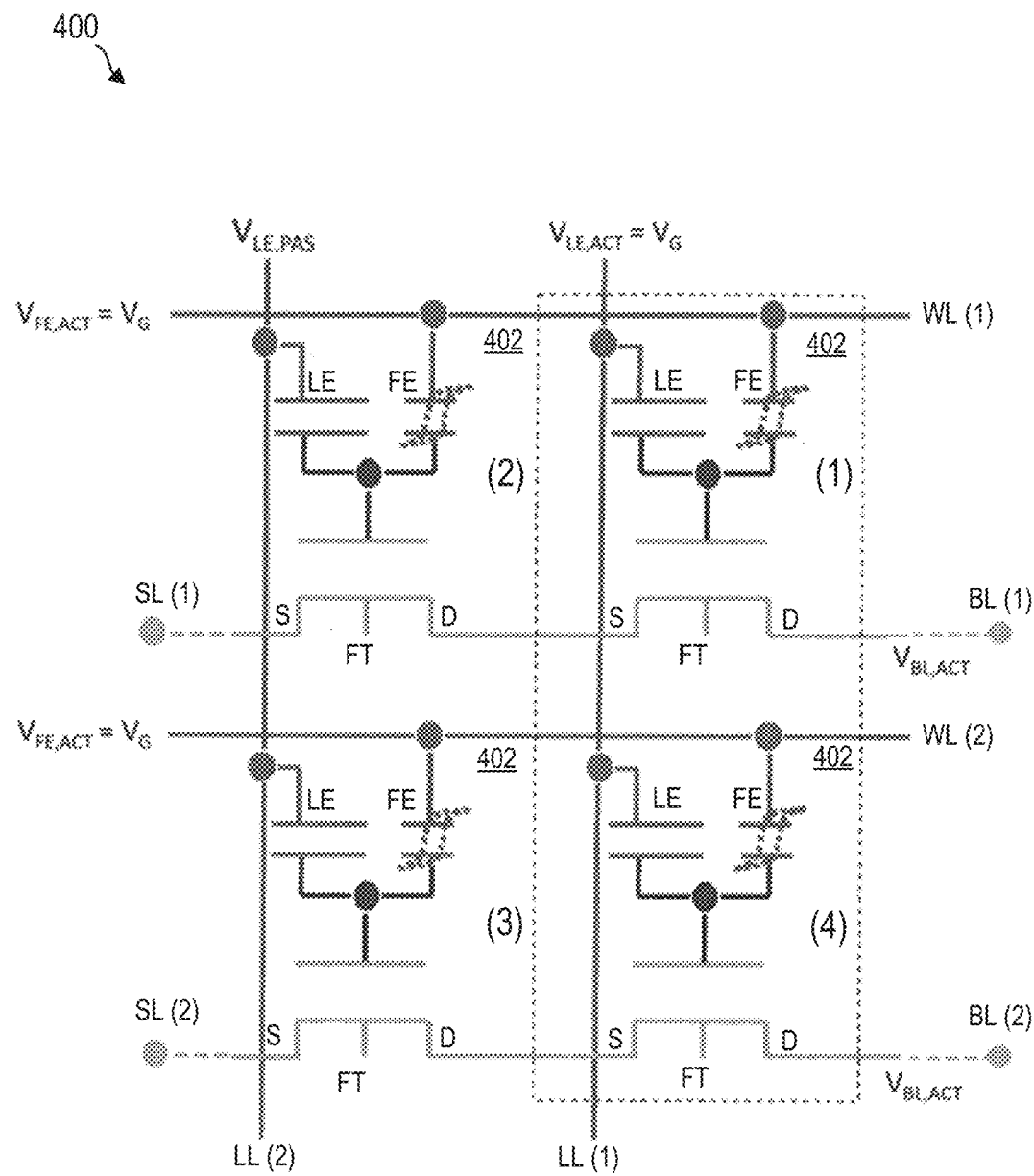
Figure 4G:
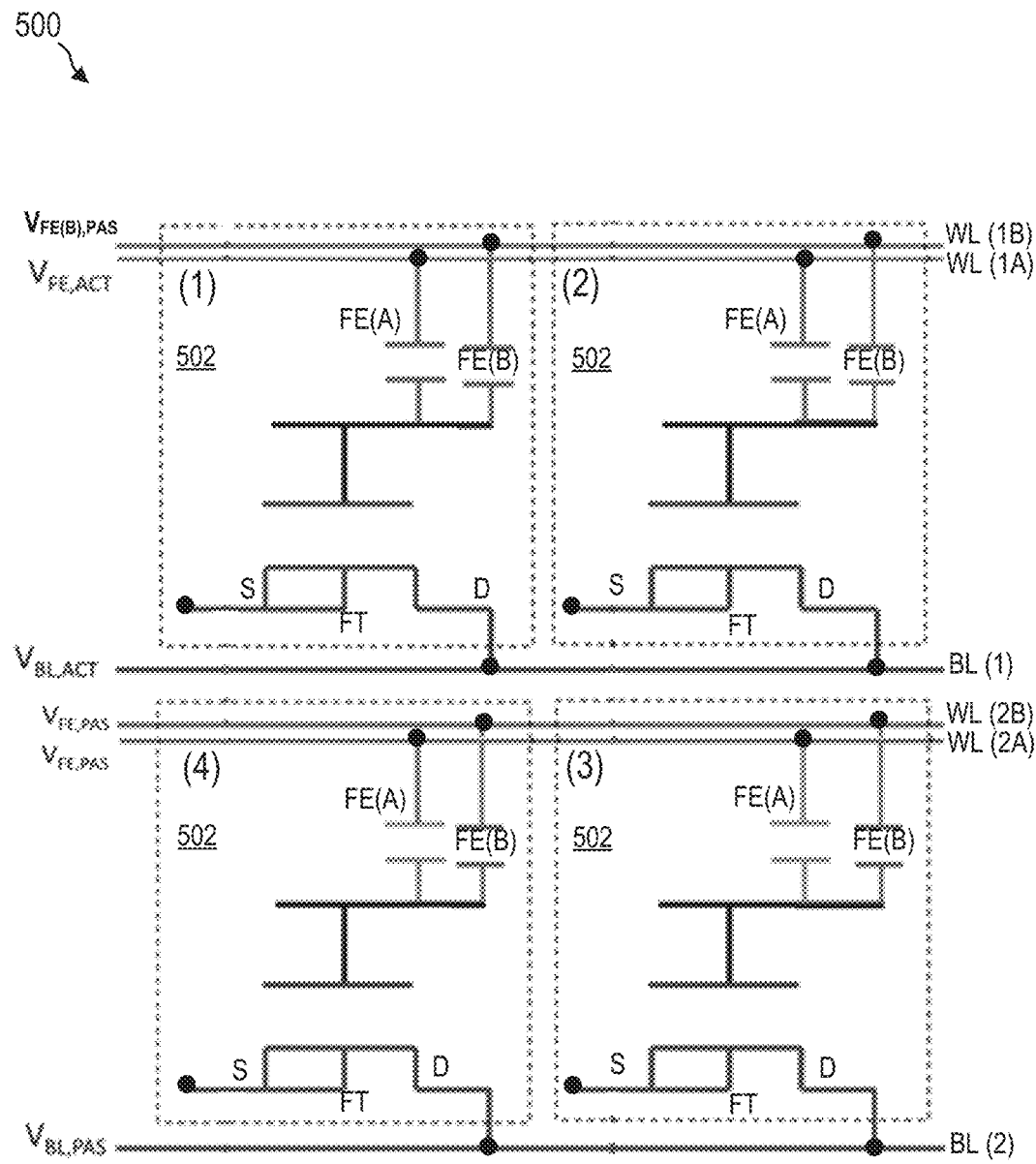
Figure 4H:
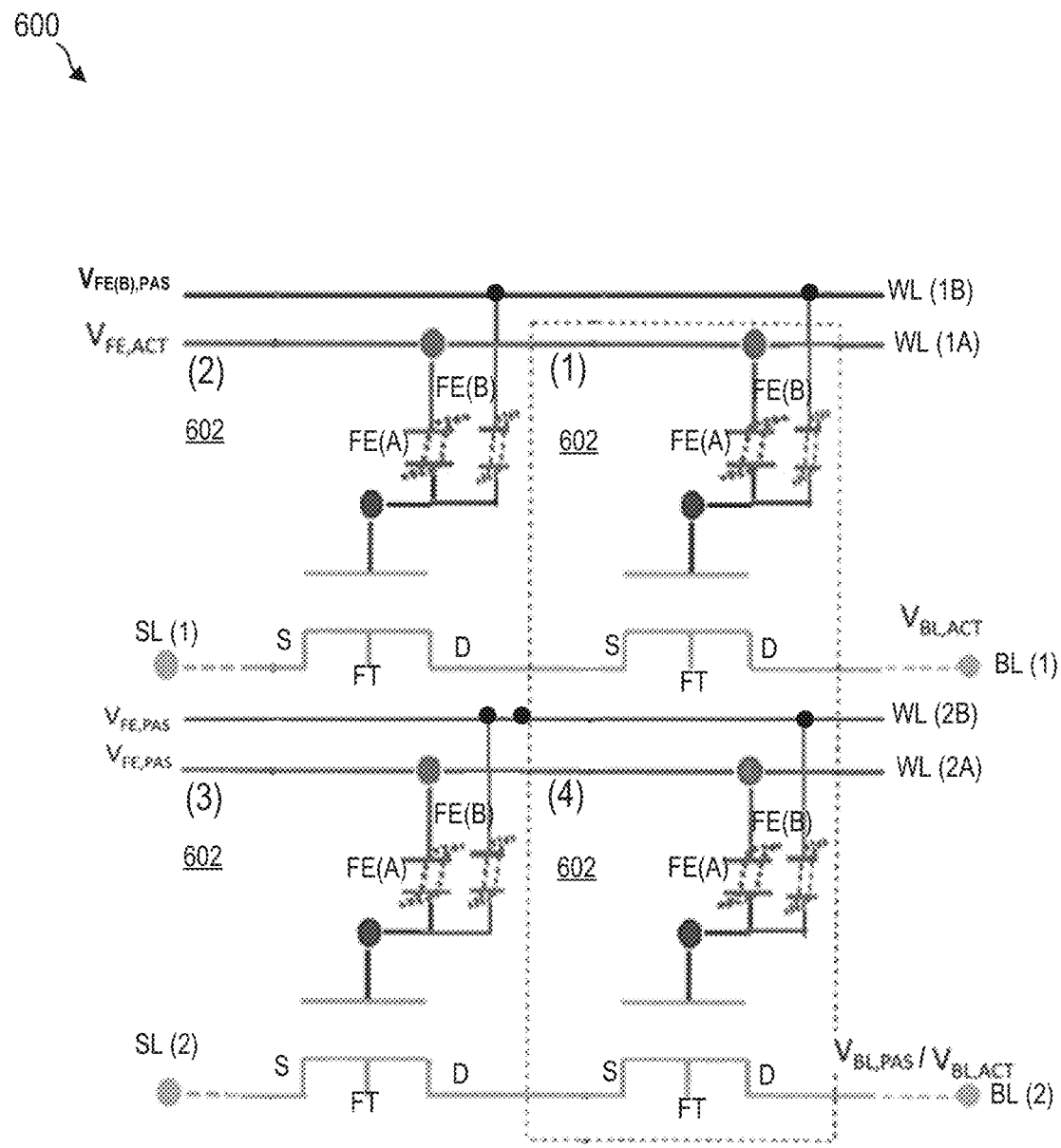
Figure 4I:
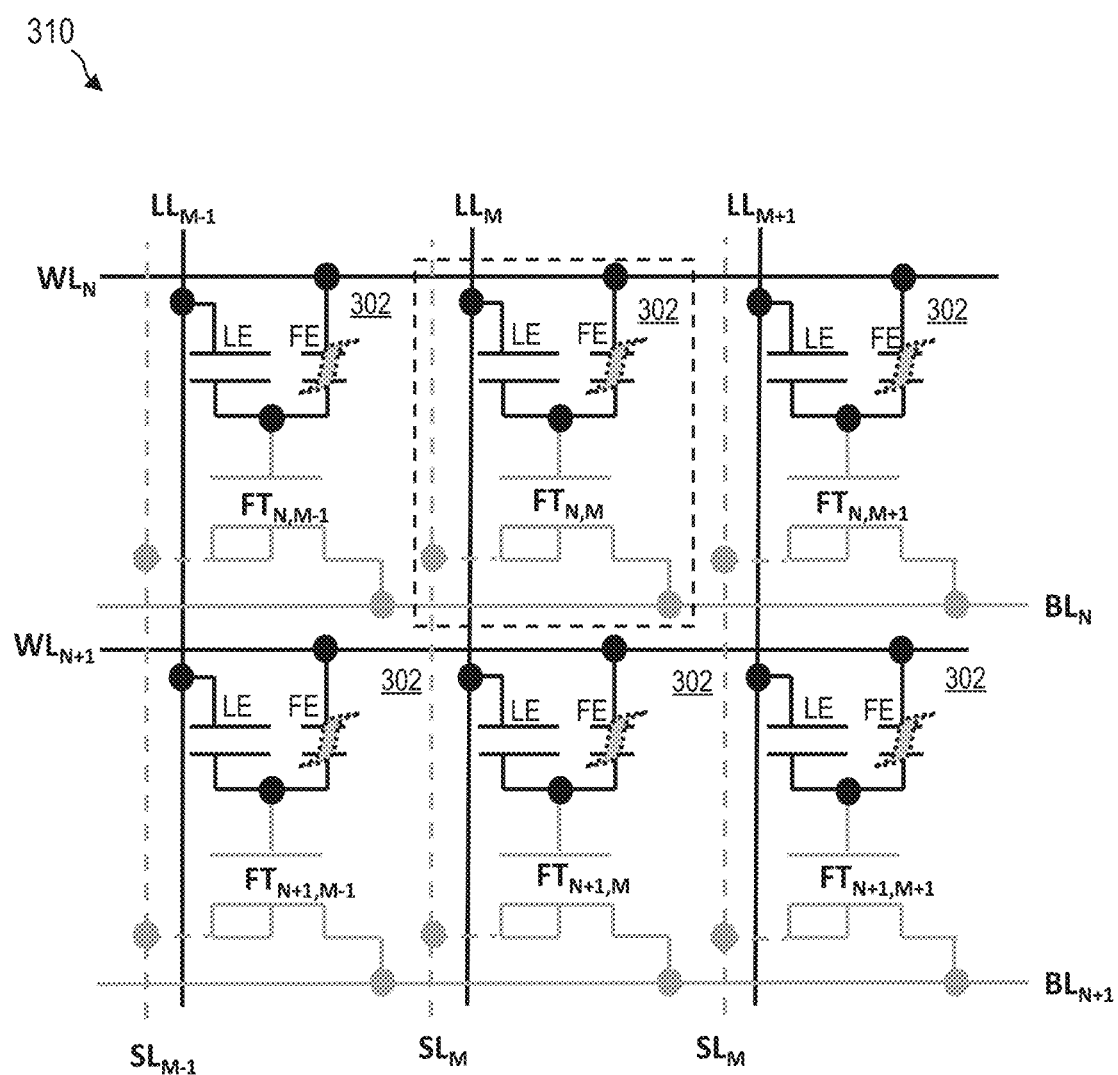
FIGS. 4I to 4L each schematically shows an exemplary memory cell arrangement according to various aspects.

An exemplary configuration of a memory cell arrangement 310 including six memory cells 302 having a NOR configuration is shown in FIG. 4I. A memory cell 302 of the memory cell arrangement 310 may be written as described with reference to FIG. 4C. A memory cell 302 of the memory cell arrangement 310 may be read as described with reference to FIG. 4D. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

According to various aspects, the 1T2C memory cells of a memory cell arrangement (e.g., of memory cell arrangement 200 described herein with reference to FIG. 4A) may be organized as an array based on a NAND architecture (e.g., the memory cells of the plurality of memory cells may be in a NAND configuration), as illustrated in FIG. 4E and FIG. 4F.

In the NAND configuration, the field-effect-transistor structures associated with memory cells that share a corresponding word-line (e.g., WL(1), e.g., WL(2)) may be in a serial connection. For example, the first and second regions of the field-effect-transistor structures may be in a serial connection. For example, two respective neighboring memory cells are first region to second region connected. For example, two respective neighboring memory cells may have a shared first/second region including a first region of one field-effect transistor structure and the second region of another field-effect transistor structure. Illustratively, the first and second regions of the field-effect-transistor structures which are in a serial connection may form the bit-line. The memory cell arrangement may include one or more third control nodes. Each of the one or more third control nodes may be connected to the first region of each field-effect transistor structure of the field-effect-transistor structures which are in a serial connection. The memory cell arrangement may include one or more fourth control nodes. Each of the one or more fourth control nodes may be connected to the second region of each field-effect transistor structure of the field-effect-transistor structures which are in a serial connection.

FIG. 4E shows exemplarily a writing of a memory cell (1) of a memory cell arrangement 400, according to various aspects. The memory cell arrangement 400 may be configured in the same way or in a similar way as described herein with reference to the memory cell arrangement 200, see FIG. 4A. Each memory cell 402 of the memory cell arrangement 400 may include a lever capacitor LE, a ferroelectric capacitor FE, and a field-effect transistor FT. The lever capacitor LE of the respective memory cell 402 may be connected to a corresponding lever-line LL(1), LL(2) and to the floating gate of the field-effect transistor FT of the respective memory cell 402. The ferroelectric capacitor FE of the respective memory cell 402 may be connected to a corresponding word-line WL(1), WL(2) and to the floating gate of the field-effect transistor FT of the respective memory cell 402. The field-effect-transistor structures associated with memory cells that share a corresponding word-line WL(1), WL(2)) may be in a serial connection. Illustratively, the serial connection of the memory cells may form a corresponding control-line. For example, a voltage applied to a control-line may be applied to a common drain D connection of the memory cells corresponding to the control-line. For example, a voltage applied to a control-line may be applied to a common source S connection of the memory cells corresponding to the control-line. According to various aspects, a bit-line voltage may be applied to a common drain D connection (e.g., a third terminal BL(1), BL(2) of the memory cell arrangement 400) of the memory cells corresponding to the control-line and a source-line voltage may be applied to a common source S connection (e.g., a fourth terminal SL(1), SL(2) of the memory cell arrangement 400) of the memory cells corresponding to the control-line. According to various aspects, each third terminal may be connected to a corresponding bitline (e.g., BL(1), BL(2)). According to various aspects, each fourth terminal may be connected to a corresponding sourceline (e.g., SL(1), SL(2)).

In this example, it may be assumed that only memory cell (1) of the memory cell arrangement 400 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V). For example, the voltage ($V_{BL,ACT}$) applied to the corresponding bit-line (BL(1)) may be applied to the third terminal. Further, to program or erase the memory cell (1), a base voltage (e.g., $V_{SS}$) or a voltage close to the base voltage may be applied to the active source-line connected to the field-effect transistor FT of the selected memory cell (1). In this case, the voltage applied to the corresponding source-line (SL(1)) may be, for example, a base voltage (e.g., 0 V) or a voltage close to a base voltage (e.g., a voltage in the range from about −0.25V to about 0.25 V). For example, the voltage applied to the corresponding source-line (SL(1)) may be applied to the fourth terminal.

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 402 of the memory cell arrangement 400 may be prevented during writing the selected memory cell (1).

As an example, to avoid a disturbance of the memory cell (2) of the memory cell arrangement 400 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 400 that share the same word-line (WL(1)) as the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 400 (in the following also referred to as second lever voltage) may be bipolar. For example, the first (active) lever voltage ($V_{LE,ACT}$) may have a negative voltage value and the second (passive) lever-voltage ($V_{LE, PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V. According to various aspects, the second lever voltage $V_{LE,PAS}$ may be selected such that the field-effect-transistor structures of the non-selected memory cells of the memory cell arrangement 400 are in an inversion state.

According to various aspects, applying second (passive) lever-voltages ($V_{LE\ PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

According to various aspects, in a NAND-configuration of the plurality of memory cells each field-effect transistor structure of the plurality of memory cells may be configured such (e.g., via implantation of a channel of the respective field-effect transistor structure) the LVT-state of the respective memory cell corresponds to an always-open state of the field-effect transistor structure.

As an example, to avoid disturb of the memory cells (3), (4) of the memory cell arrangement 400 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 400 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about $½*|V_{PP}|$.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 400 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 400 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V). For example, the voltage ($V_{BL,ACT}$) applied to the corresponding bit-line (BL(2)) may be applied to the third terminal corresponding to the bit-line (BL(2)).

Further, to avoid disturb of the memory cells (3), (4) of the memory cell arrangement 400 during writing the memory cell (1), a base voltage (e.g., $V_{SS}$) or a voltage close to the base voltage may be applied to the passive source-line connected to the field-effect transistor FT of the non-selected memory cells (3), (4). In this case, the voltage applied to the corresponding source-line (SL(2)) may be, for example, 0 V or a voltage close to 0 V (e.g., a voltage in the range from about −0.25V to about 0.25 V). For example, the voltage applied to the corresponding source-line (SL(2)) may be applied to the fourth terminal corresponding to the source-line (SL(2)).

As described exemplarily above, individual cells of the memory cell arrangement 400 can be erased. It is noted that some or all of the voltages described are only examples and that deviations from the described voltages may be possible.

As further described exemplarily above, the terminals of the memory cell 402 connected to the bit-line (e.g., connected to the source/drain regions of the field-effect transistor of the memory cell 402) may be kept at $V_{SS}$ (or at least close to $V_{SS}$) eliminating the power consumption from reverse junction leakage from bulk to source and drain during inhibition.

According to various aspects, a memory cell of the memory cell arrangement 400 may be read. To increase a reading speed, more than one memory cell of the memory cell arrangement 400 may be read substantially simultaneously. In the following example, reading two memory cells (1), (4) of the memory cell arrangement 400 is described. It is noted that reading a single memory cell of the memory cell arrangement 400 may be performed in a similar way.

FIG. 4F shows exemplarily a reading of memory cells (1), (4) of the memory cell arrangement 400, according to various aspects. In this example, it may be assumed that two corresponding memory cells (1) and (4) of the NAND-configured memory cell arrangement 400 are intended to be read (are selected to be read, referred to as selected memory cells). To read the memory cells (1), (4), a read voltage $V_G$ may be applied to the active word-lines connected to the ferroelectric capacitors FE of the selected memory cells (1), (4). In this case, the voltage ($V_{FE,ACT}$) applied to the corresponding word-lines (WL(1), WL(2)) may be the read voltage $V_G$.

Further, to read the memory cells (1), (4), a voltage ($V_{LE,ACT}$) may be applied to the active lever-line connected to the lever capacitor LE of the selected memory cells (1), (4). In this case, the voltage ($V_{LE,ACT}$) applied to the corresponding lever-line (LL(1)) may be substantially equal to the read voltage $V_G$.

Further, to read the memory cells (1), (4), a potential/voltage greater than $V_{SS}$ may be applied to the active bit-lines connected to the field-effect transistors FT of the selected memory cells (1), (4). In this case, the voltage ($V_{BL,ACT}$) applied to the corresponding bit-lines (BL(1), BL(2)) may be, for example, greater than 0 V. In an example, the voltage ($V_{BL,ACT}$) applied to the corresponding bit-lines (BL(1), BL(2)) may be 1 V. For example, the voltage ($V_{BL,ACT}$) applied to the corresponding bit-lines (BL(1), BL(2)) may be applied to the third terminals corresponding to the respective bit-line (BL(1), BL(2)).

Further, to read the memory cells (1), (4), a potential/voltage greater than $V_{SS}$ may be applied to the active source-lines connected to the field-effect transistors FT of the selected memory cells (1), (4). In this case, the voltage applied to the corresponding source-lines (SL(1), SL(2)) may be, for example, substantially equal to 0 V. In an example, the voltage applied to the corresponding source-lines (SL(1), SL(2)) may be 0 V. For example, the voltage applied to the corresponding source-lines (SL(1), SL(2)) may be applied to the fourth terminals corresponding to the respective source-line (SL(1), SL(2)). Reading the selected memory cells (1), (4) may include providing the voltages to the third terminals and the fourth terminals such that each field-effect transistor structure associated with the other memory cells of the respective first subsets of memory cells, the selected memory cells are included in, are in a conducting state. For example, the voltages may be applied to the third terminals and the fourth terminals such that each field-effect transistor structure that is in a serial connection with the selected memory cells (1), (4) is in a conducting state. The bulk and source terminals of the field-effect transistors of the memory cells may be kept at a voltage at or close to $V_{SS}$ (e.g., a voltage of 0 V or in the range from about −0.25V to about 0.25 V.

According to an example, the read voltage $V_G$ may have a voltage value of 0.7 V and the voltage ($V_{LE,ACT}$) applied to the corresponding lever-line may have a voltage value of 0.5 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 402 of the memory cell arrangement 400 may be prevented during reading the selected memory cells (1), (4).

As an example, to avoid disturb of the memory cell (2) of the memory cell arrangement 400 during reading the memory cells (1), (4), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 400 that share the same word-lines (WL(1), WL(2)) as the selected memory cells (1), (4). According to various aspects, the voltage ($V_{LE,PAS}$) applied to the corresponding lever-line (LL(2)) may be, for example, in the range from about $V_{SS}$ (e.g., 0 V) to about $\frac{1}{2}*|V_G|$. According to an example, the first lever voltage $V_{LE,ACT}$ may be +0.5 V and the second lever voltage $V_{LE,PAS}$ may be 1.0 V.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 400 (in the following also referred to as second lever voltage) may be bipolar. For example, the first (active) lever voltage ($V_{LE,ACT}$) may have a positive voltage value and the second (passive) lever-voltage ($V_{LE,PAS}$) may have a negative voltage value, or vice versa. According to various aspects, applying second (passive) lever-voltages ($V_{LE,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, the memory cell arrangement 400 may include additional memory cells and to avoid disturb of one or more of the additional memory cells of the memory cell arrangement 400 during reading the memory cells (1), (4), a voltage different from $V_G$ may be applied to the passive word-line connected to the ferroelectric capacitor FE of the non-selected memory cells. A voltage different from $V_G$ may be applied to all passive word-lines connected to the ferroelectric capacitors FE of the non-selected memory cells of the memory cell arrangement 400 that do not share the same word-lines (WL(1), WL(2)) as the selected memory cells (1), (4). According to various aspects, the voltage ($V_{FE,PAS}$) applied to the corresponding word-lines of the non-selected memory cells may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 400 (in the following also referred to as inhibit voltage) may be bipolar. For example, the read voltage ($V_G$) may have a positive voltage value and the inhibit voltage ($V_{FE,PAS}$) may have a negative voltage value, or vice versa.

Further, to avoid disturb of the one or more of the additional memory cells of the memory cell arrangement 400 during reading the memory cells (1), (4), a base voltage (e.g., $V_{SS}$) or a voltage close to the base voltage may be applied to the passive bit-line connected to the field-effect transistor FT of the non-selected memory cells. A voltage that equals the base voltage or that is close to the base voltage may be applied to all passive bit-lines and source-lines connected to the field-effect transistors of the non-selected memory cells of the memory cell arrangement 400 that do not share the same word-lines (WL(1), WL(2)) as the selected memory cells (1), (4). In this case, the voltage ($V_{BL,PAS}$) applied to the corresponding bit-lines and/or source-lines of the non-selected memory cells may be, for example, 0 V or a voltage close to 0 V (e.g., a voltage in the range from about −0.25V to about 0.25 V).

As described exemplarily above, individual NAND cell pairs of the memory cell arrangement 400 can be read. It is noted that some or all of the voltages described are only examples and that deviations from the described voltages may be possible. According to various aspects, the bulk and source terminals of the transistors of the memory cells 402 (that includes semiconductor material) may be kept at $V_{SS}$ but the active bit-line potential may be charged to a potential greater than $V_{SS}$ to detect a charge created by the ferroelectric capacitor FE. According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NAND architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired. According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

Figure 4J:
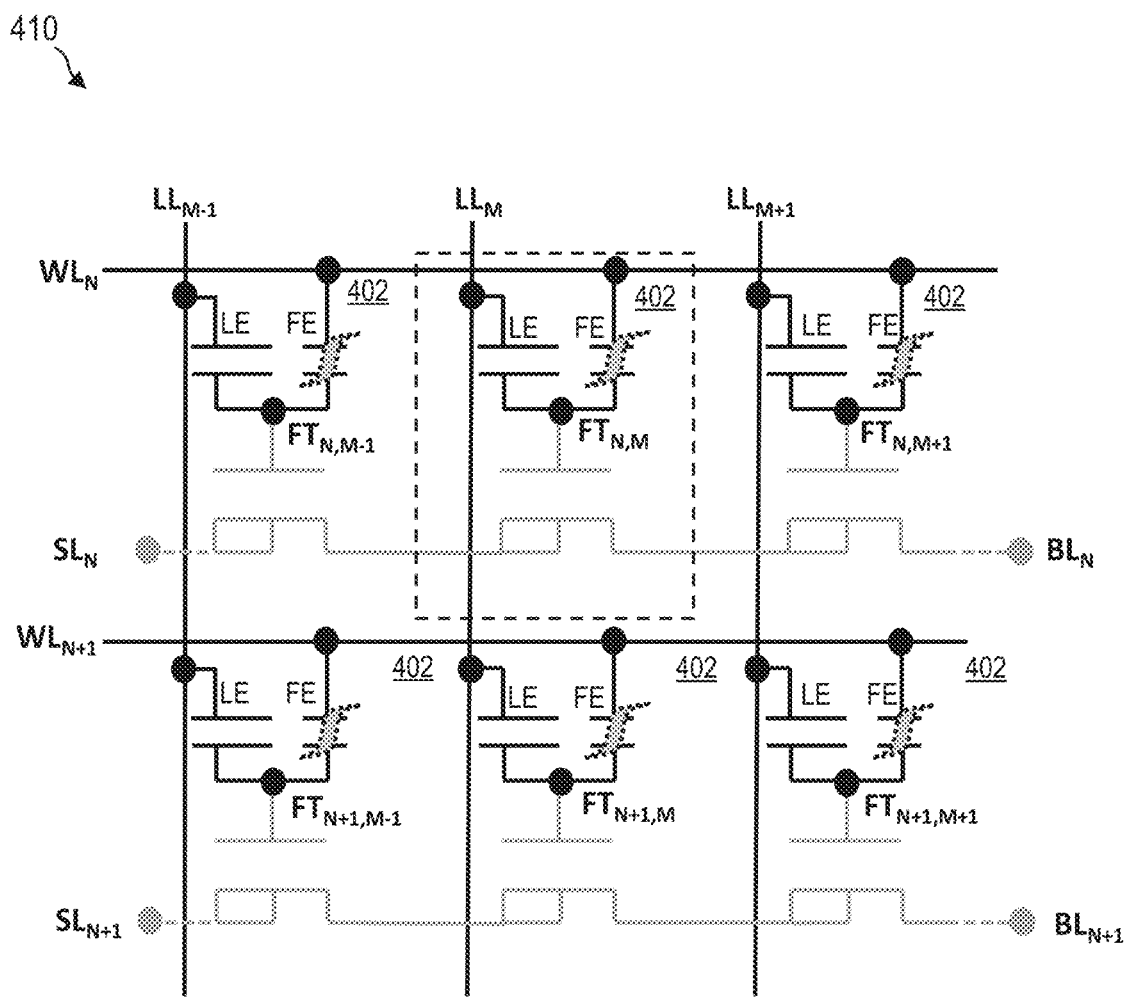

An exemplary configuration of a memory cell arrangement 410 including six memory cells 402 having a NAND configuration is shown in FIG. 4J. A memory cell 402 of the memory cell arrangement 410 may be written as described with reference to FIG. 4E. A memory cell 402 of the memory cell arrangement 410 may be read as described with reference to FIG. 4F. In an example, to read a selected memory cell, a read voltage with a voltage value of about 1.7 V may be applied to the wordline (WL) corresponding to the selected memory cell and a first (active) lever voltage with a voltage value of about 1.3 V may be applied to the leverline (LL) corresponding to the selected memory cell. For example, a second (passive) lever voltage with a voltage value of about 2.0 V may be applied to the passive leverlines corresponding to the non-selected memory cells.

According to various aspects, both capacitors of a 1T2C memory cell may be memory capacitors (in some aspects also referred to as memory capacitor structure). Both memory capacitor structures may include a spontaneously-polarizable material as a dielectric material. In the following, the memory capacitor structures are described exemplarily as being ferroelectric capacitors (e.g., including a ferroelectric material as spontaneously-polarizable material). Both ferroelectric capacitors may be configured to store a charge representing the actual information (e.g., representing a logic "0" or a logic "1") of the memory cell. Thus, each memory cell may be configured to store two bits. In the following, a memory cell configured to store more than one bit may also be referred to as multi-bit memory cell.

According to various aspects, the multi-bit memory cells may be organized as an array based on a NOR architecture, as illustrated in FIG. 4G, or organized as an array based on a NAND architecture, as illustrated in FIG. 4H.

FIG. 4G schematically shows a memory cell arrangement 500 having a NOR architecture and including multi-bit memory cells 502, according to various aspects. Each memory cell 502 of the memory cell arrangement 500 may include a first ferroelectric capacitor FE(A), a second ferroelectric capacitor FE(B), and a field-effect transistor FT. The first ferroelectric capacitor FE(A) of the respective memory cell 502 may be connected to a corresponding word-line WL(1A), WL(2A) and to the floating gate of the field-effect transistor FT of the respective memory cell 502. The second ferroelectric capacitor FE(B) of the respective memory cell 502 may be connected to a corresponding word-line WL(1B), WL(2B) and to the floating gate of the field-effect transistor FT of the respective memory cell 502. The field-effect transistor FT may be connected with its source S to a common source potential and with its drain D to a corresponding bit-line BL(1), BL(2).

According to various aspects, a ferroelectric capacitor (e.g., the first ferroelectric capacitor FE(A), e.g., the second ferroelectric capacitor FE(B)) may be written. In this example, it may be assumed that only one ferroelectric capacitor (e.g., the first ferroelectric capacitor FE(A) or the second ferroelectric capacitor FE(B)) of one memory cell (1) of the memory cell arrangement 500 is intended to be written (is selected to be written, e.g., referred to as selected ferroelectric capacitor of the selected memory cell, in some aspects also referred to as selected ferroelectric capacitor). To program or erase the first ferroelectric capacitor FE(A) of the memory cell (1), a write voltage $V_{PP}$ may be applied to the active word-line connected to the selected ferroelectric capacitor FE(A) of the selected memory cell (1). In this case, the voltage ($V_{FE,ACT}$) applied at the corresponding word-line (WL(1A)) may be the write voltage $V_{PP}$ (also referred to as programming voltage $V_{PP}$). To program or erase the selected ferroelectric capacitor FE(A), a base voltage (e.g., $V_{SS}$) or a voltage close to the base voltage may be applied to the active bit-line connected to the field-effect transistor FT of the memory cell (1) corresponding to the selected ferroelectric capacitor FE(A). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V).

According to various aspects, the field-effect transistor structure may be in a non-conducting state during writing the selected ferroelectric capacitor FE(A) of the selected memory cell. Illustratively, the field-effect transistor structure may be closed during writing the selected ferroelectric capacitor FE(A) of the selected memory cell. This may, for example, increase the speed of writing the selected ferroelectric capacitor FE(A) of the selected memory cell (e.g., with a write time of less than 15 ns, e.g., with a write time of less than 10 ns). According to various aspects, the write voltage $V_{PP}$ may be, for example, in the range from about 1 V to about 10 V, e.g. from about 1.5 V to about 6 V.

According to various aspects, a disturbance of the other ferroelectric capacitors FE(B) of the selected memory cell (1) may be prevented during writing the selected ferroelectric capacitor FE(A) of the selected memory cell (1). As an example, to avoid disturb of the second ferroelectric capacitor FE(B) during writing the selected first ferroelectric capacitor FE(A) of the selected memory cell (1), a voltage different from $V_{PP}$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about $\frac{1}{2} * |V_{PP}|$.

According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cell (1) of the memory cell arrangement 500 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, a disturbance of the other memory cells 502 of the memory cell arrangement 500 may be prevented during writing the selected ferroelectric capacitor FE(A) of the selected memory cell (1).

As an example, to avoid disturb of the memory cells (3), (4) of the memory cell arrangement 500 during writing the selected ferroelectric capacitor FE(A) of the selected memory cell (1) (in the following also referred to as selected ferroelectric capacitor FE(A,1)), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 500 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about 0 V (or $V_{SS}$) to about $\frac{1}{2} * |V_{PP}|$.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 500 (in the following also referred to as second inhibit voltage) may be bipolar. For example, the write voltage ($V_{PP}$) may have a positive voltage value and the second inhibit voltage ($V_{FE,PAS}$) may have a negative voltage value, or vice versa. According to an example, the write voltage $V_{PP}$ may have a voltage value of +1.0 V and the second inhibit voltage $V_{FE,PAS}$ may have a voltage value of −0.2 V.

Further, to avoid disturb of the memory cells (3), (4) of the memory cell arrangement 500 during writing the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 500 can be erased. It is noted that some or all of the voltages described are only examples and that deviations from the described voltages may be possible.

As further described exemplarily above, the terminals of the memory cell 502 connected to the bit-line (e.g., connected to the source/drain regions of the field-effect transistor of the memory cell 502) may be kept at $V_{SS}$ (or at least close to $V_{SS}$) eliminating the power consumption from reverse junction leakage from bulk to source and drain during inhibition.

According to various aspects, a ferroelectric capacitor (e.g., the first ferroelectric capacitor FE(A), e.g., the second ferroelectric capacitor FE(B)) may be read out. In this example, it may be assumed that only one ferroelectric capacitor (e.g., the first ferroelectric capacitor FE(A) or the second ferroelectric capacitor FE(B)) of a selected memory cell (1) of the memory cell arrangement 500 is intended to be read (is selected to be read, referred to as selected ferroelectric capacitor of the selected memory cell, in some aspects also referred to as selected ferroelectric capacitor). To read the selected ferroelectric capacitor FE(A) of the memory cell (1), a read voltage $V_G$ may be applied to the active word-line connected to the selected ferroelectric capacitor FE(A) of the selected memory cell (1) (in the following also referred to as selected ferroelectric capacitor FE(A,1)). In this case, the voltage ($V_{FE,ACT}$) applied to the corresponding word-line (WL(1A)) may be the read voltage $V_G$.

Further, to read the selected ferroelectric capacitor FE(A,1), a potential/voltage greater than $V_{SS}$ may be applied to the active bit-line connected to the field-effect transistor FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V.

The bulk and source terminals of the field-effect transistors of the memory cells may be kept at a voltage at or close to $V_{SS}$ (e.g., a voltage of 0 V or in the range from about −0.25V to about 0.25 V.

According to various aspects, a disturbance of the other ferroelectric capacitors FE(B) of the selected memory cell (1) may be prevented during reading the selected ferroelectric capacitor FE(A) of the selected memory cell (1). As an example, to avoid disturb of the second ferroelectric capacitor FE(B) during reading the selected first ferroelectric capacitor FE(A) of the selected memory cell (1), a voltage different from $V_G$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about $\frac{1}{2}*|V_{PP}|$.

According to various aspects, a voltage value of the read voltage ($V_G$) and a voltage value of the voltage ($V_{FE(B),PAS}$) applied to all passive word-lines connected to the non-selected ferroelectric capacitors FE of the selected memory cell (1) of the memory cell arrangement 500 (in the following also referred to as first inhibit voltage) may be bipolar. For example, the read voltage ($V_G$) may have a positive voltage value and the first inhibit voltage ($V_{FE(B),PAS}$) may have a negative voltage value, or vice versa.

According to various aspects, disturb of the other memory cells 502 of the memory cell arrangement 500 may be prevented during reading the selected ferroelectric capacitor FE(A) of the selected memory cell (1).

As an example, to avoid disturb of the memory cells (3), (4) of the memory cell arrangement 500 during reading the selected ferroelectric capacitor FE(A,1), a voltage different from $V_G$ may be applied to the passive word-line connected to the ferroelectric capacitor FE of the non-selected memory cells (3), (4). A voltage different from $V_G$ may be applied to all passive word-lines connected to the ferroelectric capacitors FE of the non-selected memory cells of the memory cell arrangement 500 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 500 (in the following also referred to as second inhibit voltage) may be bipolar. For example, the read voltage ($V_G$) may have a positive voltage value and the second inhibit voltage ($V_{FE,PAS}$) may have a negative voltage value, or vice versa.

Further, to avoid disturb of the memory cells (3), (4) of the memory cell arrangement 500 during reading the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). A voltage that equals the base voltage or that is close to the base voltage may be applied to all passive bit-lines connected to the field-effect transistors of the non-selected memory cells of the memory cell arrangement 500 that do not share the same bit-line (BL(1)) as the selected memory cell (1). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 500 can be read. It is noted that some or all of the voltages described are only examples and that deviations from the described voltages may be possible.

According to various aspects, the bulk and source terminals of the transistors of the memory cells 502 (that includes semiconductor material) may be kept at $V_{SS}$ but the active bit-line potential may be charged to a potential greater than $V_{SS}$ to detect a charge created by the ferroelectric capacitor FE.

According to various aspects, a NOR architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

FIG. 4H schematically shows a memory cell arrangement 600 having a NAND architecture and including multi-bit memory cells 602, according to various aspects. Each memory cell 602 of the memory cell arrangement 600 may include a first ferroelectric capacitor FE(A), a second ferroelectric capacitor FE(B), and a field-effect transistor FT. The first ferroelectric capacitor FE(A) of the respective memory cell 602 may be connected to a corresponding word-line WL(1A), WL(2A) and to the floating gate of the field-effect transistor FT of the respective memory cell 602. The second ferroelectric capacitor FE(B) of the respective memory cell 602 may be connected to a corresponding word-line WL(1B), WL(2B) and to the floating gate of the field-effect transistor FT of the respective memory cell 602.

According to various aspects, a ferroelectric capacitor (e.g., the first ferroelectric capacitor FE(A), e.g., the second ferroelectric capacitor FE(B)) may be written. In this example, it may be assumed that only one ferroelectric capacitor (e.g., the first ferroelectric capacitor FE(A) or the second ferroelectric capacitor FE(B)) of one memory cell (1) of the memory cell arrangement 600 is intended to be written (is selected to be written, e.g., referred to as selected ferroelectric capacitor of the selected memory cell, in some aspects also referred to as selected ferroelectric capacitor). To program or erase the first ferroelectric capacitor FE(A) of the memory cell (1), a write voltage $V_{PP}$ may be applied to the active word-line connected to the selected ferroelectric capacitor FE(A) of the selected memory cell (1). In this case, the voltage ($V_{FE,ACT}$) applied at the corresponding word-line (WL(1A)) may be the write voltage $V_{PP}$ (also referred to as programming voltage $V_{PP}$). To program or erase the selected ferroelectric capacitor FE(A), a base voltage (e.g., $V_{SS}$) or a voltage close to the base voltage may be applied to the active bit-line connected to the field-effect transistor FT of the memory cell (1) corresponding to the selected ferroelectric capacitor FE(A). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V). For example, the voltage ($V_{BL,ACT}$) applied to the corresponding bit-line (BL(1)) may be applied to the third terminal corresponding to the bit-line (BL(1)). To program or erase the selected ferroelectric capacitor FE(A), a base voltage (e.g., $V_{SS}$) or a voltage close to the base voltage may be applied to the active source-line connected to the field-effect transistor FT of the memory cell (1) corresponding to the selected ferroelectric capacitor FE(A). In this case, the voltage applied to the corresponding source-line (SL(1)) may be, for example, a base voltage (e.g., 0 V) or a voltage close to a base voltage (e.g., a voltage in the range from about −0.25V to about 0.25 V). For example, the voltage applied to the corresponding source-line (SL(1)) may be applied to the fourth terminal corresponding to the source-line (SL(1)).

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a disturbance of the other ferroelectric capacitors FE(B) of the selected memory cell (1) may be prevented during writing the selected ferroelectric capacitor FE(A) of the selected memory cell (1). As an example, to avoid disturb of the second ferroelectric capacitor FE(B) during writing the selected first ferroelectric capacitor FE(A) of the selected memory cell (1), a voltage different from $V_{PP}$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cell (1) of the memory cell arrangement 600 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, a disturbance of the other memory cells 602 of the memory cell arrangement 600 may be prevented during writing the selected memory cell (1).

As an example, to avoid disturb of the memory cells (3), (4) of the memory cell arrangement 600 during writing the selected ferroelectric capacitor FE(A) of the selected memory cell (1) (in the following also referred to as selected ferroelectric capacitor FE(A,1)), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 600 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 600 (in the following also referred to as second inhibit voltage) may be bipolar. For example, the write voltage ($V_{PP}$) may have a positive voltage value and the second inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 600 during writing the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). In this case, the voltage ($V_{BL}$,PAS) applied to the corresponding bit-line (BL(2)) may be, for example, 0 V or a voltage close to 0 V (e.g., a voltage in the range from about −0.25V to about 0.25 V). For example, the voltage ($V_{BL,ACT}$) applied to the corresponding bit-line (BL(1)) may be applied to the third terminal corresponding to the bit-line (BL(1)). Further, to avoid disturb of the memory cells (3), (4) of the memory cell arrangement 600 during writing the selected ferroelectric capacitor FE(A,1), a base voltage (e.g., $V_{SS}$) or a voltage close to the base voltage may be applied to the passive source-line connected to the field-effect transistor FT of the non-selected memory cells (3), (4). In this case, the voltage applied to the corresponding source-line (SL(2)) may be, for example, 0 V or a voltage close to 0 V (e.g., a voltage in the range from about −0.25V to about 0.25 V). For example, the voltage applied to the corresponding source-line (SL(1)) may be applied to the fourth terminal corresponding to the source-line (SL(1)).

As described exemplarily above, individual cells of the memory cell arrangement 600 can be erased. It is noted that some or all of the voltages described are only examples and that deviations from the described voltages may be possible.

As further described exemplarily above, the terminals of the memory cell 602 connected to the bit-line (e.g., connected to the source/drain regions of the field-effect transistor of the memory cell 602) may be kept at $V_{SS}$ (or at least close to $V_{SS}$) eliminating the power consumption from reverse junction leakage from bulk to source and drain during inhibition.

According to various aspects, a selected ferroelectric capacitor FE(A) of a selected memory cell (1) of the memory cell arrangement 600 may be read out.

To increase a reading speed, more than one memory cell of the memory cell arrangement 600 may be read substantially simultaneously. In the following example, reading two memory cells (1), (4) of the memory cell arrangement 600 is described. It is noted that reading a single memory cell of the memory cell arrangement 600 may be performed in a similar way.

In this example, it may be assumed that two selected ferroelectric capacitors FE(A) of corresponding memory cells (1) and (4) of the NAND-configured memory cell arrangement 600 are intended to be read (are selected to be read, referred to as selected ferroelectric capacitors of selected memory cells). To read the memory cells (1), (4), a read voltage $V_G$ may be applied to the active word-lines connected to the selected ferroelectric capacitors FE(A) of the selected memory cells (1), (4). In this case, the voltage ($V_{FE,ACT}$) applied to the corresponding word-lines (WL(1A), WL(2A)) may be the read voltage $V_G$.

Further, to read the memory cells (1), (4), a potential/voltage greater than $V_{SS}$ may be applied to the active bit-lines connected to the field-effect transistors FT of the selected memory cells (1), (4). In this case, the voltage ($V_{BL,ACT}$) applied to the corresponding bit-lines (BL(1), BL(2)) may be, for example, greater than 0 V. In an example, the voltage ($V_{BL,ACT}$) applied to the corresponding bit-lines (BL(1), BL(2)) may be 1 V. Further, to read the memory cells (1), (4), a potential/voltage may be applied to the active source-lines connected to the field-effect transistors FT of the selected memory cells (1), (4). In this case, the voltage applied to the corresponding source-lines (SL(1), SL(2)) may be, for example, equal to 0 V. Reading the selected memory cells (1), (4) may include providing the voltages to the third terminals and the fourth terminals such that each field-effect transistor structure associated with the other memory cells of the respective first subsets of memory cells, the selected memory cells are included in, are in a conducting state. For example, the voltages may be applied to the third terminals and the fourth terminals such that each field-effect transistor structure that is in a serial connection with the selected memory cells (1), (4) is in a conducting state. The bulk and source terminals of the field-effect transistors of the memory cells may be kept at a voltage at or close to $V_{SS}$ (e.g., a voltage of 0 V or in the range from about −0.25V to about 0.25 V.

According to various aspects, a disturbance of the other ferroelectric capacitors FE(B) of the selected memory cells (1), (4) may be prevented during writing the selected ferroelectric capacitors FE(A) of the selected memory cells (1), (4). As an example, to avoid disturb of the second ferroelectric capacitors FE(B) of the selected memory cells (1), (4) during writing the selected first ferroelectric capacitors FE(A) of the selected memory cells (1), (4), a voltage different from $V_{PP}$ may be applied to the passive word-line connected to the selected memory cells (1), (4). According to various aspects, the voltage ($V_{FE(B),PAS}$) applied to the corresponding word-lines (WL(1B), WL(2B)) may be, for example, in the range from about 0 V (or $V_{SS}$) to about ½*|$V_{PP}$|. According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cells (1), (4) of the memory cell arrangement 600 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, disturb of the other memory cells 602 of the memory cell arrangement 600 may be prevented during reading the selected memory cells (1), (4).

As an example, the memory cell arrangement 600 may include additional memory cells and to avoid disturb of one or more of the additional memory cells of the memory cell arrangement 600 during reading the selected ferroelectric capacitors FE(A) of the selected memory cells (1), (4) (in the following also referred to as selected ferroelectric capacitors FE(A-1,A-4), a voltage different from $V_G$ may be applied to the passive word-line connected to the ferroelectric capacitor FE of the non-selected memory cells. A voltage different from $V_G$ may be applied to all passive word-lines connected to the ferroelectric capacitors FE of the non-selected memory cells of the memory cell arrangement 600 that do not share the same word-lines (WL(1), WL(2)) as the selected memory cells (1), (4). According to various aspects, the voltage ($V_{FE,PAS}$) applied to the corresponding word-lines of the non-selected memory cells may be, for example, in the range from about $V_{SS}$ (e.g., 0 V) to about ½*|$V_G$|.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 600 (in the following also referred to as second inhibit voltage) may be bipolar. For example, the read voltage ($V_G$) may have a positive voltage value and the second inhibit voltage ($V_{FE,PAS}$) may have a negative voltage value, or vice versa.

Further, to avoid disturb of the one or more of the additional memory cells of the memory cell arrangement 600 during reading the selected ferroelectric capacitors FE(A-1,A-4), a base voltage (e.g., $V_{SS}$) or a voltage close to the base voltage may be applied to the passive bit-line connected to the field-effect transistor FT of the non-selected memory cells. A voltage that equals the base voltage or that is close to the base voltage may be applied to all passive bit-lines and/or all passive source-lines connected to the field-effect transistors of the non-selected memory cells of the memory cell arrangement 600 that do not share the same word-lines (WL(1), WL(2)) as the selected memory cells (1), (4). In this case, the voltage applied to the corresponding bit-lines and/or source-lines of the non-selected memory cells may be, for example, 0 V or a voltage close to 0 V (e.g., a voltage in the range from about −0.25V to about 0.25 V).

As described exemplarily above, individual NAND cell pairs of the memory cell arrangement 600 can be read. It is noted that some or all of the voltages described are only examples and that deviations from the described voltages may be possible.

According to various aspects, the bulk and source terminals of the transistors of the memory cells 602 (that includes semiconductor material) may be kept at $V_{SS}$ but the active bit-line potential may be charged to a potential greater than $V_{SS}$ to detect a charge created by the ferroelectric capacitor FE.

According to various aspects, a NAND architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

Figure 4K:
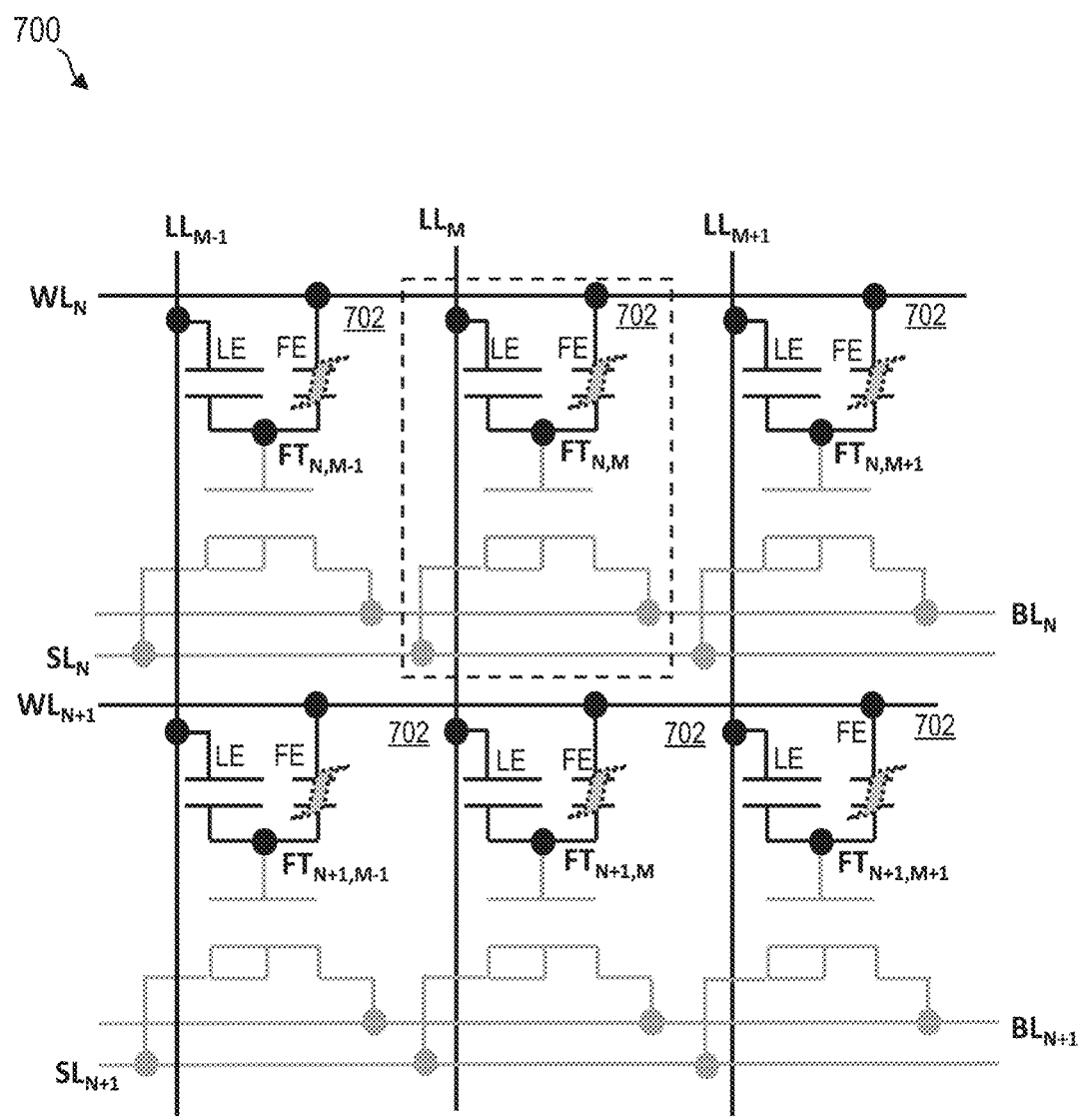

According to various aspects, a plurality of 1T2C memory cells may be organized in an AND architecture. An exemplary configuration of a memory cell arrangement 700 including six memory cells 702 having an AND configuration is shown in FIG. 4K. A memory cell 702 of the memory cell arrangement 700 may be written or read in a similar way as described with reference to NOR configurations, wherein further voltages at respective source-lines SL may be applied. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

Figure 4L:
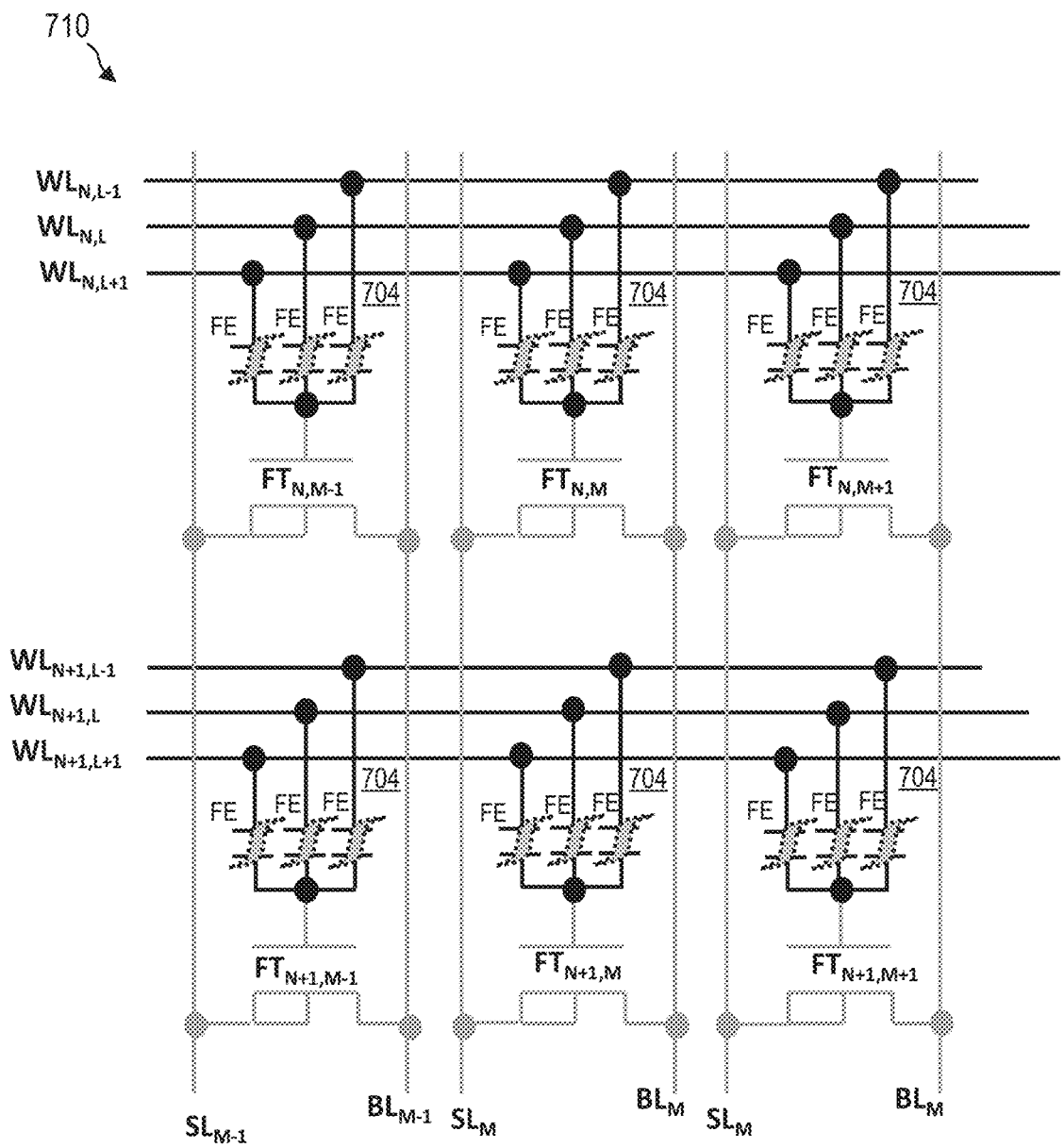

According to various aspects, a plurality of multi-bit memory cells may be organized in an AND architecture. An exemplary configuration of a memory cell arrangement 710 including six multi-bit memory cells 704 having an AND configuration is shown in FIG. 4L. In this example, each multi-bit memory cell 704 may have three memory capacitor structures. A memory cell 704 of the memory cell arrangement 710 may be written or read in a similar way as described with reference to NOR configurations, wherein further voltages at respective source-lines SL may be applied.

Figure 5A:
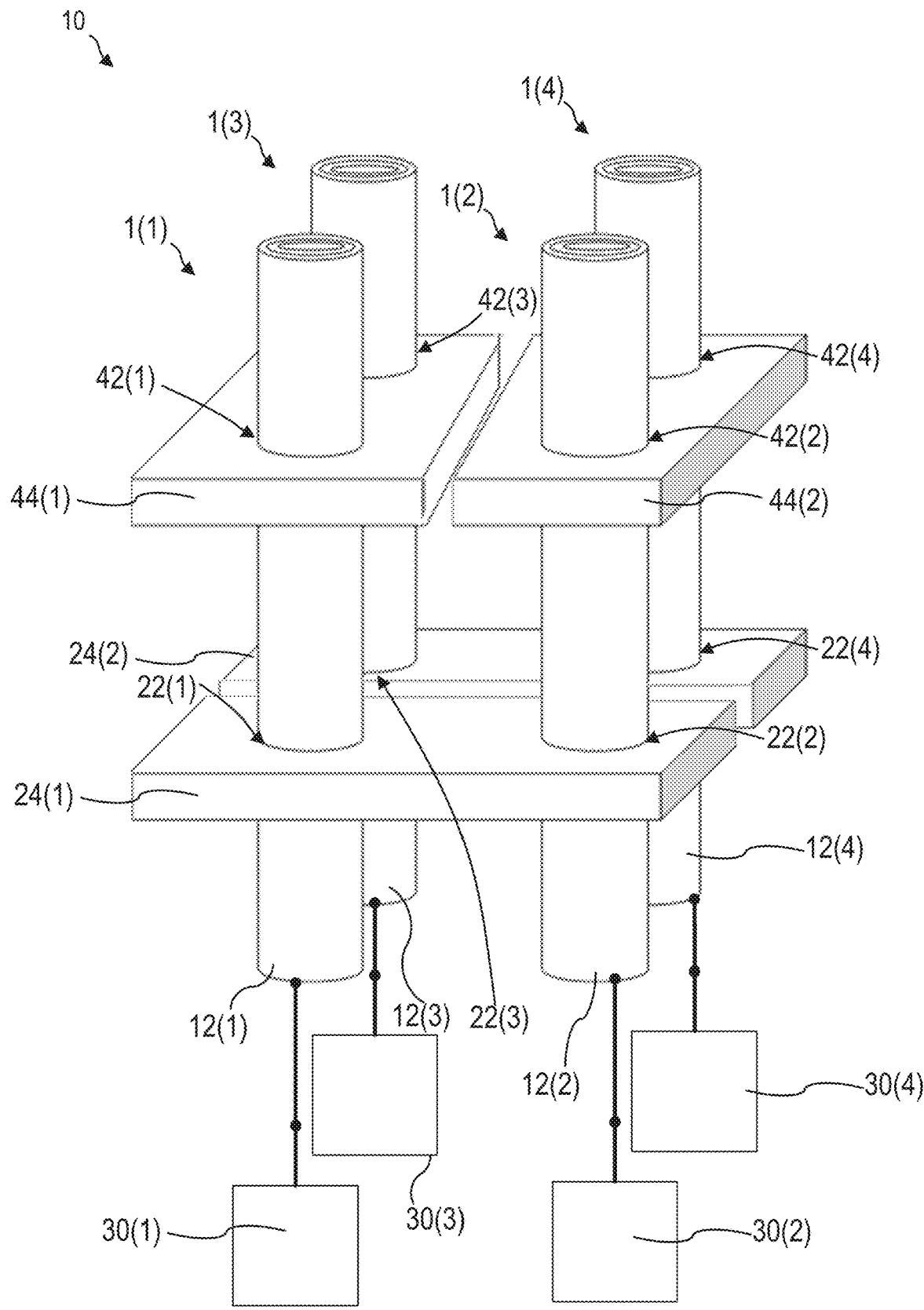
FIGS. 5A and 5B each schematically show an exemplary memory cell arrangement including four memory cells, according to various aspects.

FIG. 5A schematically shows an exemplary memory cell arrangement 10 including a first memory cell 1(1), a second memory cell 1(2), a third memory cell 1(3), and a fourth memory cell 1(4), according to various aspects. According to various aspects, each of the first memory cell 1(1), the second memory cell 1(2), the third memory cell 1(3), and the fourth memory cell 1(4) may be configured substantially the same as the memory cell 1. The first memory cell 1(1) may include an electrode pillar 12(1), a memory material portion 22(1), a dielectric material portion 42(1), and a field-effect transistor structure 30(1). The second memory cell 1(2) may include an electrode pillar 12(2), a memory material portion 22(2), a dielectric material portion 42(2), and a field-effect transistor structure 30(2). The third memory cell 1(3) may include an electrode pillar 12(3), a memory material portion 22(3), a dielectric material portion 42(3), and a field-effect transistor structure 30(3). The fourth memory cell 1(4) may include an electrode pillar 12(4), a memory material portion 22(4), a dielectric material portion 42(4), and a field-effect transistor structure 30(4).

The memory cell arrangement 10 may include a first electrode layer 24(1). The first electrode layer 24(1) may surround (e.g., perimeterally surround, e.g., completely perimeterally surround) the memory material portion 22(1) and the first lateral surface portion of the electrode pillar 12(1) associated with the first memory cell 1(1). The first electrode layer 24(1), the memory material portion 22(1), and the electrode pillar 12(1) of the first memory cell 1(1) may form a capacitive memory structure. The first electrode layer 24(1) may surround (e.g., perimeterally surround, e.g., completely perimeterally surround) the memory material portion 22(2) and the first lateral surface portion of the electrode pillar 12(2) associated with the second memory cell 1(2). The first electrode layer 24(1), the memory material portion 22(2), and the electrode pillar 12(2) of the second memory cell 1(2) may form a capacitive memory structure. Illustratively, the first electrode layer 24(1) may provide the first electrode layer 24 of each of the first memory cell 1(1) and the second memory cell 1(2).

The memory cell arrangement 10 may include a second electrode layer 24(2). The second electrode layer 24(2) may surround (e.g., perimeterally surround, e.g., completely perimeterally surround) the memory material portion 22(3) and the first lateral surface portion of the electrode pillar 12(3) associated with the third memory cell 1(3). The second electrode layer 24(2), the memory material portion 22(3), and the electrode pillar 12(3) of the third memory cell 1(3) may form a capacitive memory structure. The second electrode layer 24(2) may surround (e.g., perimeterally surround, e.g., completely perimeterally surround) the memory material portion 22(4) and the first lateral surface portion of the electrode pillar 12(4) associated with the fourth memory cell 1(4). The second electrode layer 24(2), the memory material portion 22(4), and the electrode pillar 12(4) of the second memory cell 1(4) may form a capacitive memory structure. Illustratively, the second electrode layer 24(2) may provide the first electrode layer 24 of each of the third memory cell 1(3) and the fourth memory cell 1(4).

The memory cell arrangement 10 may include a third electrode layer 44(1). The third electrode layer 44(1) may surround (e.g., perimeterally surround, e.g., completely perimeterally surround) the dielectric material portion 42(1) and the second lateral surface portion of the electrode pillar 12(1) associated with the first memory cell 1(1). The third electrode layer 44(1), the dielectric material portion 42(1), and the electrode pillar 12(1) of the first memory cell 1(1) may form a capacitive structure. The third electrode layer 44(1) may surround (e.g., perimeterally surround, e.g., completely perimeterally surround) the dielectric material portion 42(3) and the second lateral surface portion of the electrode pillar 12(3) associated with the third memory cell 1(3). The third electrode layer 44(1), the dielectric material portion 42(3), and the electrode pillar 12(3) of the third memory cell 1(3) may form a capacitive structure. Illustratively, the third electrode layer 44(1) may provide the second electrode layer 44 of each of the first memory cell 1(1) and the third memory cell 1(3).

The memory cell arrangement 10 may include a fourth electrode layer 44(2). The fourth electrode layer 44(2) may surround (e.g., perimeterally surround, e.g., completely perimeterally surround) the dielectric material portion 42(2) and the second lateral surface portion of the electrode pillar 12(2) associated with the second memory cell 1(2). The fourth electrode layer 44(2), the dielectric material portion 42(2), and the electrode pillar 12(2) of the second memory cell 1(2) may form a capacitive structure. The fourth electrode layer 44(2) may surround (e.g., perimeterally surround, e.g., completely perimeterally surround) the dielectric material portion 42(4) and the second lateral surface portion of the electrode pillar 12(4) associated with the fourth memory cell 1(4). The fourth electrode layer 44(2), the dielectric material portion 42(4), and the electrode pillar 12(4) of the fourth memory cell 1(4) may form a capacitive structure. Illustratively, the fourth electrode layer 44(2) may provide the second electrode layer 44 of each of the second memory cell 1(2) and the fourth memory cell 1(4).

Hence, each memory cell may include at least two capacitor structures, e.g., the capacitive memory structure (formed by the corresponding electrode pillar 12, the corresponding memory material portion 22, and the corresponding electrode layer 24) and the capacitive structure (formed by the corresponding electrode pillar 12, the corresponding dielectric material portion 42, and the corresponding electrode layer 44). According to various aspects, each memory cell may include a plurality of capacitor structures. Illustratively, each memory cell 1 may be configured as a 1TnC-cell (i.e., a memory cell that includes one transistor, 1T, and "n" capacitors, nC). For example, each memory cell 1 may be configured as a 1T2C-cell (i.e., a memory cell that includes one transistor, 1T, and two capacitors, 2C).

The first electrode layer 24(1) and the second electrode layer 24(2) may be disposed in the same layer of a memory cell device. The first electrode layer 24(1) and the second electrode layer 24(2) each may extend in a first plane along a first direction. The third electrode layer 44(1) and the fourth electrode layer 44(2) may be disposed in the same layer of the memory cell device different from the layer the first electrode layer 24(1) and the second electrode layer 24(2) may be disposed in. The third electrode layer 44(1) and the fourth electrode layer 44(2) each may extend in a second plane different from the first plane along a second direction different from the first direction. The third electrode layer 44(1) and the fourth electrode layer 44(2) each may extend in the second plane along the first direction.

Figure 5B:
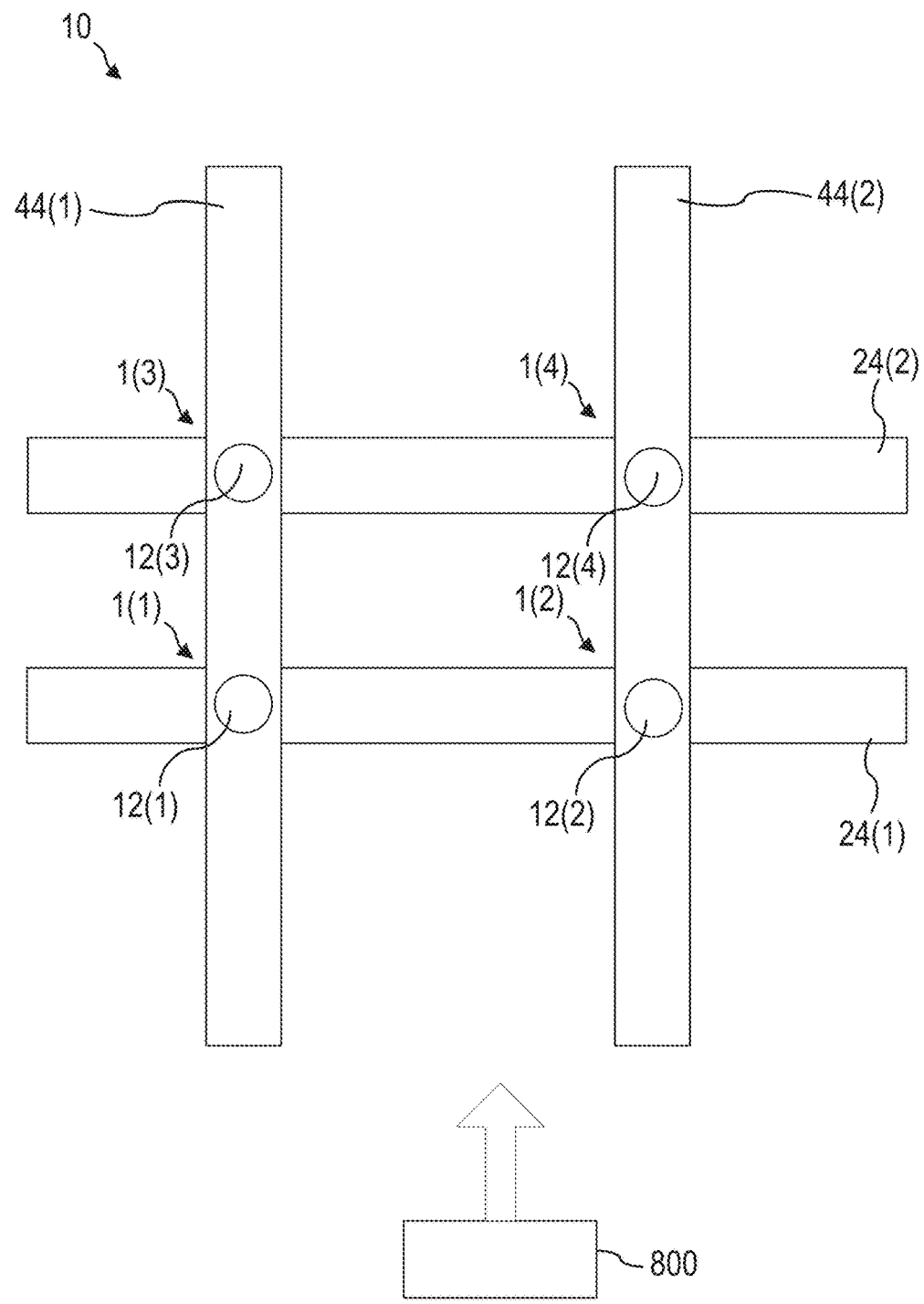

FIG. 5B schematically shows a top view of an exemplary memory cell arrangement 10 including the first memory cell 1(1), the second memory cell 1(2), the third memory cell 1(3), and the fourth memory cell 1(4), according to various aspects. In the example, the third electrode layer 44(1) and the fourth electrode layer 44(2) each may extend in the second plane along the second direction. According to various aspects, the memory cell arrangement 10 may include at least one control circuit 800. The control circuit 800 may be configured to apply one or more voltages to respective electrode layers, such as the first electrode layer 24(1), the second electrode layer 24(2), third electrode layer 44(1), and/or the fourth electrode layer 44(2).

Figure 5C:
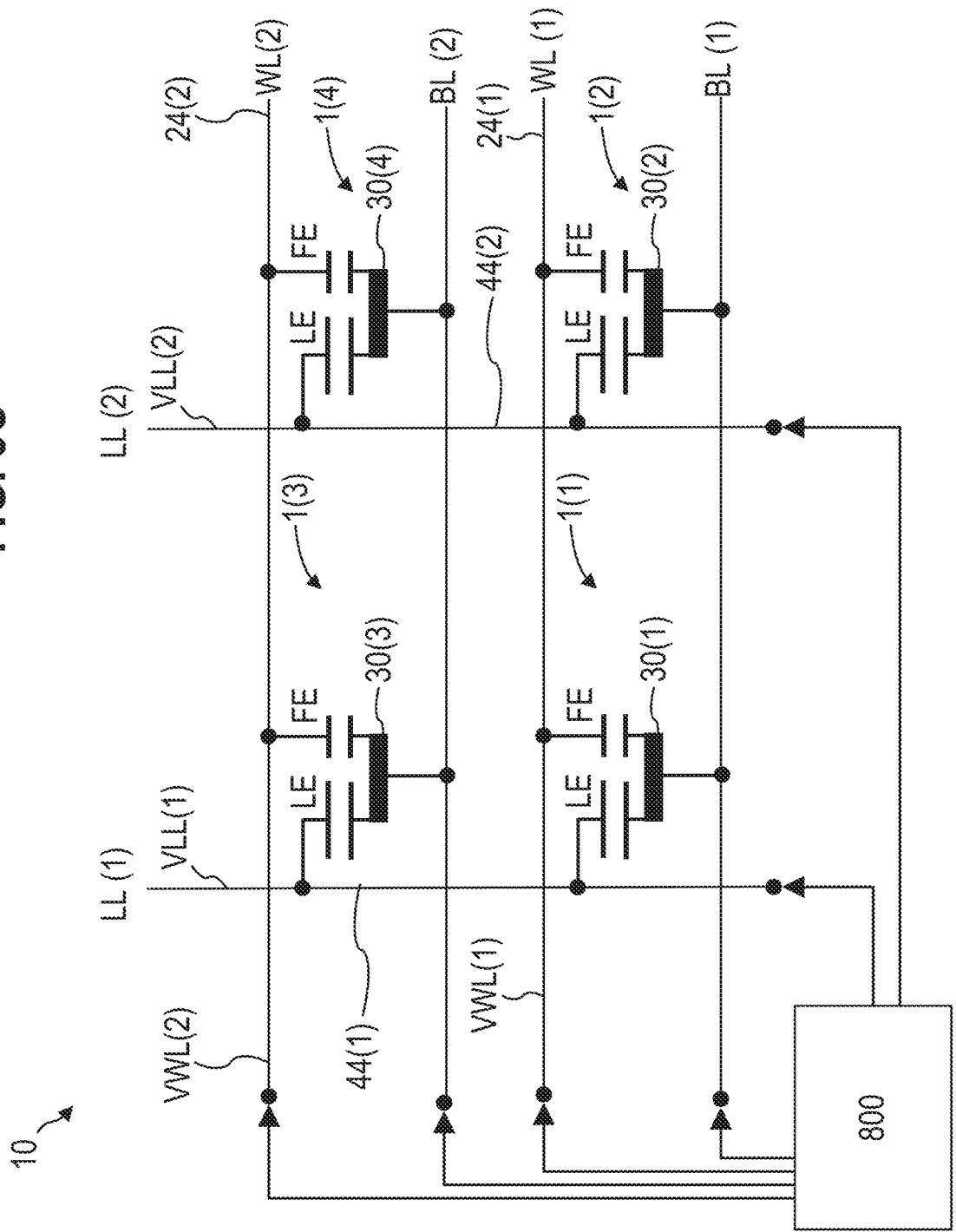
FIG. 5C shows an exemplary configuration of a memory cell arrangement including four memory cells, according to various aspects.
Figure 5D:
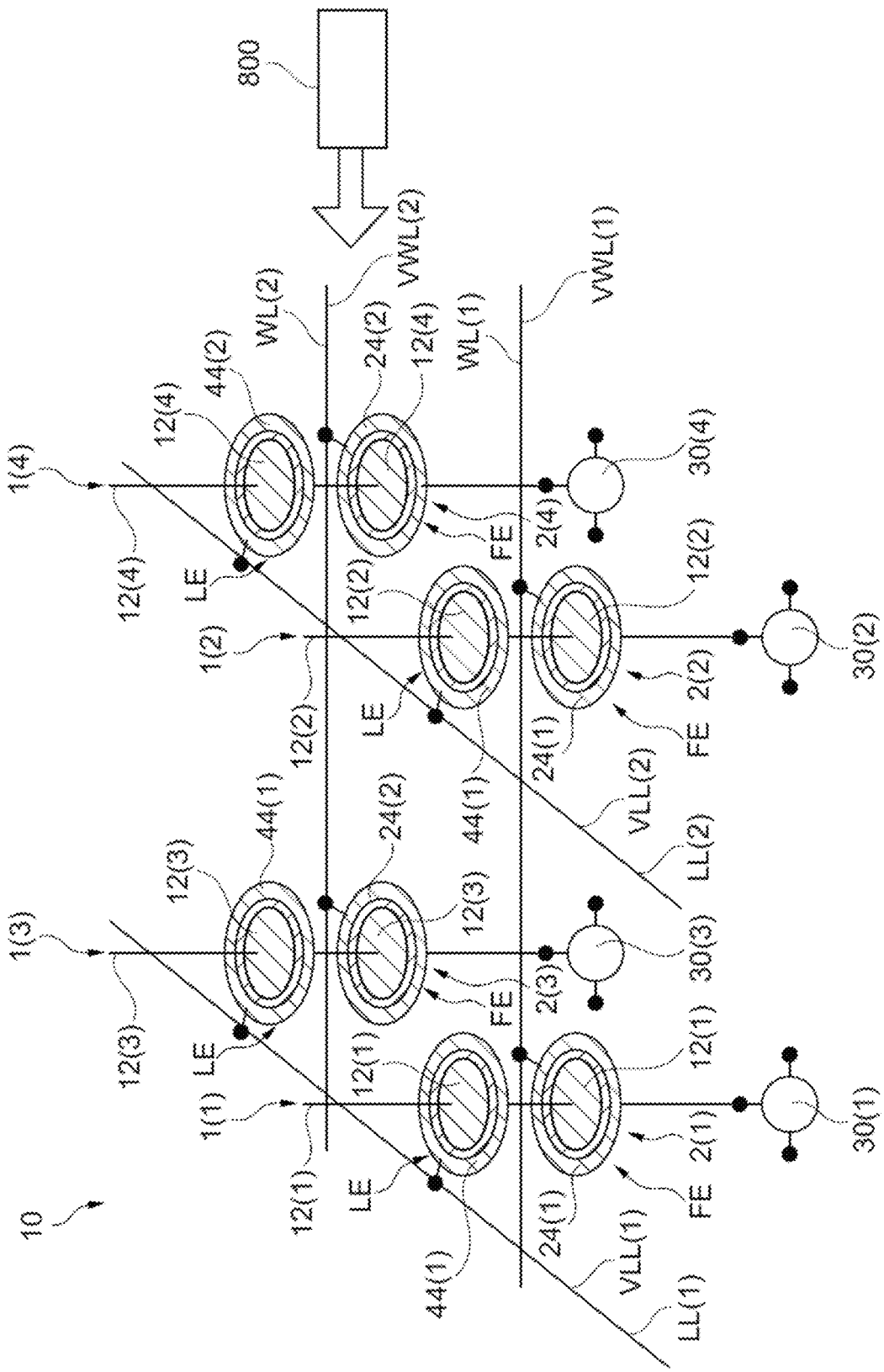
FIG. 5D shows a perspective view of a memory cell arrangement driven by one or more control circuits, according to various aspects.
Figure 5E:
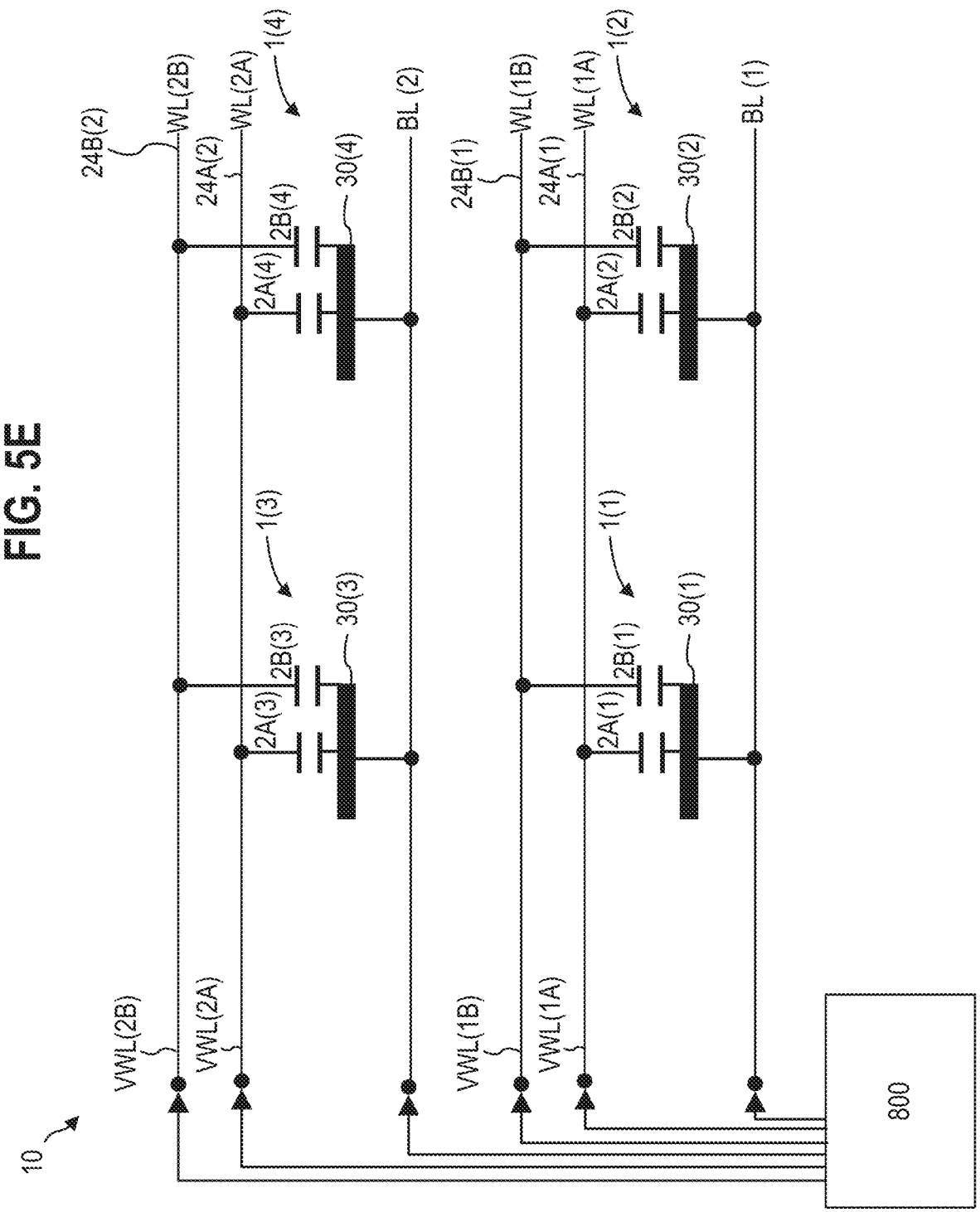
FIG. 5E shows an exemplary configuration of a memory cell arrangement including four multi-bit memory cells, according to various aspects.

According to various aspects, each dielectric material portion 42(1), 42(2), 42(3), 42(4) of the respective memory cells 1(1), 1(2), 1(3), 1(4) may include or may consist of a non-spontaneously polarizable material such that each capacitive structure formed by the respective dielectric material portion 42(1), 42(2), 42(3), 42(4), the respective electrode layer 44(1), 44(2), the respective electrode pillar 12(1), 12(2), 12(3), 12(4) is a capacitive lever structure, as illustrated in FIG. 5C and FIG. 5D. According to various aspects, each dielectric material portion 42(1), 42(2), 42(3), 42(4) of the respective memory cells 1(1), 1(2), 1(3), 1(4) may include or may consist of a spontaneously polarizable material (e.g., a remanent-polarizable material, e.g., a ferroelectric material, e.g., an antiferroelectric material) such that each capacitive structure formed by the respective dielectric material portion 42(1), 42(2), 42(3), 42(4), the respective electrode layer 44(1), 44(2), the respective electrode pillar 12(1), 12(2), 12(3), 12(4) is a capacitive memory structure, as illustrated in FIG. 5E. In this case each memory cell 1(1), 1(2), 1(3), 1(4) may be a multi-bit memory cell including at least two capacitive memory structures.

FIG. 5C shows an exemplary configuration of the memory cell arrangement 10 including the first memory cell 1(1), the second memory cell 1(2), the third memory cell 1(3), and the fourth memory cell 1(4), according to various aspects. FIG. 5D shows a perspective view of the memory cell arrangement 10 driven by one or more control circuits, according to various aspects. According to various aspects, the memory cell arrangement 10 may include a plurality of control lines. The memory cell arrangement 10 may include a first wordline WL(1). The first electrode layer 24(1) may be electrically conductively connected to the first wordline WL(1). The first electrode layer 24(1) may form at least a part of the first wordline WL(1). The memory cell arrangement 10 may include a second wordline WL(2). The second electrode layer 24(2) may be electrically conductively connected to the second wordline WL(2). The second electrode layer 24(2) may form at least a part of the second wordline WL(2). The memory cell arrangement 10 may include a first leverline LL(1). The third electrode layer 44(1) may be electrically conductively connected to the first leverline LL(1). The third electrode layer 44(1) may form at least a part of the first leverline LL(1). The memory cell arrangement 10 may include a second leverline LL(2). The fourth electrode layer 44(2) may be electrically conductively connected to the second leverline LL(2). The fourth electrode layer 44(2) may form at least a part of the second leverline LL(2). According to various aspects, the control circuit 800 may be configured to apply a first wordline voltage VWL(1) to the first wordline WL(1), a second wordline voltage VWL(2) to the second wordline WL(2), a first leverline voltage VLL(1) to the first leverline LL(1), and/or a second leverline voltage VLL(2) to the second leverline LL(2).

According to various aspects, for each memory cell 1(1), 1(2), 1(3), 1(4), the associated first electrode layer 24(1) or second electrode layer 24(2), the memory material portion associated with the memory cell, and the electrode pillar 12 associated with the memory cell may form the capacitive memory structure (in some aspects also referred to as ferroelectric capacitor) FE. According to various aspects, for each memory cell 1(1), 1(2), 1(3), 1(4), the associated third electrode layer 44(1) or fourth electrode layer 44(2), the dielectric material portion associated with memory cell, and the electrode pillar 12 associated with the memory cell may form the capacitive lever structure (in some aspects also referred to as lever capacitor) LE.

According to various aspects, the memory cell arrangement 10 may be organized in a NOR configuration as described with reference to FIG. 4C and FIG. 4D. In this case a memory cell of the memory cell arrangement 10 may be written as described with reference to FIG. 4C and may be read as described with reference to FIG. 4D. The at least one control circuit 800 may be configured to apply the voltages described with reference to FIG. 4C and/or FIG. 4D.

According to various aspects, the memory cell arrangement 10 may be organized in a NAND configuration as described with reference to FIG. 4E and FIG. 4F. In this case a memory cell of the memory cell arrangement 10 may be written as described with reference to FIG. 4E and may be read as described with reference to FIG. 4F. The at least one control circuit 800 may be configured to apply the voltages described with reference to FIG. 4E and/or FIG. 4F.

FIG. 5E shows an exemplary configuration of the memory cell arrangement 10 including the first memory cell 1(1), the second memory cell 1(2), the third memory cell 1(3), and the fourth memory cell 1(4), according to various aspects. Each of the first memory cell 1(1), the second memory cell 1(2), the third memory cell 1(3), and the fourth memory cell 1(4) may be configured as a multi-bit memory cell. In this example, each dielectric material portion 42(1), 42(2), 42(3), 42(4) of the respective memory cells 1(1), 1(2), 1(3), 1(4) may include or may consist of a spontaneously polarizable material such that each memory cell 1(1), 1(2), 1(3), 1(4) may be a multi-bit memory cell including at least two capacitive memory structures 2A, 2B. The memory cell arrangement 10 may include the first electrode layer 24(1) (in the following also referred to as first electrode layer 24A(1)), the second electrode layer 24(2) (in the following also referred to as second electrode layer 24A(2)), the third electrode layer 44(1) (in the following also referred to as third electrode layer 24B(1)), and the fourth electrode layer 44(2) (in the following also referred to as fourth electrode layer 24B(2)).

The memory cell arrangement 10 may include a first set of wordlines WL(1A), WL(1B) connected to the first memory cell 1(1) and the second memory cell 1(2). The first set of memory cells may include a first wordline WL(1A) and a third wordline WL(1B). The first electrode layer 24A(1) may be electrically conductively connected to the first wordline WL(1). The first electrode layer 24A(1) may form at least a part of the first wordline WL(1A). The third electrode layer 24B(1) may be electrically conductively connected to the third wordline WL(1B). The third electrode layer 24B(1) may form at least a part of the third wordline WL(1B).

The memory cell arrangement 10 may include a second set of wordlines WL(2A), WL(2B) connected to the third memory cell 1(3) and the fourth memory cell 1(4). The second set of memory cells may include a second wordline WL(2A) and a fourth wordline WL(2B). The second electrode layer 24A(2) may be electrically conductively connected to the second wordline WL(2A). The second electrode layer 24A(2) may form at least a part of the second wordline WL(2A). The fourth electrode layer 24B(2) may be electrically conductively connected to the fourth wordline WL(2B). The fourth electrode layer 24B(2) may form at least a part of the fourth wordline WL(2B).

According to various aspects, the control circuit 800 may be configured to apply a first wordline voltage VWL(1A) to the first wordline WL(1A), a second wordline voltage VWL(2A) to the second wordline WL(2A), a third wordline voltage VWL(1B) to the third wordline WL(1B), and/or a fourth wordline voltage VWL(2B) to the fourth wordline WL(2B).

According to various aspects, the memory cell arrangement 10 may be organized in a NOR configuration as described with reference to FIG. 4C and FIG. 4D. In this case a memory cell of the memory cell arrangement 10 may be written or read as described with reference to FIG. 4G. The at least one control circuit 800 may be configured to apply the voltages described with reference to FIG. 4G.

According to various aspects, the memory cell arrangement 10 may be organized in a NAND configuration as described with reference to FIG. 4H. In this case a memory cell of the memory cell arrangement 10 may be written or read as described with reference to FIG. 4H. The at least one control circuit 800 may be configured to apply the voltages described with reference to FIG. 4H.

Figure 5F:
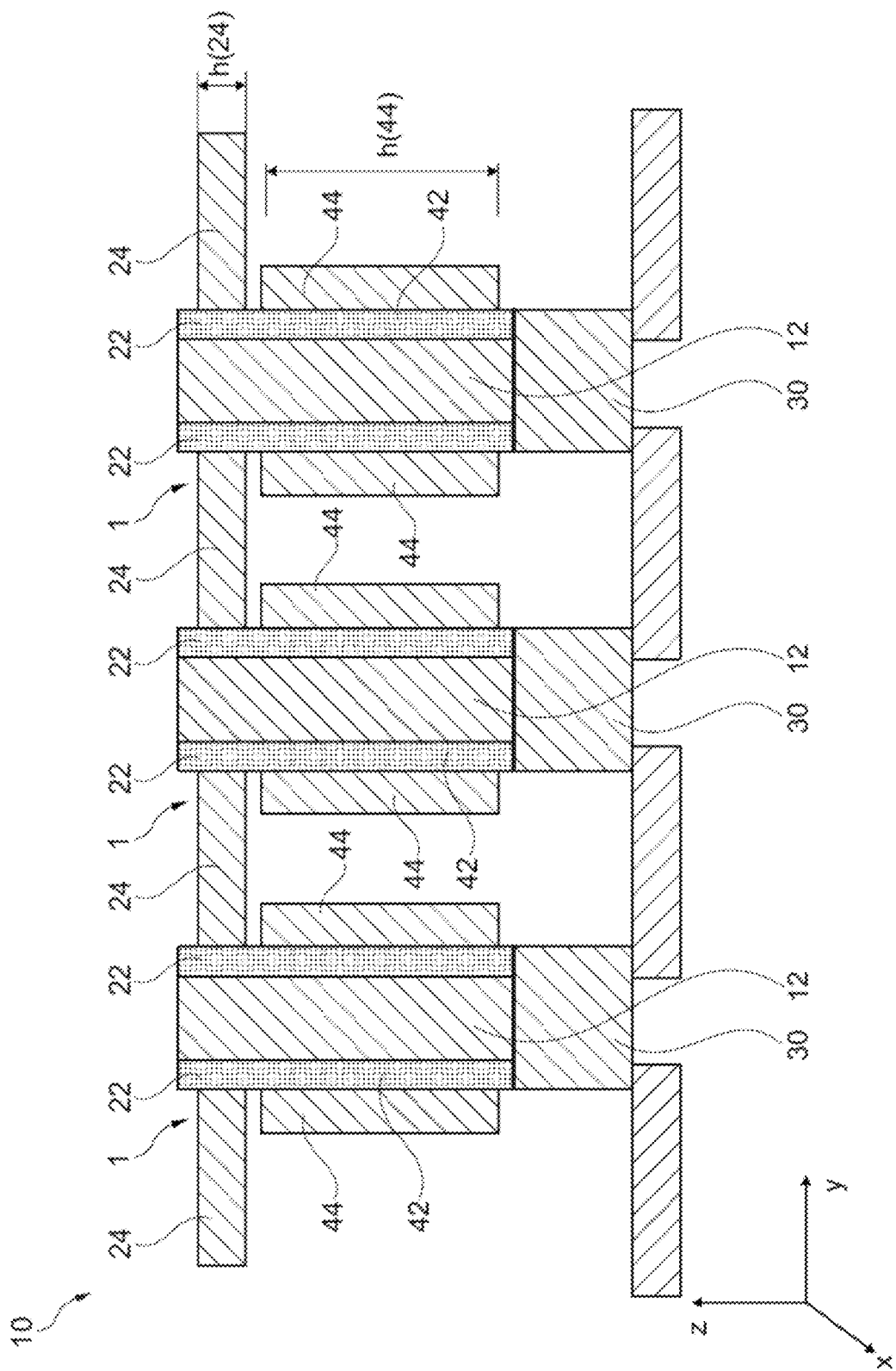
FIG. 5F schematically shows cross-section of a memory cell arrangement having a NAND architecture, according to various aspects.

FIG. 5F schematically shows cross-section of a memory cell arrangement having a NAND architecture, according to various aspects. In this example, the height h(24) of the first electrode layer 24 may be greater than the height h(44) of the second electrode layer 44. According to various aspects, each of the capacitive memory structures formed by the first electrode layer 24, a respective electrode pillar 12, and a respective memory material portion 22 may have a first effective area and each of the capacitive structures formed by the respective second electrode layer 44, a respective electrode pillar 12, and a respective memory material portion 42 may have a second effective area different from the first effective area. According to various aspects, the first electrode layer 24 may extend in a first plane (e.g., parallel to the x-y-plane, e.g., described by one or more first z-values) along a first direction (e.g., the y-direction) and the second electrode layer 44 may extend in a second plane (e.g., parallel to the x-y-plane, e.g., different from the first plane, e.g., described by one or more second z-values different from the first z-values) along a second direction (e.g., the x-direction) different from the first direction.

According to various aspects, each memory cell may include at least three capacitor structures. Illustratively, each memory cell of a memory cell arrangement may be configured as a 1TnC-cell (i.e., a memory cell that includes one transistor, 1T, and "n" capacitors, nC, wherein "n" may be equal to or greater than three). According to various aspects, each memory cell of the memory cell arrangement may include one field-effect transistor FT (1T), one lever capacitor LE (1C), and a plurality of ferroelectric capacitor FE ((n−1)C). According to various aspects, a memory cell including a plurality of ferroelectric capacitor FE ((n−1)C) may be a multi-bit memory cell as described herein.

Figure 6A:
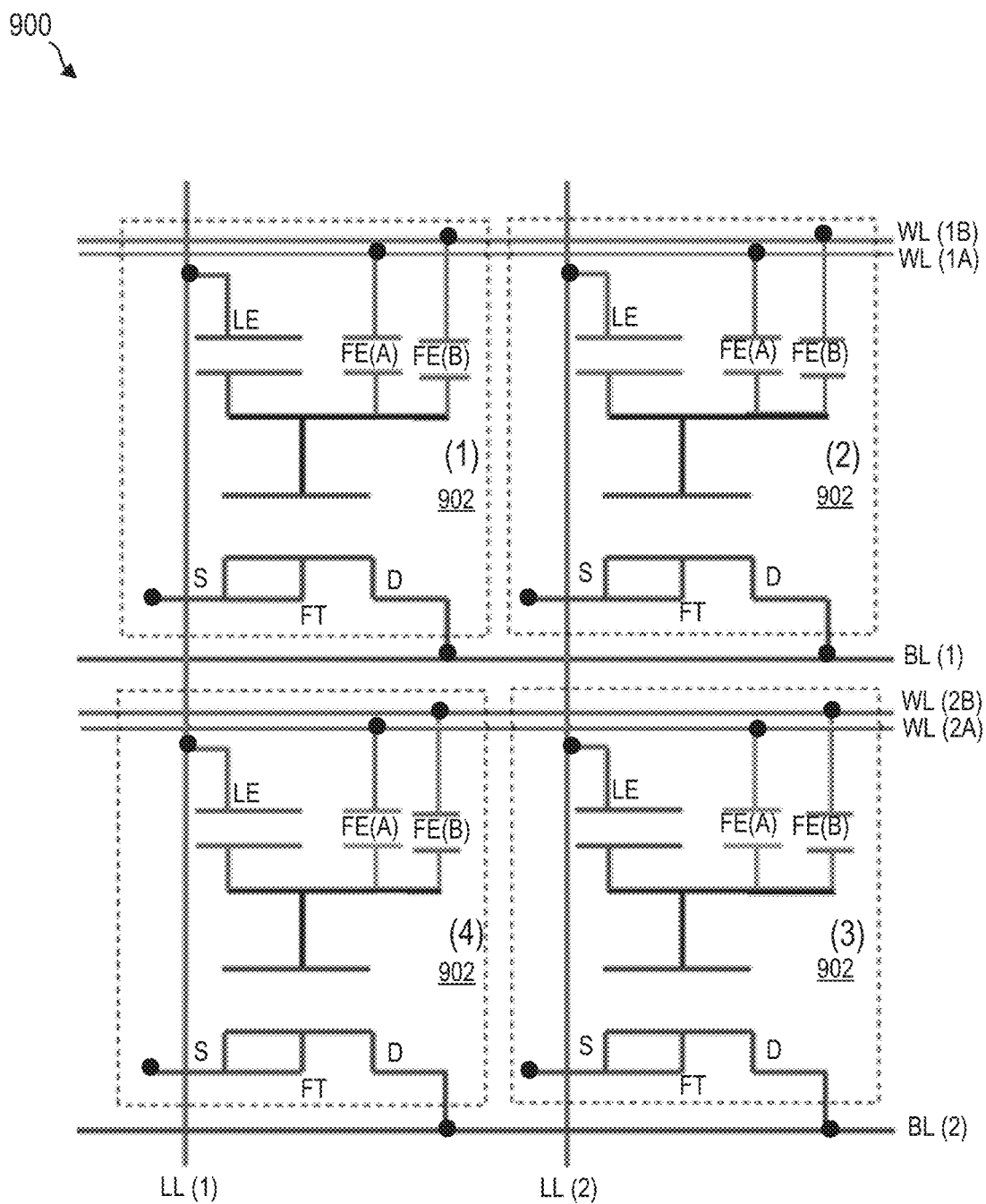
FIGS. 6A and 6B each schematically shows a memory cell arrangement having a NOR architecture and including multi-bit memory cells, according to various aspects.
Figure 6B:
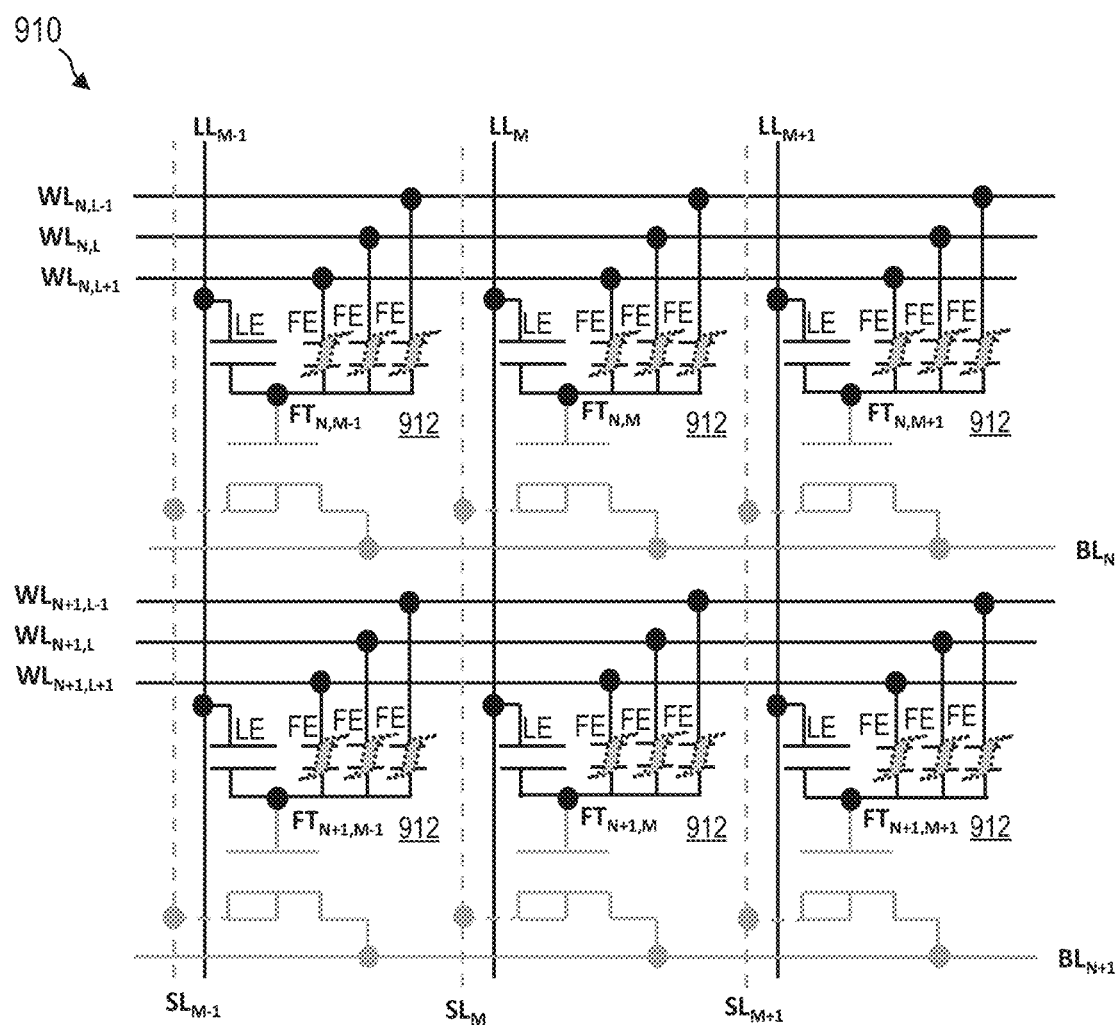
Figure 6C:
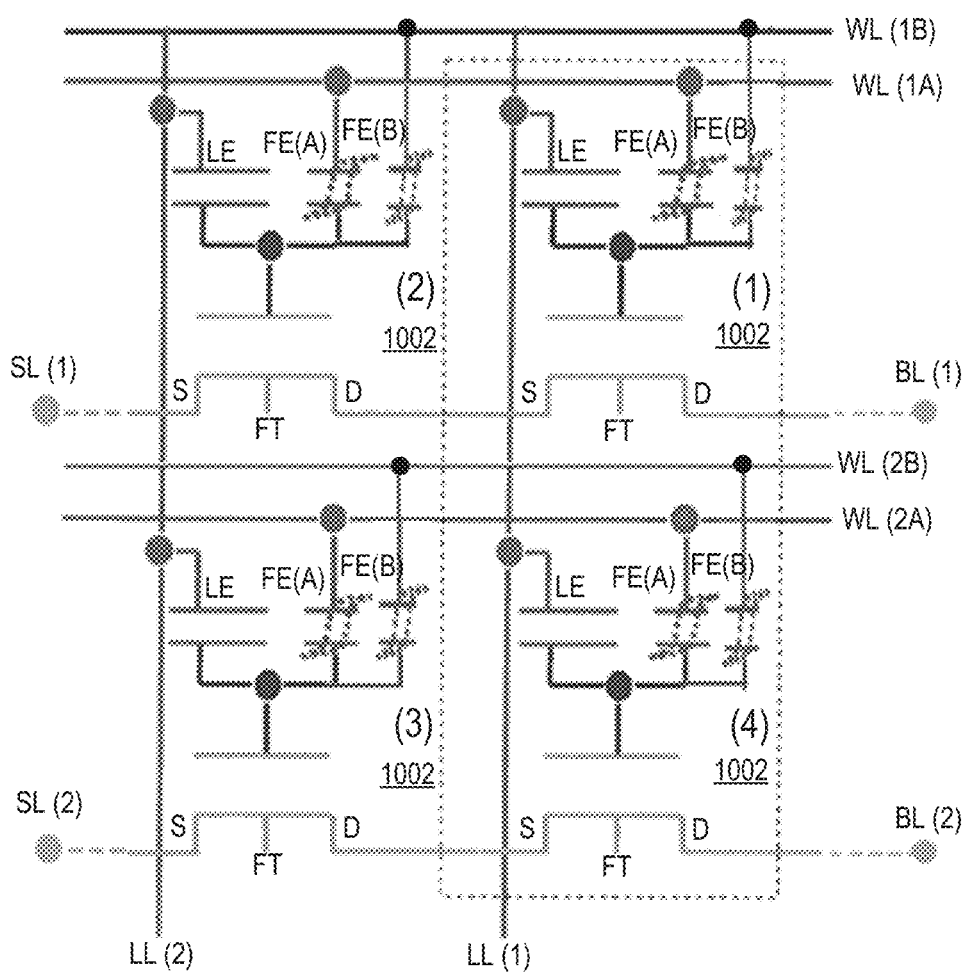
FIGS. 6C and 6D each schematically shows a memory cell arrangement having a NAND architecture and including multi-bit memory cells, according to various aspects.

According to various aspects, the 1TnC memory cells of a memory cell arrangement may be organized as an array based on a NOR architecture, as illustrated in FIG. 6A (exemplarily for a 1T3C memory cell) and FIG. 6B (exemplarily for a 1T4C memory cell). According to various aspects, the 1TnC memory cells of a memory cell arrangement may be organized as an array based on a NAND architecture, as illustrated in FIG. 6C (exemplarily for a 1T3C memory cell) and FIG. 6D (exemplarily for a 1T4C memory cell). According to various aspects, the 1TnC memory cells of a memory cell arrangement may be organized as an array based on an AND architecture, as illustrated in FIG. 6E (exemplarily for a 1T4C memory cell).

FIG. 6A schematically shows a memory cell arrangement 900 having a NOR architecture and including multi-bit memory cells 902, according to various aspects. Each memory cell 902 may be configured as a 1T3C memory cell. Each memory cell 902 of the memory cell arrangement 900 may include a lever capacitor LE, a first ferroelectric capacitor FE(A), a second ferroelectric capacitor FE(B), and a field-effect transistor FT. The lever capacitor LE of the respective memory cell 902 may be connected to a corresponding lever-line LL(1), LL(2) and to the floating gate of the field-effect transistor FT of the respective memory cell 902. The first ferroelectric capacitor FE(A) of the respective memory cell 902 may be connected to a corresponding word-line WL(1A), WL(2A) and to the floating gate of the field-effect transistor FT of the respective memory cell 902. The second ferroelectric capacitor FE(B) of the respective memory cell 902 may be connected to a corresponding word-line WL(1B), WL(2B) and to the floating gate of the field-effect transistor FT of the respective memory cell 902. The field-effect transistor FT may be connected with its source S to a common source potential and with its drain D to a corresponding bit-line BL(1), BL(2).

According to various aspects, addressing (e.g., writing, e.g. reading) a memory cell 902 of the memory cell arrangement 900 may be performed in a similar way as described with reference to FIG. 4C and FIG. 4D and addressing (e.g., writing, e.g. reading) a ferroelectric capacitor (e.g., FE(A), e.g., FE(B)) of the memory cell 902 to be addressed may be performed in a similar way as described with reference to FIG. 4G.

According to various aspects, a ferroelectric capacitor (e.g., the first ferroelectric capacitor FE(A), e.g., the second ferroelectric capacitor FE(B)) may be written. In this example, it may be assumed that only one ferroelectric capacitor (e.g., the first ferroelectric capacitor FE(A) or the second ferroelectric capacitor FE(B)) of one memory cell (1) of the memory cell arrangement 900 is intended to be written (is selected to be written, e.g., referred to as selected ferroelectric capacitor of the selected memory cell, in some aspects also referred to as selected ferroelectric capacitor).

To program or erase the first ferroelectric capacitor FE(A) of the memory cell (1), a write voltage $V_{PP}$ may be applied to the active word-line connected to the selected ferroelectric capacitor FE(A) of the selected memory cell (1). In this case, the voltage ($V_{FE,ACT}$) applied at the corresponding word-line (WL(1A)) may be the write voltage $V_{PP}$ (also referred to as programming voltage $V_{PP}$). To program or erase the selected ferroelectric capacitor FE(A), a base voltage (e.g., $V_{SS}$) or a voltage close to the base voltage may be applied to the active bit-line connected to the field-effect transistor FT of the memory cell (1) corresponding to the selected ferroelectric capacitor FE(A). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V).

According to various aspects, the field-effect transistor structure may be in a non-conducting state during writing the selected ferroelectric capacitor FE(A) of the selected memory cell. Illustratively, the field-effect transistor structure may be closed during writing the selected ferroelectric capacitor FE(A) of the selected memory cell. This may, for example, increase the speed of writing the selected ferroelectric capacitor FE(A) of the selected memory cell (e.g., with a write time of less than 15 ns, e.g., with a write time of less than 10 ns). According to various aspects, the write voltage $V_{PP}$ may be, for example, in the range from about 1 V to about 10 V, e.g. from about 1.5 V to about 6 V.

According to various aspects, a disturbance of the other ferroelectric capacitors FE(B) of the selected memory cell (1) may be prevented during writing the selected ferroelectric capacitor FE(A) of the selected memory cell (1). As an example, to avoid disturb of the second ferroelectric capacitor FE(B) during writing the selected first ferroelectric capacitor FE(A) of the selected memory cell (1), a voltage different from $V_{PP}$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cell (1) of the memory cell arrangement 900 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 902 of the memory cell arrangement 900 may be prevented during writing the selected ferroelectric capacitor FE(A) of the selected memory cell (1).

As an example, to avoid a disturbance of the memory cell (2) of the memory cell arrangement 900 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 900 that share the same word-line (WL(1A)) as the selected ferroelectric capacitor FE(A) of the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 900 (in the following also referred to as second lever voltage) may be bipolar. For example, the first (active) lever voltage ($V_{LE,ACT}$) may have a negative voltage value and the second (passive) lever-voltage ($V_{LE, PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V.

According to various aspects, applying second (passive) lever-voltages ($V_{LE PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

As an example, to avoid disturb of the memory cells (3), (4) of the memory cell arrangement 900 during writing the selected ferroelectric capacitor FE(A) of the selected memory cell (1) (in the following also referred to as selected ferroelectric capacitor FE(A,1)), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 900 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 900 (in the following also referred to as second inhibit voltage) may be bipolar. For example, the write voltage ($V_{PP}$) may have a positive voltage value and the second inhibit voltage ($V_{FE,PAS}$) may have a negative voltage value, or vice versa. According to an example, the write voltage $V_{PP}$ may have a voltage value of +1.0 V and the second inhibit voltage $V_{FE,PAS}$ may have a voltage value of −0.2 V.

Further, to avoid disturb of the memory cells (3), (4) of the memory cell arrangement 900 during writing the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL (2)) may be, for example, 0 V or a voltage close to 0 V (e.g., a voltage in the range from about −0.25V to about 0.25 V).

As described exemplarily above, individual cells of the memory cell arrangement 900 can be erased. It is noted that some or all of the voltages described are only examples and that deviations from the described voltages may be possible.

As further described exemplarily above, the terminals of the memory cell 902 connected to the bit-line (e.g., connected to the source/drain regions of the field-effect transistor of the memory cell 902) may be kept at $V_{SS}$ (or at least close to $V_{SS}$) eliminating the power consumption from reverse junction leakage from bulk to source and drain during inhibition.

According to various aspects, a ferroelectric capacitor (e.g., the first ferroelectric capacitor FE(A), e.g., the second ferroelectric capacitor FE(B)) may be read out. In this example, it may be assumed that only one ferroelectric capacitor (e.g., the first ferroelectric capacitor FE(A) or the second ferroelectric capacitor FE(B)) of a selected memory cell (1) of the memory cell arrangement 900 is intended to be read (is selected to be read, referred to as selected ferroelectric capacitor of the selected memory cell, in some aspects also referred to as selected ferroelectric capacitor). To read the selected ferroelectric capacitor FE(A) of the memory cell (1), a read voltage $V_G$ may be applied to the active word-line connected to the selected ferroelectric capacitor FE(A) of the selected memory cell (1) (in the following also referred to as selected ferroelectric capacitor FE(A,1)). In this case, the voltage ($V_{FE,ACT}$) applied to the corresponding word-line (WL(1A)) may be the read voltage $V_G$.

Further, to read the selected ferroelectric capacitor FE(A, 1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the selected ferroelectric capacitor FE(A, 1), a potential/voltage greater than $V_{SS}$ may be applied to the active bit-line connected to the field-effect transistor FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V The bulk and source terminals of the field-effect transistors of the memory cells may be kept at a voltage at or close to $V_{SS}$ (e.g., a voltage of 0 V or in the range from about −0.25V to about 0.25 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, a disturbance of the other ferroelectric capacitors FE(B) of the selected memory cell (1) may be prevented during reading the selected ferroelectric capacitor FE(A) of the selected memory cell (1). As an example, to avoid disturb of the second ferroelectric capacitor FE(B) during reading the selected first ferroelectric capacitor FE(A) of the selected memory cell (1), a voltage different from $V_G$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about $½*|V_{PP}|$.

According to various aspects, a voltage value of the read voltage ($V_G$) and a voltage value of the voltage ($V_{FE(B),PAS}$) applied to all passive word-lines connected to the non-selected ferroelectric capacitors FE of the selected memory cell (1) of the memory cell arrangement 900 (in the following also referred to as first inhibit voltage) may be bipolar. For example, the read voltage ($V_G$) may have a positive voltage value and the first inhibit voltage ($V_{FE(B),PAS}$) may have a negative voltage value, or vice versa.

According to various aspects, disturb of the other memory cells 902 of the memory cell arrangement 900 may be prevented during reading the selected ferroelectric capacitor FE(A) of the selected memory cell (1).

As an example, to avoid disturb of the memory cell (2) of the memory cell arrangement 900 during reading the selected ferroelectric capacitor FE(A) of the selected memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 900 that share the same word-line (WL(1A)) as the selected ferroelectric capacitor FE(A,1). According to various aspects, the voltage ($V_{LE,PAS}$) applied to the corresponding lever-line (LL(2)) may be, for example, in the range from about $V_{SS}$ (e.g., 0 V) to about $½*|V_G|$.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 900 (in the following also referred to as second lever voltage) may be bipolar. For example, the first (active) lever voltage ($V_{LE,ACT}$) may have a positive voltage value and the second (passive) lever-voltage ($V_{LE,PAS}$) may have a negative voltage value, or vice versa. According to an example, the first lever voltage $V_{LE,ACT}$ may have a voltage value of +0.6 V and the second lever voltage $V_{LE,PAS}$ may have a voltage value of −0.1 V.

According to various aspects, applying second (passive) lever-voltages ($V_{LE,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, to avoid disturb of the memory cells (3), (4) of the memory cell arrangement 900 during reading the selected ferroelectric capacitor FE(A,1), a voltage different from $V_G$ may be applied to the passive word-line connected to the ferroelectric capacitor FE of the non-selected memory cells (3), (4). A voltage different from $V_G$ may be applied to all passive word-lines connected to the ferroelectric capacitors FE of the non-selected memory cells of the memory cell arrangement 900 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 900 (in the following also referred to as second inhibit voltage) may be bipolar. For example, the read voltage ($V_G$) may have a positive voltage value and the second inhibit voltage ($V_{FE,PAS}$) may have a negative voltage value, or vice versa.

Further, to avoid disturb of the memory cells (3), (4) of the memory cell arrangement 900 during reading the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). A voltage that equals the base voltage or that is close to the base voltage may be applied to all passive bit-lines connected to the field-effect transistors of the non-selected memory cells of the memory cell arrangement 900 that do not share the same bit-line (BL(1)) as the selected memory cell (1). In this case, the voltage ($V_{BL,PAS}$) applied to the corresponding bit-line (BL (2)) may be, for example, 0 V or a voltage close to 0 V (e.g., a voltage in the range from about −0.25V to about 0.25 V).

As described exemplarily above, individual cells of the memory cell arrangement 900 can be read. It is noted that some or all of the voltages described are only examples and that deviations from the described voltages may be possible. According to various aspects, the bulk and source terminals of the transistors of the memory cells 902 (that includes semiconductor material) may be kept at $V_{SS}$ but the active bit-line potential may be charged to a potential greater than $V_{SS}$ to detect a charge created by the ferroelectric capacitor FE.

An exemplary configuration of a memory cell arrangement 910 including six 1T4C memory cells 912 having a NOR configuration is shown in FIG. 6B. A memory cell 912 of the memory cell arrangement 910 may be written and/or read as described with reference to FIG. 6A.

FIG. 6C schematically shows a memory cell arrangement 1000 having a NAND architecture and including multi-bit memory cells 1002, according to various aspects. Each memory cell 1002 may be configured as a 1T3C memory cell. Each memory cell 1002 of the memory cell arrangement 1000 may include a lever capacitor LE, a first ferroelectric capacitor FE(A), a second ferroelectric capacitor FE(B), and a field-effect transistor FT. The lever capacitor LE of the respective memory cell 1002 may be connected to a corresponding lever-line LL(1), LL(2) and to the floating gate of the field-effect transistor FT of the respective memory cell 1002. The first ferroelectric capacitor FE(A) of the respective memory cell 1002 may be connected to a corresponding word-line WL(1A), WL(2A) and to the floating gate of the field-effect transistor FT of the respective memory cell 1002. The second ferroelectric capacitor FE(B) of the respective memory cell 1002 may be connected to a corresponding word-line WL(1B), WL(2B) and to the floating gate of the field-effect transistor FT of the respective memory cell 1002.

According to various aspects, addressing (e.g., writing, e.g. reading) a memory cell 1002 of the memory cell arrangement 1000 may be performed in a similar way as described with reference to FIG. 4E and FIG. 4F and addressing (e.g., writing, e.g. reading) a ferroelectric capacitor (e.g., FE(A), e.g., FE(B)) of the memory cell 1002 to be addressed may be performed in a similar way as described with reference to FIG. 4H.

According to various aspects, a ferroelectric capacitor (e.g., the first ferroelectric capacitor FE(A), e.g., the second ferroelectric capacitor FE(B)) may be written. In this example, it may be assumed that only one ferroelectric capacitor (e.g., the first ferroelectric capacitor FE(A) or the second ferroelectric capacitor FE(B)) of one memory cell (1) of the memory cell arrangement 1000 is intended to be written (is selected to be written, e.g., referred to as selected ferroelectric capacitor of the selected memory cell, in some aspects also referred to as selected ferroelectric capacitor). To program or erase the first ferroelectric capacitor FE(A) of the memory cell (1), a write voltage $V_{PP}$ may be applied to the active word-line connected to the selected ferroelectric capacitor FE(A) of the selected memory cell (1). In this case, the voltage ($V_{FE,ACT}$) applied at the corresponding word-line (WL(1A)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further to program or erase the selected ferroelectric capacitor FE(A), a base voltage (e.g., $V_{SS}$) or a voltage close to the base voltage may be applied to the active bit-line connected to the field-effect transistor FT of the memory cell (1) corresponding to the selected ferroelectric capacitor FE(A). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V). For example, the voltage ($V_{BL,ACT}$) applied to the corresponding bit-line (BL(1)) may be applied to the third terminal corresponding to the bit-line (BL(1)). To program or erase the selected ferroelectric capacitor FE(A), a base voltage (e.g., $V_{SS}$) or a voltage close to the base voltage may be applied to the active source-line connected to the field-effect transistor FT of the memory cell (1) corresponding to the selected ferroelectric capacitor FE(A). In this case, the voltage applied to the corresponding source-line (SL(1)) may be, for example, a base voltage (e.g., 0 V) or a voltage close to a base voltage (e.g., a voltage in the range from about −0.25V to about 0.25 V). For example, the voltage applied to the corresponding source-line (SL(1)) may be applied to the fourth terminal corresponding to the source-line (SL(1)).

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other ferroelectric capacitors FE(B) of the selected memory cell (1) may be prevented during writing the selected ferroelectric capacitor FE(A) of the selected memory cell (1).

As an example, to avoid disturb of the second ferroelectric capacitor FE(B) during writing the selected first ferroelectric capacitor FE(A) of the selected memory cell (1), a voltage different from $V_{PP}$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cell (1) of the memory cell arrangement 1000 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, a disturbance of the other memory cells 1002 of the memory cell arrangement 1000 may be prevented during writing the selected memory cell (1).

As an example, to avoid a disturbance of the memory cell (2) of the memory cell arrangement 1000 during writing the selected first ferroelectric capacitor FE(A) of the selected memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 100 that share the same word-line (WL(1A)) as the selected first ferroelectric capacitor FE(A) of the selected memory cell (1). According to various aspects, the voltage ($V_{LE,PAS}$) applied to the corresponding lever-line (LL(2)) may be, for example, in the range from about ½*$V_{PP}$ to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 1000 (in the following also referred to as second lever voltage) may be bipolar. For example, the first (active) lever voltage ($V_{LE,ACT}$) may have a negative voltage value and the second (passive) lever-voltage ($V_{LE,PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V.

According to various aspects, the second lever voltage $V_{LE,PAS}$ may be selected such that the field-effect-transistor structures of the non-selected memory cells of the memory cell arrangement 1000 are in an inversion state.

According to various aspects, applying second (passive) lever-voltages ($V_{LE,PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

According to various aspects, in a NAND-configuration of the plurality of memory cells each field-effect transistor structure of the plurality of memory cells may be configured such (e.g., via implantation of a channel of the respective field-effect transistor structure) the LVT-state of the respective memory cell corresponds to an always-open state of the field-effect transistor structure.

As an example, to avoid disturb of the memory cells (3), (4) of the memory cell arrangement 1000 during writing the selected ferroelectric capacitor FE(A) of the selected memory cell (1) (in the following also referred to as selected ferroelectric capacitor FE(A,1)), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 1000 that do not share the same word-lines (WL(1A), WL(1B)) as the selected memory cell (1). According to various aspects, the voltage ($V_{FE,PAS}$) applied to the corresponding word-lines (WL(2A), WL(2B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 1000 (in the following also referred to as second inhibit voltage) may be bipolar. For example, the write voltage ($V_{PP}$) may have a positive voltage value and the second inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 1000 during writing the selected ferroelectric capacitor FE(A,1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL (2)) may be, for example, 0 V or a voltage close to 0 V (e.g., a voltage in the range from about −0.25V to about 0.25 V). For example, the voltage ($V_{BL,ACT}$) applied to the corresponding bit-line (BL(1)) may be applied to the third terminal corresponding to the bit-line (BL(1)). Further, to avoid disturb of the memory cells (3), (4) of the memory cell arrangement 1000 during writing the selected ferroelectric capacitor FE(A,1), a base voltage (e.g., $V_{SS}$) or a voltage close to the base voltage may be applied to the passive source-line connected to the field-effect transistor FT of the non-selected memory cells (3), (4). In this case, the voltage applied to the corresponding source-line (SL(2)) may be, for example, 0 V or a voltage close to 0 V (e.g., a voltage in the range from about −0.25V to about 0.25 V). For example, the voltage applied to the corresponding source-line (SL(1)) may be applied to the fourth terminal corresponding to the source-line (SL(1)).

As described exemplarily above, individual cells of the memory cell arrangement 1000 can be erased. It is noted that some or all of the voltages described are only examples and that deviations from the described voltages may be possible.

As further described exemplarily above, the terminals of the memory cell 1002 connected to the bit-line (e.g., connected to the source/drain regions of the field-effect transistor of the memory cell 1002) may be kept at $V_{SS}$ (or at least close to $V_{SS}$) eliminating the power consumption from reverse junction leakage from bulk to source and drain during inhibition.

According to various aspects, a selected ferroelectric capacitor FE(A) of a selected memory cell (1) of the memory cell arrangement 1000 may be read out.

To increase a reading speed, the ferroelectric capacitors of more than one memory cell of the memory cell arrangement 1000 may be read substantially simultaneously.

In this example, it may be assumed that only one selected ferroelectric capacitor FE(A) of the memory cell (1) of the NAND-configured memory cell arrangement 1000 is intended to be read (are selected to be read, referred to as selected ferroelectric capacitors of selected memory cells). To read the selected ferroelectric capacitor FE(A) of the selected memory cell (1), a read voltage $V_G$ may be applied to the active word-lines connected to the selected ferroelectric capacitor FE(A) of the memory cell (1). In this case, the voltage ($V_{FE,ACT}$) applied to the corresponding word-line (WL(1A)) may be the read voltage $V_G$.

Further, to read the selected ferroelectric capacitor FE(A) of the selected memory cell (1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the selected ferroelectric capacitor FE(A) of the selected memory cell (1), a potential/voltage greater than $V_{SS}$ may be applied to the active bit-lines connected to the field-effect transistors FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V. Further, to read the selected ferroelectric capacitor FE(A) of the selected memory cell (1), a potential/voltage may be applied to the active source-lines connected to the field-effect transistors FT of the selected memory cell (1). In this case, the voltage applied to the corresponding source-line (SL(1)) may be, for example, equal to 0 V. Reading the selected ferroelectric capacitor FE(A) of the selected memory cell (1) may include providing the voltages to the third terminals and the fourth terminals such that each field-effect transistor structure associated with the other memory cells of the respective first subsets of memory cells, the selected memory cells are included in, are in a conducting state. For example, the voltages may be applied to the third terminals and the fourth terminals such that each field-effect transistor structure that is in a serial connection with the selected memory cell (1) is in a conducting state.

The bulk and source terminals of the field-effect transistors of the memory cells may be kept at a voltage at or close to $V_{SS}$ (e.g., a voltage of 0 V or in the range from about −0.25V to about 0.25 V.

According to an example, the read voltage $V_G$ may have a voltage value of 0.7 V and the voltage ($V_{LE,ACT}$) applied to the corresponding lever-line may have a voltage value of 0.5 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, a disturbance of the other ferroelectric capacitor FE(B) of the selected memory cell (1) may be prevented during writing the selected ferroelectric capacitor FE(A) of the selected memory cell (1). As an example, to avoid disturb of the second ferroelectric capacitor FE(B) of the selected memory cell (1) during writing the selected first ferroelectric capacitor FE(A) of the selected memory cell (1), a voltage different from $V_{PP}$ may be applied to the passive word-line connected to the selected memory cell (1). According to various aspects, the voltage ($V_{FE(B),PAS}$) applied to the corresponding word-line (WL(1B)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE(B),PAS}$) applied to all passive word-lines connected to the non-selected ferroelectric capacitors FE of the selected memory cell (1) of the memory cell arrangement 1000 (in the following also referred to as first inhibit voltage) may be bipolar. For example, the write voltage ($V_{PP}$) may have a positive voltage value and the first inhibit voltage ($V_{FE(B),PAS}$) may have a negative voltage value, or vice versa.

According to various aspects, disturb of the other memory cells 1002 of the memory cell arrangement 1000 may be prevented during reading the selected ferroelectric capacitor FE(A) of the selected memory cell (1).

As an example, to avoid disturb of the memory cell (2) of the memory cell arrangement 1000 during reading the memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 1000 that share the same word-lines (WL(1A), WL(1B)) as the selected memory cell (1). According to various aspects, the voltage ($V_{LE,PAS}$) applied to the corresponding lever-line (LL(2)) may be, for example, in the range from about $V_{SS}$ (e.g., 0 V) to about ½*|$V_G$|. According to an example, the first lever voltage $V_{LE,ACT}$ may be +0.5 V and the second lever voltage $V_{LE,PAS}$ may be 1.0 V.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 1000 (in the following also referred to as second lever voltage) may be bipolar. For example, the first (active) lever voltage ($V_{LE,ACT}$) may have a positive voltage value and the second (passive) lever-voltage ($V_{LE,PAS}$) may have a negative voltage value, or vice versa.

According to various aspects, applying second (passive) lever-voltages ($V_{LE,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, the memory cell arrangement 1000 may include to avoid disturb of non-selected ferroelectric capacitors of non-selected memory cells of the memory cell arrangement 1000 during reading the selected ferroelectric capacitor FE(A) of the selected memory cell (1), a voltage different from $V_G$ may be applied to the passive word-line connected to the ferroelectric capacitor FE of the non-selected memory cells. A voltage ($V_{FE,PAS}$) different from $V_G$ may be applied to all passive word-lines connected to the ferroelectric capacitors FE of the non-selected memory cells of the memory cell arrangement 1000 that do not share the same word-lines (WL(1A), WL(1B)) as the selected memory cell (1). For example, the voltage ($V_{FE,PAS}$) may be applied to the passive wordlines (WL(2A), WL(2B)) of the non-selected memory cells (3), (4). According to various aspects, the voltage ($V_{FE,PAS}$) applied to the corresponding word-lines (WL(2A), WL(2B)) of the non-selected memory cells (3), (4) may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 1000 (in the following also referred to as second inhibit voltage) may be bipolar. For example, the read voltage ($V_G$) may have a positive voltage value and the second inhibit voltage ($V_{FE,PAS}$) may have a negative voltage value, or vice versa.

Further, to avoid disturb of other memory cells (3), (4) of the memory cell arrangement 1000 during reading the selected ferroelectric capacitor FE(A) of the selected memory cell (1), a base voltage (e.g., $V_{SS}$) or a voltage close to the base voltage may be applied to the passive bit-line (BL(2)) connected to the field-effect transistor FT of the non-selected memory cells (3), (4). A voltage that equals the base voltage or that is close to the base voltage may be applied to all passive bit-lines and/or all passive source-lines connected to the field-effect transistors of the non-selected memory cells of the memory cell arrangement 1000 that do not share the same word-lines (WL(1A), WL(1B)) as the selected memory cell (1). In this case, the voltage applied to the corresponding bit-lines and/or source-lines of the non-selected memory cells may be, for example, 0 V or a voltage close to 0 V (e.g., a voltage in the range from about −0.25V to about 0.25 V).

As described exemplarily above, individual NAND cell pairs of the memory cell arrangement 1000 can be read. It is noted that some or all of the voltages described are only examples and that deviations from the described voltages may be possible. According to various aspects, the bulk and source terminals of the transistors of the memory cells 1002 (that includes semiconductor material) may be kept at $V_{SS}$ but the active bit-line potential may be charged to a potential greater than $V_{SS}$ to detect a charge created by the ferroelectric capacitor FE.

Figure 6D:
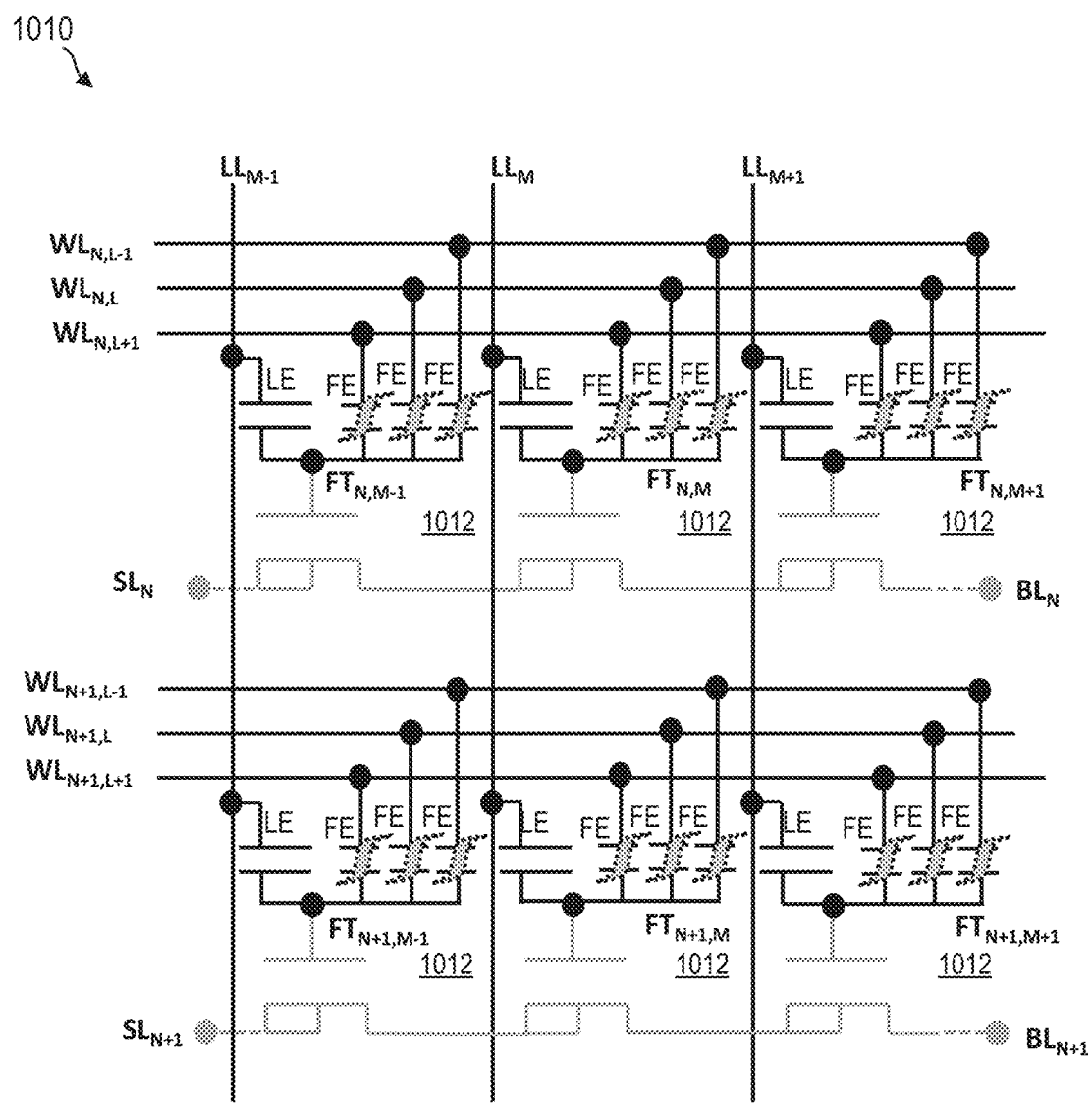
Figure 6E:
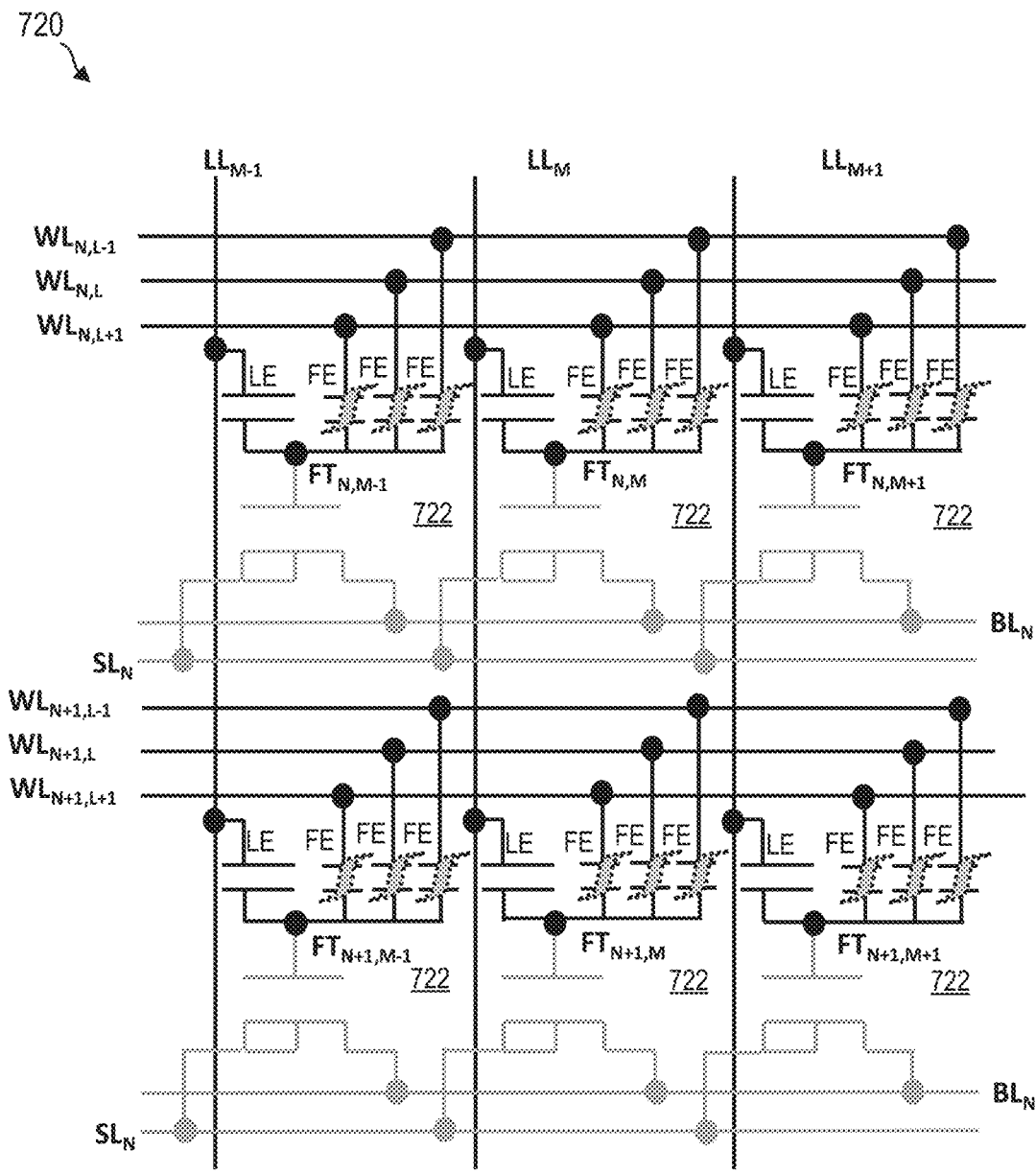
FIG. 6E schematically shows a memory cell arrangement having an AND architecture and including multi-bit memory cells, according to various aspects.

An exemplary configuration of a memory cell arrangement 1010 including six 1T4C memory cells 1012 having a NAND configuration is shown in FIG. 6D. A memory cell 1012 of the memory cell arrangement 1010 may be written and/or read as described with reference to FIG. 6C.

According to various aspects, a plurality of 1TnC memory cells may be organized in an AND architecture. An exemplary configuration of a memory cell arrangement 720 including six 1T4C memory cells 722 having an AND configuration is shown in FIG. 6E. A memory cell 722 of the memory cell arrangement 720 may be written or read in a similar way as described with reference to NOR configurations, wherein further voltages at respective source-lines SL may be applied. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

Figure 7A:
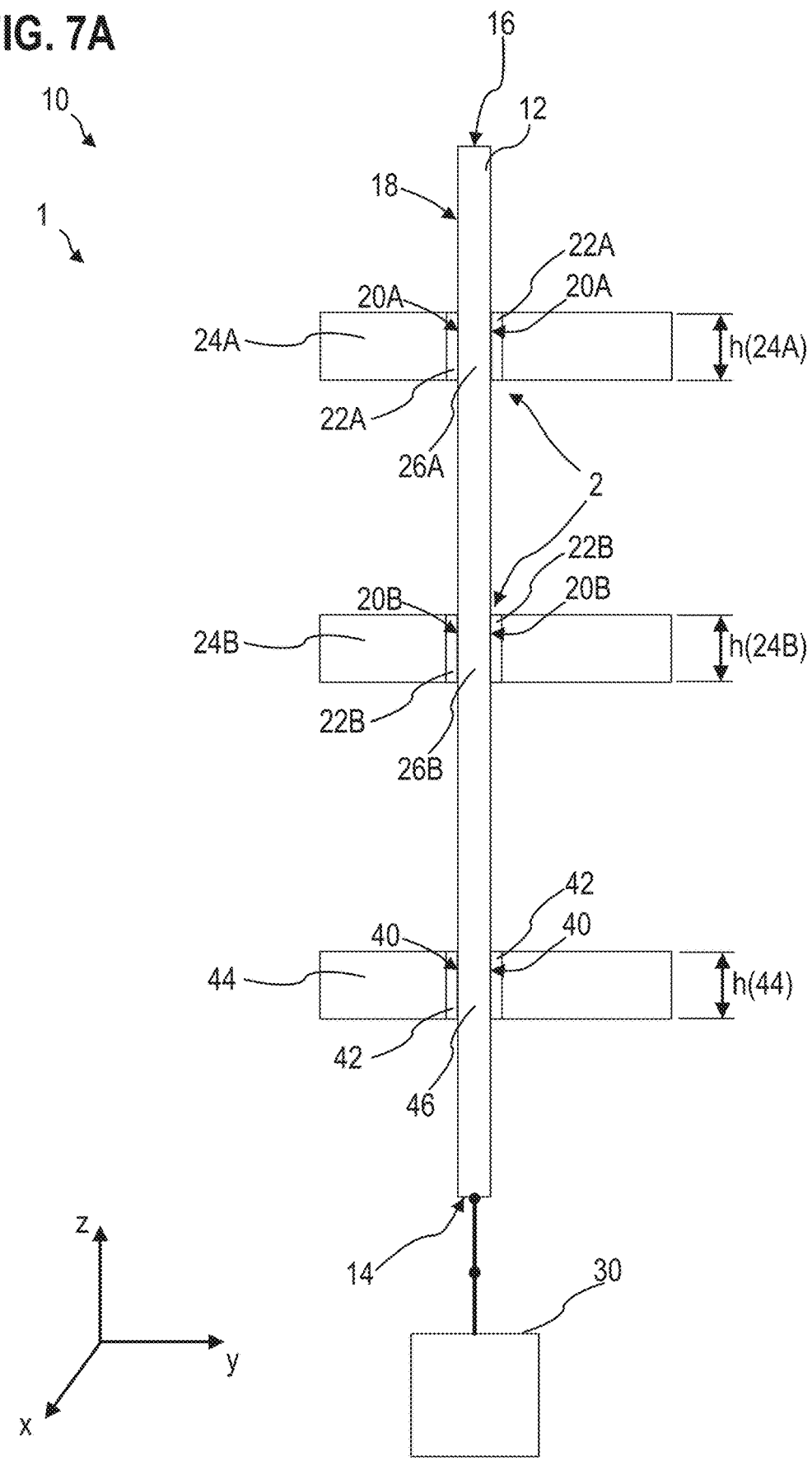
FIGS. 7A to 7E each schematically show an exemplary memory cell arrangement including multi-bit memory cells, according to various aspects.
Figure 7B:
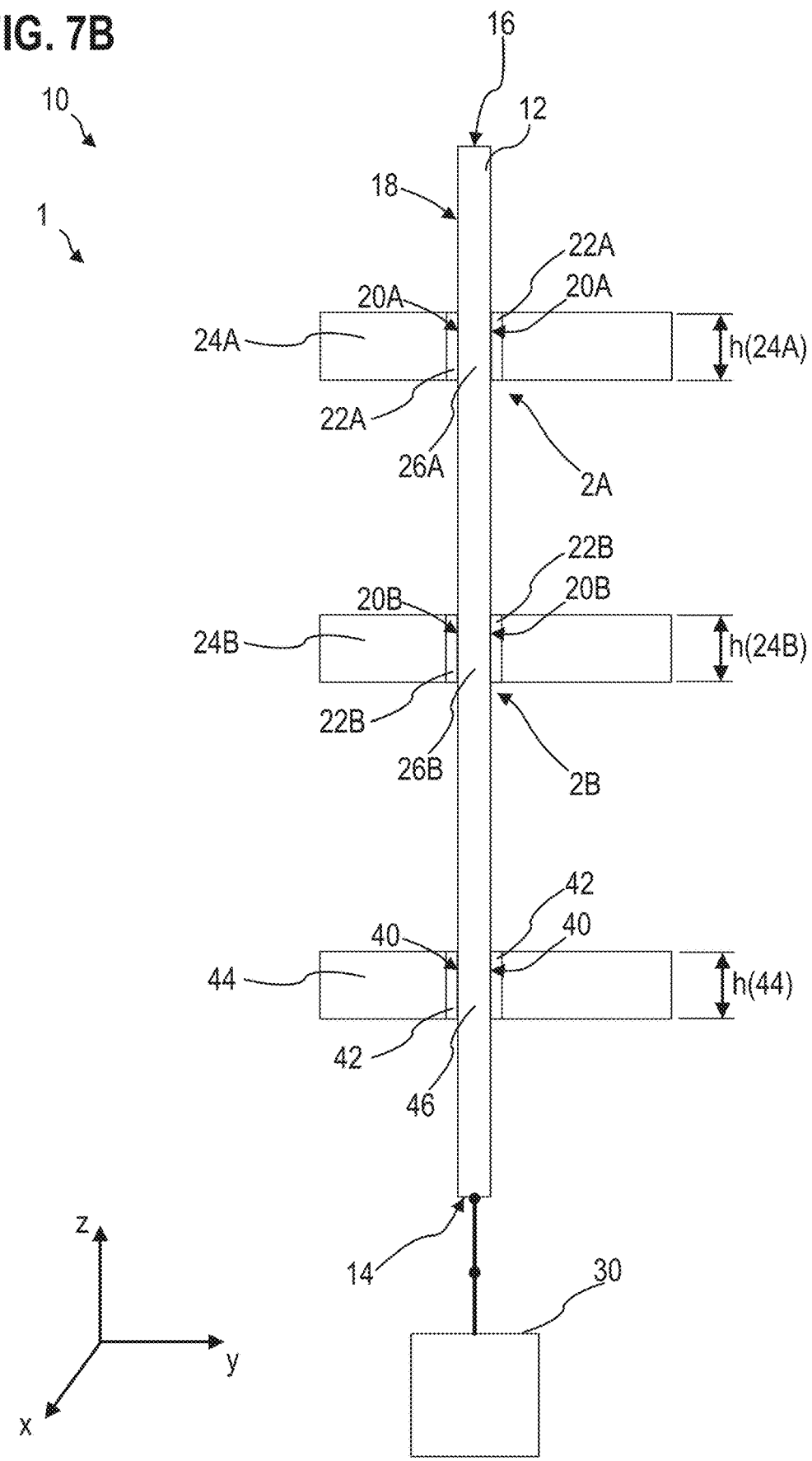

FIG. 7A and FIG. 7B each schematically show the memory cell arrangement 10 including at least one 1T3C memory cell 1, according to various aspects. The memory cell 1 may include the field-effect transistor structure 30, the electrode pillar 12, the second electrode layer 44, and the dielectric material portion 42. The memory cell 1 may further include the first electrode layer 24 (in the following also referred to as first electrode layer 24(A)) and the memory material portion 22 (in the following also referred to as first memory material portion 22(A)). According to various aspects, the memory cell 1 may further include at least one additional electrode layer. The memory cell 1 may include a first additional electrode layer 24B. The first additional electrode layer 24B may be configured substantially similar as described with reference to the first electrode layer 24A. The memory cell 1 may further include a second memory material portion 22B. The second memory material portion 22B may be configured substantially similar as described with reference to the first memory material portion 22A. Illustratively, the memory cell 1 may include a first capacitive memory structure formed by the electrode pillar 12, the first memory material portion 22A, and the first electrode layer 24A and a second capacitive memory structure formed by the electrode pillar 12, the second memory material portion 22B, and the first additional electrode layer 24B.

According to various aspects, the first capacitive memory structure 2 and the second capacitive memory structure 2 may be addressed (e.g., written, e.g., read) together. Illustratively, the first capacitive memory structure 2 and the second capacitive memory structure 2 may provide a redundancy scheme storing the same bit value (see, for example, FIG. 7A).

According to various aspects, the first capacitive memory structure 2A and the second capacitive memory structure 2B may be addressed (e.g., written, e.g., read) independently. In this case, the memory cell 1 may be a multi-bit memory cell storing two bit values (see, for example, FIG. 7B).

Figure 7C:
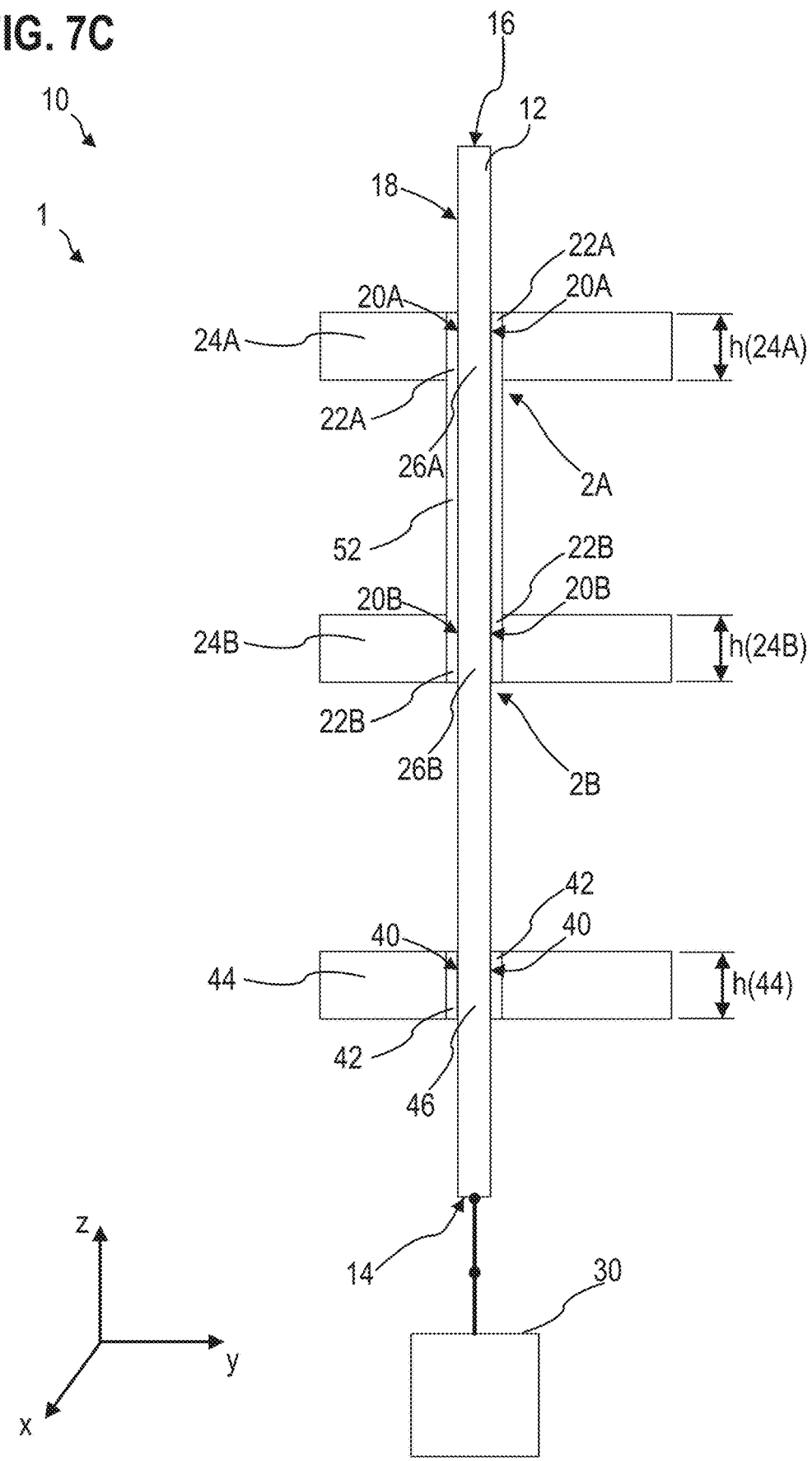

FIG. 7C shows the memory cell arrangement 10 including the memory cell 1 according to various aspects. In this example, the memory cell 1 may further include a memory material layer 52. The memory material layer 52 may substantially continuously surround (e.g., perimeterally surround, e.g., completely perimeterally surround) at least a part of the lateral surface 18 of the electrode pillar 12. The memory material layer 52 may provide the first memory material portion 22A and the second memory material portion 22B.

According to various aspects, the dielectric material portion 42 may include or may consist of a memory material (e.g., a spontaneously-polarizable material). According to various aspects, the memory material layer 52 may provide the first memory material portion 22A, the second memory material portion 22B, and the dielectric material portion 42A. In this case, the height h(44) of the second electrode layer 44 may be greater than the height h(22A) of the first electrode layer 24A and/or the height h(24B) of the first additional electrode layer 24B.

Figure 7D:
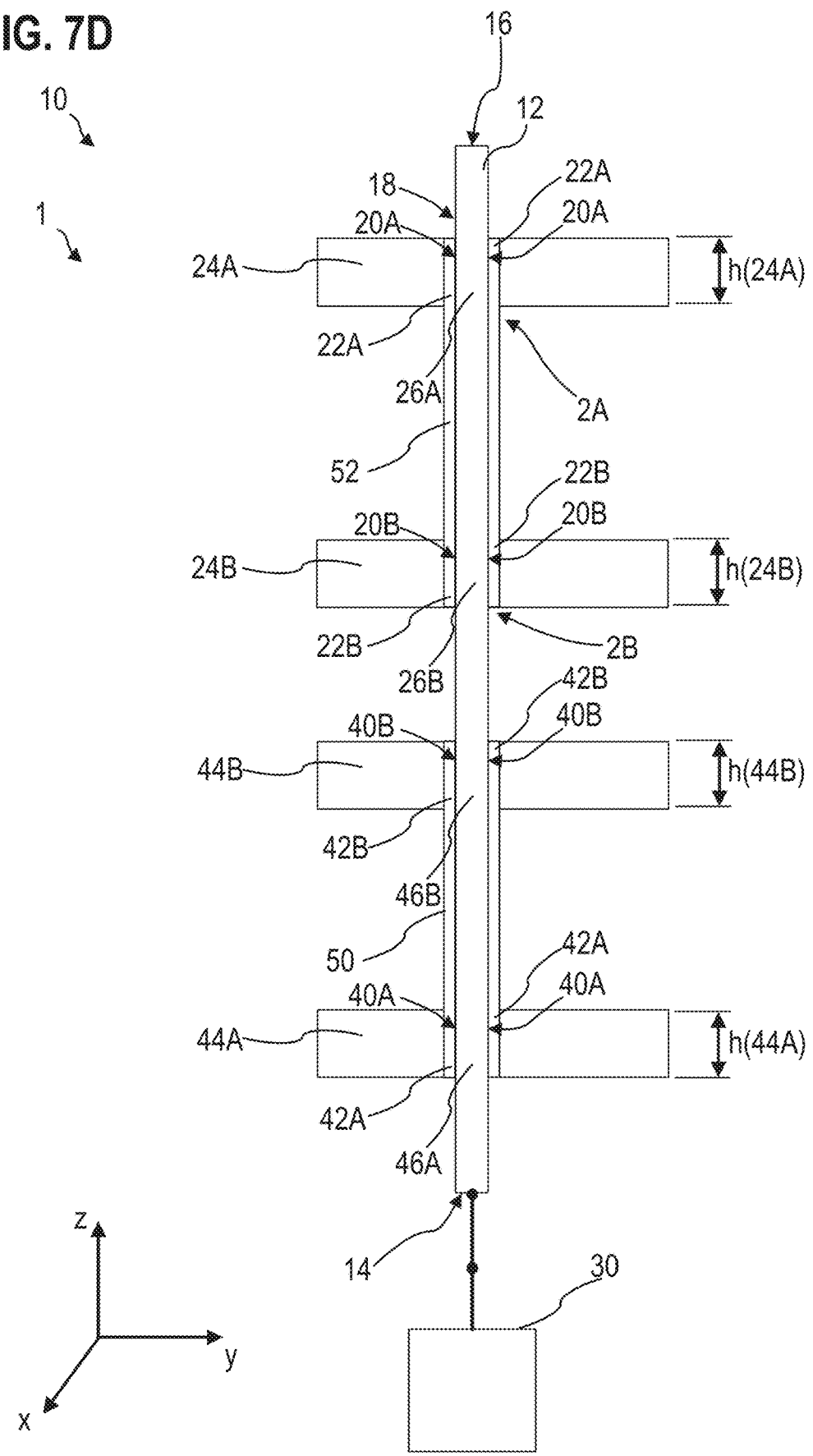

FIG. 7D shows the memory cell arrangement 10 including the memory cell 1 according to various aspects. In this example, the memory cell 1 may further include a second additional electrode layer 44A. The second additional electrode layer 44B may be configured substantially similar as described with reference to the second electrode layer 44 (in the following also referred to as second electrode layer 44A). The memory cell 1 may further include a second dielectric material portion 42B. The second dielectric material portion 42B may be configured substantially similar as described with reference to the dielectric material portion 42 (in the following also referred to as first dielectric material portion 42A).

According to various aspects, the memory cell 1 may include the dielectric material layer 50. The dielectric material layer 50 may provide the first dielectric material portion 42A and the second dielectric material portion 42B (see also, for example, FIG. 3D and description with reference to FIG. 3D).

According to various aspects, the first dielectric material portion 42A and the second dielectric material portion 42B each may include or may consist of a memory material. For example, the memory material layer 52 may provide the first memory material portion 22A, the second memory material portion 22B, the first dielectric material portion 42A, and the second dielectric material portion 42A. Illustratively, the memory material layer 52 may also form the dielectric material layer 50. In this case, at least a sum of the height h(44A) of the second electrode layer 44A and the height h(44B) of the second additional electrode layer 44B may be greater than the height h(24A) of the first electrode layer 24A and may be greater than the height h(24B) of the first additional electrode layer 24B. For example, the height h(44A) of the second electrode layer 44A may be greater than the height h(24A) of the first electrode layer 24A and may be greater than the height h(24B) of the first additional electrode layer 24B. For example, the height h(44B) of the second additional electrode layer 44B may be greater than the height h(24A) of the first electrode layer 24A and may be greater than the height h(24B) of the first additional electrode layer 24B.

Figure 7E:
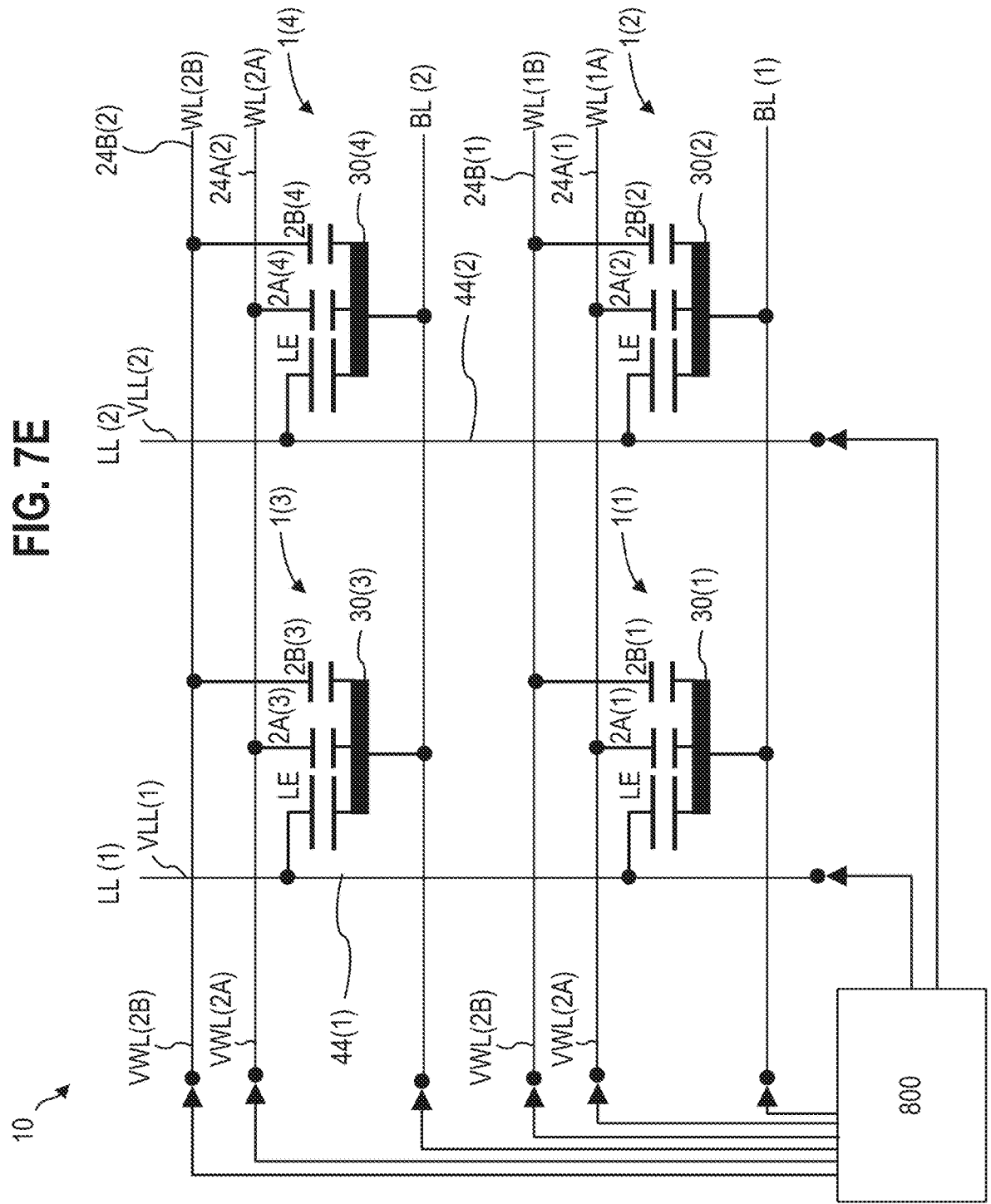

FIG. 7E shows an exemplary configuration of the memory cell arrangement 10 according to various aspects. The memory cell arrangement 10 may include a first memory cell 1(1), a second memory cell 1(2), a third memory cell 1(3), and a fourth memory cell 1(4). Each of the first memory cell 1(1), the second memory cell 1(2), the third memory cell 1(3), and the fourth memory cell 1(4) may be a 1T3C memory cell. Each of the first memory cell 1(1), the second memory cell 1(2), the third memory cell 1(3), and the fourth memory cell 1(4) may be configured as described with reference to FIGS. 7B to 7D. In this example, each memory cell 1(1), 1(2), 1(3), 1(4) may include the first capacitive memory structure 2A, the second capacitive memory structure 2B, and the capacitive lever structure LE.

The memory cell arrangement 10 may include a first common electrode layer 24A(1) providing the first electrode layer 24A of each of the first memory cell 1(1) and the second memory cell 1(2). The memory cell arrangement 10 may include a second common electrode layer 24A(2) providing the first electrode layer 24A of each of the third memory cell 1(3) and the fourth memory cell 1(4). The memory cell arrangement 10 may include a third common electrode layer 24B(1) providing the first additional electrode layer 24B of each of the first memory cell 1(1) and the second memory cell 1(2). The memory cell arrangement 10 may include a fourth common electrode layer 24B(2) providing the first additional electrode layer 24B of each of the third memory cell 1(3) and the fourth memory cell 1(4). The memory cell arrangement 10 may include a fifth common electrode layer 44(1) providing the second electrode layer 44 of each of the first memory cell 1(1) and the third memory cell 1(3). The memory cell arrangement 10 may include a sixth common electrode layer 44(2) providing the second electrode layer 44 of each of the second memory cell 1(2) and the fourth memory cell 1(4).

The memory cell arrangement 10 may include a first set of wordlines WL(1A), WL(1B) connected to the first memory cell 1(1) and the second memory cell 1(2). The first set of memory cells may include a first wordline WL(1A) and a third wordline WL(1B). The first common electrode layer 24A(1) may be electrically conductively connected to the first wordline WL(1). The first common electrode layer 24A(1) may form at least a part of the first wordline WL(1A). The third common electrode layer 24B(1) may be electrically conductively connected to the third wordline WL(1B). The third common electrode layer 24B(1) may form at least a part of the third wordline WL(1B).

The memory cell arrangement 10 may include a second set of wordlines WL(2A), WL(2B) connected to the third memory cell 1(3) and the fourth memory cell 1(4). The second set of memory cells may include a second wordline WL(2A) and a fourth wordline WL(2B). The second common electrode layer 24A(2) may be electrically conductively connected to the second wordline WL(2A). The second common electrode layer 24A(2) may form at least a part of the second wordline WL(2A). The fourth common electrode layer 24B(2) may be electrically conductively connected to the fourth wordline WL(2B). The fourth common electrode layer 24B(2) may form at least a part of the fourth wordline WL(2B).

The memory cell arrangement 10 may include a first leverline LL(1). The fifth common electrode layer 44(1) may be electrically conductively connected to the first leverline LL(1). The fifth common electrode layer 44(1) may form at least a part of the first leverline LL(1). The memory cell arrangement 10 may include a second leverline LL(2). The sixth common electrode layer 44(2) may be electrically conductively connected to the second leverline LL(2). The sixth common electrode layer 44(2) may form at least a part of the second leverline LL(2).

According to various aspects, the control circuit 800 may be configured to apply a first wordline voltage VWL(1A) to the first wordline WL(1A), a second wordline voltage VWL(2A) to the second wordline WL(2A), a third wordline voltage VWL(1B) to the third wordline WL(1B), a fourth wordline voltage VWL(2B) to the fourth wordline WL(2B), a first leverline voltage VLL(1) to the first leverline LL(1), and/or a second leverline voltage VLL(2) to the second leverline LL(2).

According to various aspects, the memory cell arrangement 10 may be organized in a NOR configuration. In this case a selected field-effect transistor structure 2A or 2B of a selected memory cell 1(1), 1(2), 1(3), or 1(4) of the memory cell arrangement 10 may be written or read as described with reference to FIG. 6A. The at least one control circuit 800 may be configured to apply the voltages described with reference to FIG. 6A.

According to various aspects, the memory cell arrangement 10 may be organized in a NAND configuration. In this case a selected field-effect transistor structure 2A or 2B of a selected memory cell 1(1), 1(2), 1(3), or 1(4) of the memory cell arrangement 10 may be written or read as described with reference to FIG. 6C. The at least one control circuit 800 may be configured to apply the voltages described with reference to FIG. 6C.

Herein, various aspects relate to memory cells and memory cell arrangements. A memory cell arrangement may include one or more 1TnC memory cells, each 1TnC memory cell including one transistor (e.g., field-effect transistor structure 30, e.g., field-effect transistor FT) and a number, n, of capacitor structures (in some aspects referred to as capacitive memory structures). The number, n, may be an integer number greater than zero. The number, n, of capacitor structures may be a sum of a number, $n_1$, of lever capacitors (in some aspects referred to as capacitive structures, in some aspects referred to as capacitive lever structures) and a number, $n_2$, of memory capacitors (in some aspects referred to as capacitive memory structures, in some aspects exemplarily referred to as ferroelectric capacitors). The number, $n_1$, of lever capacitors may be an integer number equal to or greater than zero. The number, $n_2$, of memory capacitors may be an integer number greater than zero. In the case that the number, $n_2$, of memory capacitors is equal to or greater than two, the memory cell may be a multi-bit memory cell and may be configured to store more than one bit. According to various aspects, the lever capacitor(s) and/or the memory capacitor(s) may be configures as described for the memory cell arrangement 10 with reference to FIGS. 1A-3D, FIGS. 5A-5F, and FIGS. 7A-7E. According to various aspects, the memory cell arrangement may include a plurality of 1TnC memory cells. For example, the plurality of 1TnC memory cells may be organized in a NOR configuration as described with reference to FIG. 4C, FIG. 4D, FIG. 4G, FIG. 4I, FIG. 6A, and FIG. 6B. For example, the plurality of 1TnC memory cells may be organized in a NAND configuration as described with reference to FIG. 4E, FIG. 4F, FIG. 4H, FIG. 4J, FIG. 6C, and FIG. 6D. For example, the plurality of 1TnC memory cells may be organized in an AND configuration as described with reference to FIG. 4K, FIG. 4K, and FIG. 6E. According to various examples, a memory cell arrangement is provided for $n_1=0$ and $n_2=2$ (i.e., no lever capacitor and two memory capacitors), as described with reference to FIG. 4G, FIG. 4H, and FIG. 5E. According to an example, a memory cell arrangement is provided for $n_1=0$ and $n_2=3$ (i.e., no lever capacitor and three memory capacitors), as described with reference to FIG. 4L. According to various examples, a memory cell arrangement is provided for $n_1=1$ and $n_2=1$ (i.e., one lever capacitor and one memory capacitor), as described with reference to FIGS. 4C-4F, FIGS. 4I-4K, FIG. 5C and FIG. 5D. According to various examples, a memory cell arrangement is provided for $n_1=1$ and $n_2=2$ (i.e., one lever capacitor and two memory capacitors), as described with reference to FIG. 6A, FIG. 6C, and FIG. 7E. According to various examples, a memory cell arrangement is provided for $n_1=1$ and $n_2=3$ (i.e., one lever capacitor and three memory capacitors), as described with reference to FIG. 6B, FIG. 6D, and FIG. 6E.

It is noted that these memory cell arrangements are provided as examples and that a memory cell arrangement may include any kind of 1TnC memory cells having a number of n greater than one.

FIG. 8 shows a schematic flow diagram of a method 1100 for manufacturing a memory cell arrangement, according to various aspects.

The method 1100 may include forming one or more field-effect transistor structures (in 1102).

The method 1100 may include forming an electrode layer stack above the one or more field-effect transistor structures (in 1104). The electrode layer stack may include at least a first electrode layer, a second electrode layer, and an electrically isolating interlayer disposed between the first electrode layer and the second electrode layer.

The method 1100 may include forming one or more recesses (e.g., holes) into the electrode layer stack, each of the one or more corresponding to one of the one or more field-effect transistor structures (in 1006). For example, each recess of the one or more recesses may be formed substantially above the corresponding field-effect transistor structure. According to various aspects, each recess of the one or more recesses may be formed substantially above a gate structure of the corresponding field-effect transistor structure.

The method 1100 may include partially filling one or more recesses with a memory material (e.g., a spontaneously-polarizable material as described herein), wherein the memory material may at least cover a sidewall of each of the one or more recesses (in 1108). According to various aspects, partially filling the one or more recesses with the memory material may include partially filling (e.g., conformally, e.g., such that the memory material has a linear shape) the one or more recesses with the memory material such that the sidewall and a bottom of each of the one or more recesses are covered and subsequently at least partially removing (e.g., completely removing, e.g., etching) the memory material at the bottom of each of the one or more recesses. According to various aspects, partially filling the one or more recesses with the memory material may include completely filling the one or more recesses with the memory material and subsequently partially etching the memory material.

The method 1100 may include at least partially filling a remaining space in each of the one or more recesses with an electrode material (in 1110). According to various aspects, a portion of the memory material may be disposed in each recess of the one or more recesses between a portion of the electrode material and at least one of the first electrode layer and/or the second electrode layer. The electrode material in each of the one or more recesses may be electrically conductively connected to a gate of the field-effect transistor structure of the one or more field-effect transistor structures corresponding to the recess.

FIG. 9 shows a schematic flow diagram of a method 1200 for operating a memory cell arrangement, according to various aspects.

The method 1200 may include applying a control voltage to a first control node selected from a plurality of first control nodes of a memory cell, each of the plurality of first control nodes being connected to a corresponding first capacitor structure of a plurality of first capacitor structures (e.g., a plurality of memory capacitor structures) (in 1202). The control voltage may be a write voltage ($V_{PP}$) and the method 1200 may be a method for writing a memory cell of the memory cell arrangement. The control voltage may be a read voltage ($V_G$) and the method 1200 may be a method for reading a memory cell of the memory cell arrangement.

The method 1200 may include applying a lever voltage to a second control node of the memory cell, the second control node being connected to a second capacitor (e.g., second capacitor structure, e.g., a lever capacitor, e.g., a lever capacitor structure) of the memory cell (in 1204).

The method 1200 may include applying a bit-line voltage to a third control of the memory cell, the third control node being connected to at least one source/drain region of a transistor (e.g., a field-effect transistor structure) of the memory cell (in 1206).

According to various aspects, the method 1200 may optionally further include applying a source-line voltage to a fourth control of the memory cell, the third control node being connected to a first source/drain region of the transistor and the fourth control node being connected to a second source/drain region of the transistor.

In the following, various examples are provided that may include one or more aspects described above with reference to the memory cell arrangement 10, the memory cell arrangement 100, the method 1100 and the method 1200. It may be intended that aspects described in relation to the memory arrangement 10 or memory cell arrangement 100 may apply also to the method 1100 or the method 1200, and vice versa.

Example 1 is a memory cell arrangement including: one or more memory cells, each of the one or more memory cells including: an electrode pillar having a bottom surface and a top surface; a memory material portion surrounding a lateral surface portion of the electrode pillar; an electrode layer surrounding the memory material portion and the lateral surface portion of the electrode pillar, wherein the electrode pillar, the memory material portion, and the electrode layer form a capacitive memory structure; and a field-effect transistor structure including a gate structure, wherein the bottom surface of the electrode pillar faces the gate structure and is electrically conductively connected to the gate structure, and wherein the top surface of the electrode pillar faces away from the gate structure.

In Example 2, the memory cell arrangement of Example 1 may optionally further include a height of the electrode pillar is greater than a width of the electrode pillar.

In Example 3, the memory cell arrangement of Example 1 or 2 may optionally further include that the height of the electrode pillar is defined perpendicular to the bottom surface by a distance between the bottom surface and the top surface and/or that the width of the electrode pillar is defined as an extension of the electrode pillar perpendicular to the height direction (e.g., defined by the geometry of the bottom surface and/or top surface).

In Example 4, the memory cell arrangement of any one of Examples 1 to 3 may optionally further include that the memory material portion perimeterally surrounds the lateral surface portion of the electrode pillar.

In Example 5, the memory cell arrangement of Example 3 may optionally further include that the memory material portion completely perimeterally surrounds the lateral surface portion of the electrode pillar.

In Example 6, the memory cell arrangement of any one of Examples 1 to 5 may optionally further include that the electrode layer perimeterally surrounds the memory material portion.

In Example 7, the memory cell arrangement of Example 6 may optionally further include that wherein the electrode layer completely perimeterally surrounds the memory material portion.

In Example 8, the memory cell arrangement of any one of Examples 1 to 7 may optionally further include that the memory material portion directly contacts the lateral surface portion of the electrode pillar.

In Example 9, the memory cell arrangement of any one of Examples 1 to 8 may optionally further include that the electrode layer directly contacts the memory material portion.

In Example 10, the memory cell arrangement of any one of Examples 1 to 9 may optionally further include that a lateral surface of the memory material portion faces the lateral surface portion of the electrode pillar and may be substantially parallel to the lateral surface portion of the electrode pillar.

In Example 11, the memory cell arrangement of any one of Examples 1 to 10 may optionally further include that a lateral surface of the electrode layer faces the lateral surface portion of the electrode pillar and may be substantially parallel to the lateral surface portion of the electrode pillar. The memory material portion may be disposed between the lateral surface of the electrode layer and the lateral surface portion of the electrode pillar.

In Example 12, the memory cell arrangement of any one of Examples 1 to 11 may optionally further include that a lateral surface of the memory material portion faces the lateral surface portion of the electrode pillar and is substantially coaxial to the lateral surface portion of the electrode pillar.

In Example 13, the memory cell arrangement of any one of Examples 1 to 12 may optionally further include that a lateral surface of the electrode layer faces the lateral surface portion of the electrode pillar and is substantially coaxial to the lateral surface portion of the electrode pillar, wherein the memory material portion is disposed between the lateral surface of the electrode layer and the lateral surface portion of the electrode pillar.

In Example 14, the memory cell arrangement of any one of Examples 1 to 13 may optionally further include that the electrode layer extends within a lateral plane. For example, the electrode layer may have or may include a planar shape. According to various aspects, a highest point of the gate structure may lie in another lateral plane and a vertical distance between the lateral plane the electrode layer extends in and the other lateral plane may be substantially uniform. For example, the gate structure may include a planar top surface facing the electrode layer and the electrode layer may include a planar bottom surface facing the gate structure, wherein the planar top surface of the gate structure and the planar bottom surface of the electrode layer may be parallel. According to various aspects, the electrode layer may be formed directly on a planarized layer.

In Example 15, the memory cell arrangement of any one of Examples 1 to 14 may optionally further include that the electrode layer has a first surface and a second surface opposite the first surface, wherein the first surface and/or the second surface are substantially parallel to a surface of the gate structure.

In Example 16, the memory cell arrangement of any one of Examples 1 to 15 may optionally further include that a vertical distance (e.g., a distance perpendicular to the bottom surface and/or the top surface) between the electrode layer and the gate structure is substantially uniform.

In Example 17, the memory cell arrangement of any one of Examples 1 to 16 may optionally further include that a distance between the bottom surface of the electrode pillar and the gate structure is smaller than a distance between the top surface of the electrode pillar and the gate structure.

In Example 18, the memory cell arrangement of any one of Examples 1 to 17 may optionally further include that the electrode layer is substantially planar.

In Example 19, the memory cell arrangement of any one of Examples 1 to 18 may optionally further include a substrate having a lateral dimension, wherein the electrode layer extends substantially parallel to the lateral dimension of the substrate.

In Example 20, the memory cell arrangement of Example 19 may optionally further include that the electrode pillar extends substantially perpendicular to the lateral dimension of the substrate.

In Example 21, the memory cell arrangement of any one of Examples 1 to 20 may optionally further include a substrate having a lateral direction and a vertical direction and that the electrode layer extends in the lateral direction of the substrate and/or that the electrode pillar extends in the vertical direction of the substrate.

In Example 22, the memory cell arrangement of any one of Examples 1 to 21 may optionally further include a chip having a chip surface, wherein the electrode layer is disposed one of above or over the chip surface substantially parallel to the chip surface.

In Example 23, the memory cell arrangement of any one of Examples 1 to 22 may optionally further include that the electrode pillar extends substantially perpendicular to the chip surface.

In Example 24, the memory cell arrangement of any one of Examples 1 to 23 may optionally further include one or more metallization layers extending substantially parallel to the electrode layer.

In Example 25, the memory cell arrangement of any one of Examples 1 to 24 may optionally further include a common electrode layer providing the respective electrode layer of each of the one or more memory cells.

In Example 26, the memory cell arrangement of any one of Examples 1 to 25 may optionally further include that the bottom surface and/or the top surface of the electrode pillar have/has or include/includes a geometry of one of the following: a circle, a triangle, a square, a parallelogram, a trapezoid, an ellipse, a polygon, etc.

In Example 27, the memory cell arrangement of any one of Examples 1 to 26 may optionally further include that the electrode pillar has a shape of a cylinder (e.g., circular cylindrical, e.g., truncated cylindrical, e.g., a prism) or a frustum (e.g., a frustum of a pyramid, e.g., a frustum of a cone).

In Example 28, the memory cell arrangement of any one of Examples 1 to 27 may optionally further include that the electrode layer is a first electrode layer and that the lateral surface portion of the electrode pillar is a first lateral surface portion of the electrode pillar. Each memory cell may further include: a dielectric material portion surrounding a second lateral surface portion of the electrode pillar different from the first lateral surface portion; and a second electrode layer surrounding the dielectric material portion and the second lateral surface portion of the electrode pillar, wherein the electrode pillar, the dielectric material portion, and the second electrode layer form a capacitive structure (e.g., a capacitive lever structure, e.g., a capacitive memory structure).

In Example 29, the memory cell arrangement of Example 28 may optionally further include that the first electrode layer extends in or along a first direction and wherein the second electrode layer extends in or along a second direction different from the first direction (e.g., the first electrode layer and the second electrode layer extending in an angle with respect to each other of about 45° or more).

In Example 30, the memory cell arrangement of any one of Examples 28 or 29 may optionally further include that the first electrode layer extends in a first plane along a first direction and that the second electrode layer extends in a second plane along a second direction different from the first direction, wherein the first plane is parallel to the second plane.

In Example 31, the memory cell arrangement of any one of Examples 28 to 30 may optionally further include that the first electrode layer and the second electrode layer of each of the one or more memory cells is electrically conductively connected to a corresponding control line of a plurality of control lines to allow for an (e.g., selective) addressing of one or more memory cells corresponding to the first electrode layer (e.g., during a read operation and/or a write operation).

In Example 32, the memory cell arrangement of any one of Examples 28 to 30 may optionally further include that each of the first electrode layer and the second electrode layer forms at least part of a corresponding control line.

In Example 33, the memory cell arrangement of any one of Examples 28 to 32 may optionally further include that the one or more memory cells are a plurality of memory cells and that the memory cell arrangement further includes: one or more first control lines (WL), wherein each first control line of the one or more first control lines is connected to the first electrode layer of a first subset of memory cells of the plurality of memory cells; and one or more second control lines (LL), wherein each second control line of the one or more second control lines is connected to the second electrode layer of a second subset of memory cells of the plurality of memory cells.

In Example 34, the memory cell arrangement of any one of Examples 28 to 33 may optionally further include that the memory material portion directly contacts the first lateral surface portion of the electrode pillar.

In Example 35, the memory cell arrangement of any one of Examples 28 to 34 may optionally further include that the dielectric material portion directly contacts the second lateral surface portion of the electrode pillar.

In Example 36, the memory cell arrangement of Examples 34 and 35 may optionally further include that a contact area of the memory material portion and the first lateral surface portion is greater than a contact area of the dielectric material portion and the second lateral surface portion.

In Example 37, the memory cell arrangement of any one of Examples 28 to 36 may optionally further include that the capacitive memory structure has a first effective capacitor area defined by the first electrode layer and wherein the capacitive structure has a second effective capacitor area defined by the second electrode layer, wherein the second effective capacitor area is different from the first effective capacitor area.

In Example 38, the memory cell arrangement of any one of Examples 28 to 37 may optionally further include that the memory material portion directly contacts the first lateral surface portion of the electrode pillar.

In Example 39, the memory cell arrangement of any one of Examples 28 to 38 may optionally further include that the dielectric material portion directly contacts the second lateral surface portion of the electrode pillar.

In Example 40, the memory cell arrangement of Examples 38 and 39 may optionally further include that a contact area of the dielectric material portion and the second lateral surface portion is greater than a contact area of the memory material portion and the first lateral surface portion.

In Example 41, the memory cell arrangement of any one of Examples 28 to 40 may optionally further include that the first electrode layer directly contacts the memory material portion.

In Example 42, the memory cell arrangement of any one of Examples 28 to 41 may optionally further include that the second electrode layer directly contacts the dielectric material portion.

In Example 43, the memory cell arrangement of Examples 41 and 42 may optionally further include that a contact area of the first electrode layer and the memory material portion is greater than a contact area of the second electrode layer and the dielectric material portion.

In Example 44, the memory cell arrangement of any one of Examples 28 to 43 may optionally further include that the first electrode layer directly contacts the memory material portion.

In Example 45, the memory cell arrangement of any one of Examples 28 to 44 may optionally further include that the second electrode layer directly contacts the dielectric material portion.

In Example 46, the memory cell arrangement of Examples 44 and 45 may optionally further include that a contact area of the second electrode layer and the dielectric material portion is greater than a contact area of the first electrode layer and the memory material portion.

In Example 47, the memory cell arrangement of any one of Examples 28 to 46 may optionally further include that the memory material portion is a first memory material portion; and that the dielectric material portion includes a dielectric memory material (e.g., is a dielectric memory material) and is configured as a second memory material portion.

In Example 48, the memory cell arrangement of Example 47 may optionally further include a memory material layer (e.g., perimeterally) substantially continuous surrounding at least a part of a lateral surface of the electrode pillar, wherein the memory material layer provides the first memory material portion and the second memory material portion.

In Example 49, the memory cell arrangement of any one of Examples 28 to 48 may optionally further include a common second electrode layer providing the respective second electrode layer of each of the one or more memory cells.

In Example 50, the memory cell arrangement of any one of Examples 28 to 30 may optionally further include one or more additional dielectric material portions, each of the one or more additional dielectric material portions surrounding a respective lateral surface portion of the electrode pillar different from one another; one or more additional electrode layers, each of the one or more additional electrode layers surrounding a corresponding dielectric material portion of the one or more dielectric material portions and the respective lateral surface portion of the electrode pillar associated with the corresponding dielectric material portion; wherein the one or more additional electrode layers, the one or more dielectric material portions, and the electrode pillar form a capacitive structure (e.g., a capacitive lever structure, e.g., a capacitive memory structure).

In Example 51, the memory cell arrangement of any one of Examples 28 to 50 may optionally further include that all of the electrode layers are spaced apart from one another.

In Example 52, the memory cell arrangement of any one of Examples 28 to 51 may optionally further include that all of the electrode pillars are spaced apart from one another.

In Example 53, the memory cell arrangement of any one of Examples 28 to 52 may optionally further include at least one interlayer disposed between two adjacent electrode layers of the electrode layers (the additional electrode layers, the first electrode layer, the second electrode layer).

In Example 54, the memory cell arrangement of any one of Examples 28 to 53 can optionally include that all of the electrode pillars are physically separated (and/or electrically isolated) from all of the electrode layers.

In Example 55, the memory cell arrangement of any one of Examples 28 to 54 can optionally include that all of the electrode layers are physically separated (and/or electrically isolated) from one another, and/or all of the electrode pillars are physically separated (and/or electrically isolated) from one another.

In Example 56, the memory cell arrangement of any one of Examples 28 to 55 can optionally include that each electrode layer includes or consists of a metal or metal alloy (e.g., Cu, Au, Ag, W, Al, Ru, Ti, TiN, Ta, TaN, Co, CoN, Nb, NbN, Pd, Pt, Ir, IrO2, RuO2, etc.).

In Example 57, the memory cell arrangement of any one of Examples 28 to 56 can optionally include that each electrode pillar includes or consists of a metal or metal alloy (e.g., Cu, Au, Ag, W, Al, Ru, Ti, TiN, Ta, TaN, Co, CoN, Nb, NbN, Pd, Pt, Ir, IrO2, RuO2, etc.).

Example 58 is a memory cell arrangement including: one or more memory cells, each of the one or more memory cells including: an electrode pillar extending from a bottom surface of the electrode pillar to a top surface of the electrode pillar; one or more memory material portions, each of the one or more memory material portions surrounding a respective first lateral surface portion of the electrode pillar; one or more first electrode layers, each of the one or more first electrode layers surrounding a corresponding memory material portion of the one or more memory material portions and the first lateral surface portion of the electrode pillar associated with the corresponding memory material portion; wherein each of the first electrode layers, the corresponding memory material portion, and the electrode pillar form a respective capacitive memory structure; a dielectric material portion surrounding a second lateral surface portion of the electrode pillar different from each of the first lateral surface portions; a second electrode layer surrounding the dielectric material portion and the second lateral surface portion of the electrode pillar, wherein the electrode pillar, the dielectric material portion, and the second electrode layer form a capacitive lever structure; and a field-effect transistor structure including a gate structure, wherein the gate structure faces the bottom surface of the electrode pillar and is electrically conductively connected to the electrode pillar.

According to various Examples, the memory cell arrangement of Example 58 may be configured as described before, e.g., with reference to Example 1 to 57.

Example 59 is a memory cell arrangement including: a first memory cell, a second memory cell, a third memory cell, and a fourth memory cell, each of the first memory cell, the second memory cell, the third memory cell, and the fourth memory cell including: an electrode pillar extending from a bottom surface of the electrode pillar to a top surface of the electrode pillar; a memory material portion surrounding a respective first lateral surface portion of the electrode pillar; a dielectric material portion surrounding a respective second lateral surface portion of the electrode pillar different from the first lateral surface portion; a field-effect transistor structure including a gate structure, wherein the gate structure faces the bottom surface of the electrode pillar and is electrically conductively connected to the electrode pillar. The memory cell arrangement may further include: a first electrode layer surrounding the memory material portion and the first lateral surface portion of the electrode pillar associated with the first memory cell and surrounding the memory material portion and the first lateral surface portion of the electrode pillar associated with the second memory cell, wherein the respective electrode pillar, the respective memory material portion, and the first electrode layer form a respective capacitive memory structure; a second electrode layer surrounding the memory material portion and the first lateral surface portion of the electrode pillar associated with the third memory cell and surrounding the memory material portion and the first lateral surface portion of the electrode pillar associated with the fourth memory cell, wherein the respective electrode pillar, the respective memory material portion, and the second electrode layer form a respective capacitive memory structure; a third electrode layer surrounding the dielectric material portion and the second lateral surface portion of the electrode pillar associated with the first memory cell and surrounding the dielectric material portion and the second lateral surface portion of the electrode pillar associated with the third memory cell, wherein the respective electrode pillar, the respective dielectric material portion, and the third electrode layer form a respective capacitive structure (e.g., a respective capacitive memory structure); and a fourth electrode layer surrounding the dielectric material portion and the second lateral surface portion of the electrode pillar associated with the second memory cell and surrounding the dielectric material portion and the second lateral surface portion of the electrode pillar associated with the fourth memory cell, wherein the respective electrode pillar, the respective dielectric material portion, and the fourth electrode layer form a respective capacitive structure.

In Example 60, the memory cell arrangement of Example 59 can optionally include that a first wordline electrically conductively connected to the first electrode layer, a second wordline electrically conductively connected to the second electrode layer, a first leverline electrically conductively connected to the third electrode layer, and a second leverline electrically conductively connected to the fourth electrode layer.

In Example 61, the memory cell arrangement of Example 59 can optionally include that a first wordline electrically conductively connected to the first electrode layer, a second wordline electrically conductively connected to the second electrode layer, a third wordline electrically conductively connected to the third electrode layer, and a fourth wordline electrically conductively connected to the fourth electrode layer.

In Example 62, the subject matter of any one of Examples 1 to 61 can optionally include that the memory material portion includes or consists of a spontaneous polarizable material.

In Example 63, the subject matter of Example 62 can optionally include that the spontaneous polarizable material is a remanent-polarizable material (e.g., a ferroelectric material). The remanent-polarizable material may include a first polarization state with a first residual polarization and a second polarization state with a second residual polarization.

In Example 64, the subject matter of Example 63 can optionally include that the remanent-polarizable material includes or consists of (e.g., ferroelectric) hafnium oxide, (e.g., ferroelectric) zirconium oxide, or a mixture of hafnium oxide and zirconium oxide.

In Example 65, the subject matter of Example 62 can optionally include that the spontaneous polarizable material is an antiferroelectric material.

In Example 66, the memory cell of any one of Examples 1 to 65 may optionally further include that the memory material portion includes or consists of a material having a first relative permittivity and that the dielectric material portion includes or consists of a material having a second relative permittivity different from the first relative permittivity.

Example 67 is a method, e.g., a method for manufacturing a memory cell arrangement, the method including: forming one or more field-effect transistor structures; forming an electrode layer stack above the one or more field-effect transistor structures, wherein the electrode layer stack includes at least a first electrode layer, a second electrode layer, and an electrically isolating interlayer disposed between the first electrode layer and the second electrode layer; forming one or more recesses into the electrode layer stack, each of the one or more recesses corresponding to one of the one or more field-effect transistor structures, wherein the one or more recesses extend at least through the first electrode layer, the electrically isolating interlayer, and the second electrode layer; partially filling the one or more recesses with a memory material, the memory material at least covering a sidewall of each of the one or more recesses; and, subsequently; and at least partially filling a remaining space in each of the one or more recesses with an electrode material, wherein, in each of the one or more recesses, a portion of the memory material is disposed between a portion of the electrode material and at least one of the first electrode layer and/or the second electrode layer, wherein the electrode material in each of the one or more recesses is electrically conductively connected to a gate of a field-effect transistor structure of the one or more field-effect transistor structures corresponding to the recess.

In Example 68, the method of Example 67 may optionally further include that the memory material is a spontaneously-polarizable material (e.g., a remanent-polarizable material).

Example 69 is a memory cell, including: a field-effect transistor structure; a first control node and a second control node, a first capacitor structure including a first electrode connected to the first control node, a second electrode connected to a gate region of the field-effect transistor structure, and a remanent-polarizable region disposed between the first electrode and the second electrode of the first capacitor structure; and a second capacitor structure (e.g., a lever capacitor structure) including a first electrode connected to the second control node, a second electrode connected to the gate region of the field-effect transistor structure. The first capacitor structure may have a first capacitance and the second capacitor structure may have a second capacitance different from the first capacitance. An electrically isolating region may be disposed between the first electrode and the second electrode of the second capacitor structure.

In Example 70, the memory cell of Example 69 may optionally further include: a third control node (e.g., a first source/drain node) coupled to a first region (e.g., to a first source/drain region) of the field-effect transistor structure and a fourth control node (e.g., a second source/drain node) coupled to a second region (e.g., to a second source/drain region) of the field-effect transistor structure.

In Example 71, the memory cell of Example 69 or 70 may optionally further include that the second capacitance is greater than the first capacitance. The second capacitance may be greater than two times the first capacitance. The second capacitance may be greater than five times or ten times the first capacitance. The second capacitance may be less than fifty times or less than thirty times the first capacitance.

In Example 72, the memory cell of any one of Examples 69 to 71 optionally further include that the first capacitor structure has a first effective capacitor area and that the second capacitor structure has a second effective capacitor area different from the first effective capacitor area.

In Example 73, the memory cell of any one of Examples 69 to 72 may optionally further include that the two electrodes of the first capacitor structure have a first distance from each other and wherein the two electrodes of the second capacitor structure have a second distance from each other different from the first distance.

In Example 74, the memory cell of any one of Examples 69 to 73 may optionally further include that the remanent-polarizable region of the first capacitor structure includes or consists of a first material and wherein the electrically isolating region of the second capacitor structure includes or consists of a second material different from the first material.

In Example 75, the memory cell of any one of Examples 69 to 74 may optionally further include that the remanent-polarizable region of the first capacitor structure includes or consists of a material having a first relative permittivity and wherein the electrically isolating region of the second capacitor structure includes or consists of a material having a second relative permittivity different from the first relative permittivity.

In Example 76, the memory cell of any one of Examples 69 to 75 may optionally further include that the remanent-polarizable region is in direct physical contact with both the first electrode of the first capacitor structure and the second electrode of the first capacitor structure.

In Example 77, the memory cell of any one of Examples 69 to 76 may optionally further include that the electrically isolating region includes or consists of a dielectric material.

In Example 78, the memory cell of any one of Examples 69 to 77 may optionally further include that the electrically isolating region is free of a remanent-polarizable material.

In Example 79, the memory cell of any one of Examples 69 to 78 may optionally further include that the electrically isolating region is in direct physical contact with both the first electrode of the second capacitor structure and the second electrode of the second capacitor structure.

In Example 80, the memory cell of any one of Examples 69 to 79 may optionally further include that the second capacitor structure is a three-dimensional capacitor structure. The three-dimensional capacitor structure may include at least one curved and/or angled portion.

In Example 81, the memory cell of any one of Examples 69 to 80 may optionally further include that the second capacitor structure includes a plurality of capacitors coupled in parallel with one another.

In Example 82, the memory cell of any one of Examples 69 to 81 may optionally further include that the field-effect transistor structure has a third capacitance associated therewith, and that the second capacitance is greater than the third capacitance. The second capacitance may be greater than two times the third capacitance. The second capacitance may be greater than five times the third capacitance. The second capacitance may be greater than ten times the third. The second capacitance may be less than fifty times or less than thirty times the third capacitance.

In Example 83, the memory cell of any one of Examples 69 to 82 may optionally further include that the field-effect transistor structure has a third capacitance, and that the sum of the second capacitance and the third capacitance is greater than the first capacitance. The sum of the second capacitance and the third capacitance may be greater than two times the first capacitance. The sum of the second capacitance and the third capacitance may be greater than five times the first capacitance. The sum of the second capacitance and the third capacitance may be greater than ten times the first capacitance. The sum of the second capacitance and the third capacitance may be less than fifty times or thirty times the first capacitance.

In Example 84, the memory cell of any one of Examples 69 to 83 may optionally further include that the second capacitor structure is configured as a linear capacitor. The linear capacitor may have a linear dependence in the current-voltage-characteristics, i.e. a linear I-V-curve.

Example 85 is a memory cell arrangement, including: a plurality of memory cells, each memory cell of the plurality of memory cells is configured as the memory cell of any one of Examples 69 to 84; the memory cell arrangement may further include one or more first control-lines (e.g., word-lines) connected to the first control node of each memory cell of one or more first subsets of memory cells of the plurality of memory cells; and one or more second control-lines (e.g., lever-lines) connected to the second control node of each memory cell of one or more second subsets of memory cells of the plurality of memory cells.

Example 86 is a memory cell arrangement, including: a plurality of memory cells, each memory cell of the plurality of memory cells including: a field-effect transistor structure; a first control node; a first capacitor structure connected to the first control node and a gate region of the field-effect transistor; a second control node; and a second capacitor structure connected to the second control node and the gate region of the field-effect transistor; one or more first control-lines (e.g., word-lines) connected to the first control node of each memory cell of one or more first subsets of memory cells of the plurality of memory cells; and one or more second control-lines (e.g., lever-lines, e.g., other word-lines) connected to the second control node of each memory cell of one or more second subsets of memory cells of the plurality of memory cells. Each first subset of the one or more first subsets of memory cells may be different (not equal, i.e., not including the same memory cells) from each subset of the one or more second subset of memory cells.

In Example 87, the memory cell arrangement of Example 85 or 86 may optionally further include that the memory cells of the plurality of memory cells are in a NOR configuration.

In Example 88, the memory cell arrangement of Example 87 may optionally further include that each memory cell of the plurality of memory cells further includes: a third control node (e.g., a first source/drain node) coupled to a first region (e.g., to a first source/drain region) of the field-effect transistor structure and a fourth control node (e.g., a second source/drain node) coupled to a second region (e.g., to a second source/drain region) of the field-effect transistor structure.

In Example 89, the memory cell arrangement of Example 87 or 88 may optionally further include: one or more third control-lines (e.g., bit-lines) connected to the third control node of each memory cell of the one or more first subsets of memory cells. Each third control-line of the one or more third control-lines may connect the first regions of each memory cell of the respective first subset of memory cells.

In Example 90, the memory cell arrangement of any one of Examples 87 to 89 may optionally further include that the fourth control node of each memory cell of the plurality of memory cells is connected to a common control node (e.g., a common source-node).

In Example 91, the memory cell arrangement of any one of Examples 87 to 90 may optionally further include a control circuit configured to write a selected memory cell of the plurality of memory cells. Writing the selected memory cell may include providing a write-voltage (e.g., $V_{FE,ACT}=V_{PP}$) to a first control-line (e.g., a word-line) connected to the first control node of the selected memory cell. Writing the selected memory cell may include providing a first (active) lever-voltage (e.g., $V_{LE,ACT}=V_{SS}$) to a second control-line (e.g., a lever-line) connected to the second control node of the selected memory cell. The voltage value of the write-voltage (e.g., $V_{FE,ACT}=V_{PP}$) may be different from the voltage value of the first (active) lever-voltage (first $V_{LE,ACT}=V_{SS}$).

In Example 92, the memory cell arrangement of Example 91 may optionally include that a voltage value of the write-voltage (e.g., $V_{FE,ACT}=V_{PP}$) and a voltage value of the first (active) lever-voltage ($|V_{LE,ACT}|$) may be bipolar (e.g., of opposite sign). The write-voltage (e.g., $V_{FE,ACT}=V_{PP}$)

may have a positive voltage value and the first (active) lever-voltage ($V_{LE,ACT}$) may have a negative voltage value, or vice versa.

In Example 93, the memory cell arrangement of Example 87 and Example 91 or 92 may optionally further include that writing the selected memory cell further includes: providing a first control-voltage ($V_{BL,ACT}=V_{SS}$) to a third control-line (e.g., a bit-line) connected to the third control node of the selected memory cell.

In Example 94, the memory cell arrangement of any one of Examples 93 may optionally further include that the absolute voltage value of the write-voltage (e.g., $|V_{FE,ACT}|=|V_{PP}|$) is greater than the absolute voltage value of the first control-voltage (e.g., $|V_{BL,ACT}|=|V_{SS}|$).

In Example 95, the memory cell arrangement of Example 93 or 94 may optionally further include that the voltage value of the first control-voltage (e.g., $|V_{BL,ACT}|=|V_{SS}|$) is substantially equal to a base-voltage (e.g., $V_{SS}=0$ V).

In Example 96, the memory cell arrangement of Example 91 and any one of Examples 92 to 95 may optionally further include that writing the selected memory cell further includes: providing a second control-voltage ($V_{SL,ACT}=V_{SS}$) to the common control node (e.g., the common source-node).

In Example 97, the memory cell arrangement of Example 96 may optionally further include that the absolute voltage value of the write-voltage (e.g., $|V_{FE,ACT}|=|V_{PP}|$) is greater than the absolute voltage value of the second control-voltage (e.g., $|V_{SL,ACT}|=|V_{SS}|$).

In Example 98, the memory cell arrangement of Example 96 or 97 may optionally further include that the voltage value of the second control-voltage (e.g., $|V_{SL,ACT}|=|V_{SS}|$) is substantially equal to a base-voltage (e.g., $V_{SS}=0$ V).

In Example 99, the memory cell arrangement of any one of Examples 91 to 98 may optionally further include that the absolute voltage value of the write-voltage (e.g., $|V_{FE,ACT}|$ $|V_{PP}|$) is greater than the absolute voltage value of the first (active) lever-voltage (e.g., $|V_{LE,ACT}|$ $|V_{SS}|$).

In Example 100, the memory cell arrangement of any one of Examples 91 to 99 may optionally further include that a second (passive) lever-voltage (e.g., $|V_{LE,PAS}|$) is applied to all second control-lines connected to the (lever) capacitors of the non-selected memory cells of the memory cell arrangement that share the same first control line as the selected memory cell. The absolute voltage value of the second (passive) lever-voltage (e.g., $|V_{LE,PAS}|$) may be equal to or greater than the base-voltage (e.g., $|V_{FE,ACT}| \geq V_{SS}$).

In Example 101, the memory cell arrangement of any one of Examples 91 to 100 may optionally further include that the voltage value of the first (active) lever-voltage (e.g., $V_{LE,ACT}=V_{SS}$) is equal or substantially equal to a base-voltage (e.g., $V_{SS}=0$ V). The absolute voltage value of the first (active) lever-voltage (e.g., $|V_{LE,ACT}|$) may be equal to or less than the half of the absolute voltage value of the write-voltage (e.g., $|V_{FE,ACT}|=\frac{1}{2}*|V_{PP}|$).

In Example 102, the memory cell arrangement of any one of Examples 91 to 101 may optionally further include that the control circuit is further configured to prevent a writing of one or more non-selected memory cells of the plurality of memory cells during writing the selected memory cell. Prevent a writing of one or more non-selected memory cells may include providing a second (passive) lever-voltage ($V_{LE,PAS}$) to a second control-line (e.g., a lever-line) connected to the second control node of the non-selected memory cell in the case that the write-voltage (e.g., $V_{FE,ACT}=V_{PP}$) is provided to the first control-line (e.g., a word-line) connected to the first control node of the non-selected memory cell. The voltage value of the second (passive) lever-voltage ($V_{LE,PAS}$) may be different from the voltage value of the first (active) lever-voltage (e.g., $V_{LE,ACT}=V_{SS}$).

In Example 103, the memory cell arrangement of Example 102 may optionally include that a voltage value of the first (active) lever-voltage ($|V_{LE,ACT}|$) and a voltage value of the second (passive) lever-voltage ($V_{LE,PAS}$) may be bipolar (e.g., of opposite sign). The first (active) lever-voltage ($V_{LE,ACT}$) may have a positive voltage value and the second (passive) lever-voltage ($V_{LE,PAS}$) may have a negative voltage value, or vice versa.

In Example 104, the memory cell arrangement of Example 102 or 103 may optionally further include that the absolute voltage value of the second (passive) lever-voltage ($|V_{LE,PAS}|$) is equal to or less than the absolute voltage value of the write-voltage (e.g., $|V_{FE,ACT}|=|V_{PP}|$); and/or that the absolute voltage value of the second (passive) lever-voltage ($|V_{LE,PAS}|$) is equal to or greater than the half of the absolute voltage value of the write-voltage (e.g., $|V_{FE,ACT}|/2=|V_{PP}|/2$).

In Example 105, the memory cell arrangement of any one of Examples 91 to 104 may optionally further include that the control circuit is further configured to prevent a writing of one or more non-selected memory cells of the plurality of memory cells during writing the selected memory cell. Prevent a writing of one or more non-selected memory cells may include providing an inhibit-voltage ($V_{FE,PAS}$) to a first control-line (e.g., a word-line) connected to the first control node of the non-selected memory cell. The voltage value of the inhibit-voltage value ($V_{FE,PAS}$) may be different from the voltage value of the write-voltage (e.g., $V_{FE,ACT}=V_{PP}$).

In Example 106, the memory cell arrangement of Example 105 may optionally include that a voltage value of the inhibit-voltage ($V_{FE,PAS}$) and a voltage value of the write-voltage (e.g., $V_{FE,ACT}$) may be bipolar (e.g., of opposite sign). The inhibit-voltage ($V_{FE,PAS}$) may have a positive voltage value and the read-voltage (e.g., $V_{FE,ACT}$) may have a negative voltage value, or vice versa.

In Example 107, the memory cell arrangement of Example 105 or 106 may optionally further include that the absolute voltage value of the inhibit-voltage value ($|V_{FE,PAS}|$) is equal to or less than half of the absolute voltage value of the write-voltage (e.g., $|V_{FE,ACT}|/2=|V_{PP}|/2$); and/or that the absolute voltage value of the inhibit-voltage value ($|V_{FE,PAS}|$) is equal to or greater than a base-voltage (e.g., $V_{SS}=0$ V).

In Example 108, the memory cell arrangement of any one of Examples 87 to 107 may optionally further include a control circuit configured to read a selected memory cell of the plurality of memory cells. Reading the selected memory cell may include providing a read-voltage (e.g., $V_{FE,ACT}=V_G$) to a first control-line (e.g., a word-line) connected to the first control node of the selected memory cell. Reading the selected memory cell may include providing a first (active) lever-voltage (e.g., $V_{LE,ACT}=V_G$) to a second control-line (e.g., a lever-line) connected to the second control node of the selected memory cell.

In Example 109, the memory cell arrangement of Example 108 may optionally include that a voltage value of the read-voltage (e.g., $V_{FE,ACT}=V_G$) and a voltage value of the first (active) lever-voltage ($|V_{LE,ACT}|$) may be bipolar (e.g., of opposite sign). The read-voltage (e.g., $V_{FE,ACT}=V_G$) may have a positive voltage value and the first (active) lever-voltage ($|V_{LE,ACT}|$) may have a negative voltage value, or vice versa.

In Example 110, the memory cell arrangement of Example 108 or 109 may optionally further include that the voltage value of the read-voltage (e.g., $V_{FE,ACT}=V_G$) is substantially the same as the voltage value of the first (active) lever-voltage (e.g., $V_{LE,ACT}=V_G$). The absolute voltage value of the first (active) lever-voltage ($|V_{LE,ACT}|$) may be equal to or greater than half of the absolute voltage value of the first (active) lever-voltage (e.g., $|V_{LE,ACT}|=>\frac{1}{2}*|V_G|$).

In Example 111, the memory cell arrangement of Examples 87 and 110 or Examples 87 and 126 may optionally further include that reading the selected memory cell further includes: providing a first control-voltage (e.g., $V_{BL,ACT}>V_{SS}$) to a third control-line (e.g., a bit-line) connected to the third control node of the selected memory cell.

In Example 112, the memory cell arrangement of Example 111 may optionally further include that the absolute voltage value of the first control-voltage ($|V_{BL,ACT}|$) is greater than a base-voltage (e.g., $V_{SS}=0$ V).

In Example 113, the memory cell arrangement of Example 87 and any one of Examples 109 to 112 may optionally further include that reading the selected memory cell further includes: providing a second control-voltage (e.g., $V_{SL,ACT}=V_{SS}$) to the common control node (e.g., the common source-node). The second control-voltage (e.g., $V_{SL,ACT}=V_{SS}$) may be equal to or substantially equal to a base-voltage (e.g., $V_{SS}=0$ V).

In Example 114, the memory cell arrangement of Example 113 may optionally further include that the second control-voltage ($|V_{SL,ACT}|$) is equal to or greater than the base-voltage (e.g., $|V_{SL,ACT}|=>V_{SS}$).

In Example 115, the memory cell arrangement of any one of Examples 109 to 114 may optionally further include that the control circuit is further configured to prevent a disturbance caused by one or more non-selected memory cells of the plurality of memory cells during reading the selected memory cell. Prevent the disturb may include providing a second (passive) lever-voltage ($V_{LE,PAS}$) to a second control-line (e.g., a lever-line) connected to the second control node of the non-selected memory cell in the case that the read-voltage (e.g., $V_{FE,ACT}=V_G$) is provided to the first control-line (e.g., a word-line) connected to the first control node of the non-selected memory cell. The voltage value of the second (passive) lever-voltage ($V_{LE,PAS}$) may be different from the voltage value of the first (active) lever-voltage (e.g., $V_{LE,ACT}=V_{SS}$).

In Example 116, the memory cell arrangement of Example 115 may optionally include that a voltage value of the first (active) lever-voltage ($|V_{LE,ACT}|$) and a voltage value of the second (passive) lever-voltage ($V_{LE,PAS}$) may be bipolar (e.g., of opposite sign). The first (active) lever-voltage ($V_{LE,ACT}$) may have a positive voltage value and the second (passive) lever-voltage ($V_{LE,PAS}$) may have a negative voltage value, or vice versa.

In Example 117, the memory cell arrangement of Example 115 or 116 may optionally further include that the absolute voltage value of the second (passive) lever-voltage ($|V_{LE,PAS}|$) is equal to or less than the half of the absolute voltage value of the read-voltage (e.g., $|V_{FE,ACT}|/2=|V_G|/2$); and/or that the absolute voltage value of the second (passive) lever-voltage ($|V_{LE,PAS}|$) is equal to or greater than the a base-voltage (e.g., $V_{SS}=0$ V).

In Example 118, the memory cell arrangement of any one of Examples 109 to 117 may optionally further include that the control circuit is further configured to prevent a disturbance caused by one or more non-selected memory cells of the plurality of memory cells during reading the selected memory cell. Prevent the disturb may include providing an inhibit-voltage ($V_{FE,PAS}$) to a first control-line (e.g., a word-line) connected to the first control node of the non-selected memory cell. The voltage value of the inhibit-voltage value ($V_{FE,PAS}$) may be different from the voltage value of the read-voltage (e.g., $V_{FE,ACT}=V_G$).

In Example 119, the memory cell arrangement of Example 118 may optionally further include that the absolute voltage value of the inhibit-voltage value ($|V_{FE,PAS}|$) is equal to or less than half of the absolute voltage value of the read-voltage (e.g., $|V_{FE,ACT}|/2=|V_G|/2$); and/or that the absolute voltage value of the inhibit-voltage value ($|V_{FE,PAS}|$) is equal to or greater than a base-voltage (e.g., $V_{SS}=0$ V).

In Example 120, the memory cell arrangement of Examples 87 and 119 or Examples 87 and 134 may optionally further include that prevent the disturb further includes: providing a first control-voltage (e.g., $V_{BL,PAS}=V_{SS}$) to a third control-line (e.g., a bit-line) connected to the third control node of the non-selected memory cell.

In Example 121, the memory cell arrangement of Example 120 may optionally further include that the voltage value of the first control-voltage ($V_{BL,PAS}$) is substantially equal to the voltage value of a base-voltage (e.g., $V_{SS}=0$ V).

In Example 122, the memory cell arrangement of any one of Examples 118 to 121 may optionally further include that reading the selected memory cell further includes: providing a second control-voltage (e.g., $V_{SL,PAS}=V_{SS}$) to the common control node (e.g., the common source-node).

In Example 123, the memory cell arrangement of Example 122 may optionally further include that the voltage value of the second control-voltage (e.g., $V_{SL,PAS}=V_{SS}$) is substantially equal to the voltage value of a base-voltage (e.g., $V_{SS}=0$ V).

In Example 124, the memory cell arrangement of any one of Examples 119 to 124 may optionally include that a voltage value of the inhibit-voltage ($V_{FE,PAS}$) and a voltage value of the read-voltage (e.g., $V_{FE,ACT}$) may be bipolar (e.g., of opposite sign). The inhibit-voltage ($V_{FE,PAS}$) may have a positive voltage value and the read-voltage (e.g., $V_{FE,ACT}$) may have a negative voltage value, or vice versa.

Example 125 is a method, e.g., a method for operating (e.g., writing) a memory cell, according to various aspects. The method may include: applying a write voltage ($V_{PP}$) to a first control node of a memory cell, the first control node being connected to a first capacitor (e.g., to a ferroelectric capacitor FE) or a first memory element of the memory cell; applying a lever voltage (e.g., a voltage lower than the write voltage, e.g., a voltage that is equal to or close to $V_{SS}$) to a second control node of the memory cell, the second control node being connected to a second capacitor (e.g., a lever capacitor LE, e.g., a ferroelectric or dielectric capacitor) of the memory cell; and, applying a bit-line voltage (e.g., a voltage lower than the write voltage, e.g., a voltage that is equal to or close to $V_{SS}$) to a third control node of the memory cell, the third control node being connected to a source/drain region of a transistor (e.g., a field-effect transistor FT) of the memory cell.

Example 126 is a method, e.g., a method for operating (e.g., reading) a memory cell, according to various aspects. The method may include: applying a read voltage ($V_G$) to a first control node of a memory cell, the first control node being connected to a first capacitor (e.g., a ferroelectric capacitor FE) or a first memory element of the memory cell; applying a lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and applying a bit-line voltage (e.g., a voltage lower than the read voltage) to a third control node of the memory cell, the third control node being connected to a source/drain region of a transistor (e.g., a field-effect transistor FT) of the memory cell.

Example 127 is a method, e.g., a method for operating (e.g., reading and writing) a memory cell, according to various aspects. The method may include: reading a memory cell and writing the memory cell, wherein reading the memory cell includes applying a read voltage ($V_G$) to a first control node of a memory cell, the first control node being connected to a first capacitor (e.g., a ferroelectric capacitor FE) or a first memory element of the memory cell and applying a first lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and wherein writing the memory cell includes applying a write voltage ($V_{PP}$) to the first control node of the memory cell and applying a second lever voltage different from the first lever voltage (e.g., a voltage lower than the write voltage, e.g., a voltage that is equal to or close to $V_{SS}$) to the second control node of the memory cell.

In Example 128 the method of Example 127 may optionally further include applying a bit-line voltage (e.g., a voltage lower than the read voltage) to a third control node of the memory cell, the third control node being connected to a source/drain region of a transistor (e.g., a field-effect transistor FT) of the memory cell.

In Example 129 the method of Example 128 may optionally further include applying a bit-line voltage (e.g., a voltage lower than the write voltage, e.g., a voltage that is equal to or close to $V_{SS}$) to the third control node of the memory cell.

In Example 130, the memory cell arrangement of Example 85 or 86 may optionally further include that the memory cells of the plurality of memory cells are in a NAND configuration.

In Example 131, the memory cell arrangement of Example 130 may optionally further include that each field-effect-transistor structure includes a first region (e.g., to a first source/drain region) and a second region (e.g., to a second source/drain region), and that the memory cell arrangement further includes: one or more third control lines (e.g., a bit-line, e.g., a source/drain-line) including a serial connection of respective first and second regions of the memory cells of a corresponding first subset of memory cells of the one or more first subsets of memory cells.

In Example 132, the memory cell arrangement of Example 130 or 131 may optionally further include that two respective neighboring memory cells of each first subset of memory cells of the one or more first subsets of memory cells are first region to second region connected.

In Example 133, the memory cell arrangement of Example 130 to 132 may optionally further include that two respective neighboring memory cells of each first subset of memory cells of the one or more first subsets of memory cells include a shared first/second region, including a first region of one field-effect transistor structure and the second region of another field-effect transistor structure.

In Example 134, the memory cell arrangement of Example 130 to 133 may optionally further include a third control node and a fourth control node connected to a corresponding third control-line of the one or more third control lines. Each third control node may be connected to the first region of each field-effect transistor structure of the first subset of memory cells associated with the third control node. Each fourth control node may be connected to the second region of each field-effect transistor structure of the first subset of memory cells associated with the fourth control node.

In Example 135, the memory cell arrangement of any one of Examples 130 to 134 may optionally further include a control circuit configured to write a selected memory cell of the plurality of memory cells. Writing the selected memory cell may include providing a write-voltage (e.g., $V_{FE,ACT}=V_{PP}$) to a first control-line (e.g., a word-line) connected to the first control node of the selected memory cell. Writing the selected memory cell may include providing a first (active) lever-voltage (e.g., $V_{LE,ACT}=V_{SS}$) to a second control-line (e.g., a lever-line) connected to the second control node of the selected memory cell. The voltage value of the write-voltage (e.g., $V_{FE,ACT}=V_{PP}$) may be different from the voltage value of the first (active) lever-voltage (first $V_{LE,ACT}=V_{SS}$).

In Example 136, the memory cell arrangement of Example 135 may optionally include that a voltage value of the write-voltage (e.g., $V_{FE,ACT}=V_{PP}$) and a voltage value of the first (active) lever-voltage ($V_{LE,ACT}$) may be bipolar (e.g., of opposite sign). The write-voltage (e.g., $V_{FE,ACT}=V_{PP}$) may have a positive voltage value and the first (active) lever-voltage ($V_{LE,ACT}$) may have a negative voltage value, or vice versa.

In Example 137, the memory cell arrangement of Example 130 and Example 135 or Example 136 may optionally further include that writing the selected memory cell further includes: providing an inhibit voltage at each other first control-line such that the memory state of the memory cells of the other first subset of memory cells is not changed (e.g., neither written nor erased).

In Example 138, the memory cell arrangement of Example 130 and 137 may optionally further include that writing the selected memory cell further includes: providing a control-voltage to the third control node of the corresponding third control-line (e.g., a bit-line) and a control-voltage to the fourth control node of the corresponding third control-line of the selected memory cell.

In Example 139, the memory cell arrangement of Example 138 may optionally further include that the voltage value of the control-voltage is substantially equal to a base-voltage (e.g., $V_{SS}=0$ V).

In Example 140, the memory cell arrangement of any one of Examples 130 to 139 may optionally further include that the absolute voltage value of the write-voltage (e.g., $|V_{FE,ACT}|=|V_{PP}|$) is greater than the absolute voltage value of the first (active) lever-voltage (e.g., $|V_{LE,ACT}|=|V_{SS}|$).

In Example 141, the memory cell arrangement of any one of Examples 130 to 140 may optionally further include that a second (passive) lever-voltage (e.g., $|V_{LE,PAS}|$) is applied to all second control-lines connected to the (lever) capacitors of the non-selected memory cells of the memory cell arrangement that share the same first control line as the selected memory cell. The absolute voltage value of the second (passive) lever-voltage (e.g., $|V_{LE,PAS}|$) may be equal to or greater than the base-voltage (e.g., $|V_{FE,ACT}| \geq V_{SS}|$).

In Example 142, the memory cell arrangement of any one of Examples 130 to 141 may optionally further include that the voltage value of the first (active) lever-voltage (e.g., $V_{LE,ACT}=V_{SS}$) is equal or substantially equal to a base-voltage (e.g., $V_{SS}=0$ V). The absolute voltage value of the first (active) lever-voltage (e.g., $|V_{LE,ACT}|$) may be equal to or less than the half of the absolute voltage value of the write-voltage (e.g., $|V_{FE,ACT}|=\frac{1}{2}*|V_{PP}|$).

In Example 143, the memory cell arrangement of any one of Examples 130 to 142 may optionally further include that the control circuit is further configured to prevent a writing of one or more non-selected memory cells of the plurality of memory cells during writing the selected memory cell. Prevent a writing of one or more non-selected memory cells may include providing a second (passive) lever-voltage ($V_{LE,PAS}$) to a second control-line (e.g., a lever-line) connected to the second control node of the non-selected memory cell in the case that the write-voltage (e.g., $V_{FE,ACT}=V_{PP}$) is provided to the first control-line (e.g., a word-line) connected to the first control node of the non-selected memory cell. The voltage value of the second (passive) lever-voltage ($V_{LE,PAS}$) may be different from the voltage value of the first (active) lever-voltage (e.g., $V_{LE,ACT}=V_{SS}$).

In Example 144, the memory cell arrangement of Example 143 may optionally include that a voltage value of the first (active) lever-voltage ($V_{LE,ACT}$) and a voltage value of the second (passive) lever-voltage ($V_{LE,PAS}$) may be bipolar (e.g., of opposite sign). The first (active) lever-voltage ($V_{LE,ACT}$) may have a positive voltage value and the second (passive) lever-voltage ($V_{LE,PAS}$) may have a negative voltage value, or vice versa.

In Example 145, the memory cell arrangement of Example 143 or 144 may optionally further include that the absolute voltage value of the second (passive) lever-voltage ($|V_{LE,PAS}|$) is equal to or less than the absolute voltage value of the write-voltage (e.g., $|V_{FE,ACT}|=|V_{PP}|$); and/or that the absolute voltage value of the second (passive) lever-voltage ($|V_{LE,PAS}|$) is equal to or greater than the half of the absolute voltage value of the write-voltage (e.g., $|V_{FE,ACT}|/2=|V_{PP}|/2$).

In Example 146, the memory cell arrangement of any one of Examples 130 to 145 may optionally further include that the control circuit is further configured to prevent a writing of one or more non-selected memory cells of the plurality of memory cells during writing the selected memory cell. Prevent a writing of one or more non-selected memory cells may include providing an inhibit-voltage ($V_{FE,PAS}$) to a first control-line (e.g., a word-line) connected to the first control node of the non-selected memory cell. The voltage value of the inhibit-voltage value ($V_{FE,PAS}$) may be different from the voltage value of the write-voltage (e.g., $V_{FE,ACT}=V_{PP}$).

In Example 147, the memory cell arrangement of Example 146 may optionally include that a voltage value of the inhibit-voltage ($V_{FE,PAS}$) and a voltage value of the write-voltage (e.g., $V_{FE,ACT}$) may be bipolar (e.g., of opposite sign). The inhibit-voltage ($V_{FE,PAS}$) may have a positive voltage value and the read-voltage (e.g., $V_{FE,ACT}$) may have a negative voltage value, or vice versa.

In Example 148, the memory cell arrangement of Example 146 or 147 may optionally further include that the absolute voltage value of the inhibit-voltage value ($|V_{FE,PAS}|$) is equal to or less than half of the absolute voltage value of the write-voltage (e.g., $|V_{FE,ACT}|/2=|V_{PP}|/2$); and/or that the absolute voltage value of the inhibit-voltage value ($|V_{FE,PAS}|$) is equal to or greater than a base-voltage (e.g., $V_{SS}=0$ V).

In Example 149, the memory cell arrangement of any one of Examples 130 to 148 may optionally further include a control circuit configured to read a selected memory cell of the plurality of memory cells. Reading the selected memory cell may include providing a read-voltage (e.g., $V_{FE,ACT}=V_G$) to a first control-line (e.g., a word-line) connected to the first control node of the selected memory cell. Reading the selected memory cell may include providing a first (active) lever-voltage (e.g., $V_{LE,ACT}=V_G$) to a second control-line (e.g., a lever-line) connected to the second control node of the selected memory cell. Reading the selected memory cells may include providing one or more voltages to the bit-line associated with the selected memory cell such that each field-effect transistor structure that is in a serial connect with the field-effect transistor structure of the selected memory cell is in a conducting state.

In Example 150, the memory cell arrangement of Example 149 may optionally include that a voltage value of the read-voltage (e.g., $V_{FE,ACT}=V_G$) and a voltage value of the first (active) lever-voltage ($V_{LE,ACT}$) may be bipolar (e.g., of opposite sign). The read-voltage (e.g., $V_{FE,ACT}=V_G$) may have a positive voltage value and the first (active) lever-voltage ($V_{LE,ACT}$) may have a negative voltage value, or vice versa.

In Example 151, the memory cell arrangement of Example 149 or 150 may optionally further include that the voltage value of the read-voltage (e.g., $V_{FE,ACT}=V_G$) is substantially the same as the voltage value of the first (active) lever-voltage (e.g., $V_{LE,ACT}=V_G$). The absolute voltage value of the first (active) lever-voltage ($|V_{LE,ACT}|$) may be equal to or greater than half of the absolute voltage value of the first (active) lever-voltage (e.g., $|V_{LE,ACT}|=>\frac{1}{2}*|V_G|$).

In Example 152, the memory cell arrangement of Examples 130 and 151 or Examples 130 and 165 may optionally further include that reading the selected memory cell further includes: providing a first control-voltage to the third control nodes of the corresponding third control-line (e.g., a bit-lines) and a second control-voltage to the fourth control node of the corresponding third control-line of the selected memory cells.

In Example 153, the memory cell arrangement of Example 152 may optionally further include that the absolute voltage value of the first control-voltage is greater than a base-voltage (e.g., $V_{SS}=0$ V).

In Example 154, the memory cell arrangement of any one of Examples 149 to 153 may optionally further include that the control circuit is further configured to prevent a disturbance caused by one or more non-selected memory cells of the plurality of memory cells during reading the selected memory cell. Prevent the disturb may include providing a second (passive) lever-voltage ($V_{LE,PAS}$) to a second control-line (e.g., a lever-line) connected to the second control node of the non-selected memory cell in the case that the read-voltage (e.g., $V_{FE,ACT}=V_G$) is provided to the first control-line (e.g., a word-line) connected to the first control node of the non-selected memory cell. The voltage value of the second (passive) lever-voltage ($V_{LE,PAS}$) may be different from the voltage value of the first (active) lever-voltage (e.g., $V_{LE,ACT}=V_{SS}$).

In Example 155, the memory cell arrangement of Example 154 may optionally include that a voltage value of the first (active) lever-voltage ($V_{LE,ACT}$) and a voltage value of the second (passive) lever-voltage ($V_{LE,PAS}$) may be bipolar (e.g., of opposite sign). The first (active) lever-voltage ($V_{LE,ACT}$) may have a positive voltage value and the second (passive) lever-voltage ($V_{LE,PAS}$) may have a negative voltage value, or vice versa.

In Example 156, the memory cell arrangement of Example 154 or 155 may optionally further include that the absolute voltage value of the second (passive) lever-voltage ($|V_{LE,PAS}|$) is equal to or less than the half of the absolute voltage value of the read-voltage (e.g., $|V_{FE,ACT}|/2|V_G|/2$); and/or that the absolute voltage value of the second (passive) lever-voltage ($|V_{LE,PAS}|$) is equal to or greater than the a base-voltage (e.g., $V_{SS}=0$ V).

In Example 157, the memory cell arrangement of any one of Examples 149 to 156 may optionally further include that the control circuit is further configured to prevent a disturbance caused by one or more non-selected memory cells of the plurality of memory cells during reading the selected memory cell. Prevent the disturb may include providing an inhibit-voltage ($V_{FE,PAS}$) to a first control-line (e.g., a word-line) connected to the first control node of the non-selected memory cells. The voltage value of the inhibit-voltage value ($V_{FE,PAS}$) may be different from the voltage value of the read-voltage (e.g., $V_{FE,ACT}=V_G$).

In Example 158, the memory cell arrangement of Example 157 may optionally further include that the absolute voltage value of the inhibit-voltage value ($|V_{FE,PAS}|$) is equal to or less than half of the absolute voltage value of the read-voltage (e.g., $|V_{FE,ACT}|/2=|V_G|/2$); and/or that the absolute voltage value of the inhibit-voltage value ($|V_{FE,PAS}|$) is equal to or greater than a base-voltage (e.g., $V_{SS}=0$ V).

In Example 159, the memory cell arrangement of Example 157 or 158 may optionally include that a voltage value of the inhibit-voltage ($V_{FE,PAS}$) and a voltage value of the read-voltage (e.g., $V_{FE,ACT}$) may be bipolar (e.g., of opposite sign). The inhibit-voltage ($V_{FE,PAS}$) may have a positive voltage value and the read-voltage (e.g., $V_{FE,ACT}$) may have a negative voltage value, or vice versa.

Example 160 is a method, e.g., a method for operating (e.g., writing) a memory cell, according to various aspects. The method may include: applying a write voltage ($V_{PP}$) to a first control node of a memory cell, the first control node being connected to a first capacitor (e.g., to a ferroelectric capacitor FE) or a first memory element of the memory cell; applying a lever voltage (e.g., a voltage lower than the write voltage, e.g., a voltage that is equal to or close to $V_{SS}$) to a second control node of the memory cell, the second control node being connected to a second capacitor (e.g., a lever capacitor LE, e.g., a ferroelectric or dielectric capacitor) of the memory cell; and, applying a bit-line voltage (e.g., a voltage lower than the write voltage, e.g., a voltage that is equal to or close to $V_{SS}$) to a third control node of the memory cell, the third control node being connected to a source/drain region of a transistor (e.g., a field-effect transistor FT) of the memory cell.

Example 161 is a method, e.g., a method for operating (e.g., reading) a memory cell, according to various aspects. The method may include: applying a read voltage ($V_G$) to a first control node of a memory cell, the first control node being connected to a first capacitor (e.g., a ferroelectric capacitor FE) or a first memory element of the respective memory cell; applying a lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of each memory cell; and applying a bit-line voltage (e.g., a voltage lower than the read voltage) such that each transistor (e.g., a field-effect transistor FT) that is in a serial connection with the memory cell is in a conducting state.

Example 162 is a method, e.g., a method for operating (e.g., reading and writing) a memory cell, according to various aspects. The method may include: reading a memory cell and writing the memory cell, wherein reading the memory cell includes applying a read voltage ($V_G$) to a first control node of a memory cell, the first control node being connected to a first capacitor (e.g., a ferroelectric capacitor FE) or a first memory element of the respective memory cell; applying a lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and applying a bit-line voltage (e.g., a voltage lower than the read voltage) such that each transistor (e.g., a field-effect transistor FT) that is in a serial connection with the selected memory cell is in a conducting state; and wherein writing the memory cell includes applying a write voltage ($V_{PP}$) to the first control node of the memory cell and applying a second lever voltage different from the first lever voltage (e.g., a voltage lower than the write voltage, e.g., a voltage that is equal to or close to $V_{SS}$) to the second control node of the memory cell.

Example 163 is a memory cell arrangement according to the memory cell arrangement of any one of Examples 28 to 66 in combination with the memory cell arrangement of any one of Examples 87 to 124 configured such that the first electrode layer is, forms, or includes the first electrode of the first capacitor structure, the first capacitor structure is the capacitive memory structure; that the second electrode layer is, forms, or includes the first electrode of the second capacitor structure, the second capacitor structure is the capacitive structure; and that the electrode pillar is, forms, or includes the second electrode of each of the first capacitor structure and the second capacitor structure.

Example 164 is a memory cell arrangement according to the memory cell arrangement of any one of Examples 28 to 66 in combination with the memory cell arrangement of any one of Examples 130 to 159 configured such that the first electrode layer is, forms, or includes the first electrode of the first capacitor structure, the first capacitor structure is the capacitive memory structure; that the second electrode layer is, forms, or includes the first electrode of the second capacitor structure, the second capacitor structure is the capacitive structure; and that the electrode pillar is, forms, or includes the second electrode of each of the first capacitor structure and the second capacitor structure.

Example 165 is a memory cell including: a plurality of memory cells in a NOR or NAND configuration, each of the plurality memory cells including: an electrode pillar having a bottom surface and a top surface; a memory material portion surrounding a first lateral surface portion of the electrode pillar; a first electrode layer surrounding the memory material portion and the first lateral surface portion of the electrode pillar, wherein the electrode pillar, the memory material portion, and the first electrode layer form a capacitive memory structure; a dielectric material portion surrounding a second lateral surface portion of the electrode pillar different from the first lateral surface portion; a second electrode layer surrounding the dielectric material portion and the second lateral surface portion of the electrode pillar, wherein the electrode pillar, the dielectric material portion, and the second electrode layer form a capacitive structure; and a field-effect transistor structure including a gate structure, wherein the bottom surface of the electrode pillar faces the gate structure and is electrically conductively connected to the gate structure, and wherein the top surface of the electrode pillar faces away from the gate structure. The memory cell arrangement may further include one or more first control-lines (e.g., word-lines) connected to the first electrode layer of each memory cell of one or more first subsets of memory cells of the plurality of memory cells; and one or more second control-lines (e.g., lever-lines)

connected to the second electrode layer of each memory cell of one or more second subsets of memory cells of the plurality of memory cells.

In Example 166, the memory cell arrangement of Example 165 may optionally include that the capacitive memory structure has a first capacitance and that the capacitive structure has a second capacitance different from the first capacitance.

Example 167 is a memory cell, including: a field-effect transistor structure; a plurality of control nodes; a plurality of capacitor structures, each of the plurality of capacitor structures including a first electrode connected to a corresponding control node of the plurality of control nodes, a second electrode connected to a gate region of the field-effect transistor structure, and a remanent-polarizable region disposed between the first electrode and the second electrode of the capacitor structure.

In Example 168, the memory cell of Example 167 may optionally further include that each of the plurality of capacitor structures is configured to be in one of at least two memory states.

In Example 169, the memory cell of Example 167 or 168 may optionally further include that each of the plurality of control nodes is electrically conductively connected to a corresponding control-line (e.g., a corresponding wordline) of a plurality of control-lines.

In Example 170, the memory cell of Example 169 may optionally further include that each of the plurality of capacitor structures is addressable via the corresponding control-line of the plurality of control-lines.

In Example 171, the memory cell of Examples 167 and 169 may optionally further include that each of the plurality of capacitor structures can be written in a memory state and/or can be read out (e.g., to determine the memory state of the capacitor structure) using the corresponding control-line of the plurality of control-lines.

Example 172 is a memory cell arrangement, including: a plurality of memory cells, each memory cell of the plurality of memory cells is configured as the memory cell of any one of Examples 167 to 171; the memory cell arrangement may further include one or more first control-lines (e.g., first word-lines) connected to the corresponding control nodes of a first subset of memory cells of the plurality of memory cells; and one or more second control-lines (e.g., second word-lines) connected to the corresponding control nodes of a second subset of memory cells of the plurality of memory cells.

In Example 173, the memory cell arrangement of Example 172 may optionally further include that the memory cells of the plurality of memory cells are in a NOR configuration. The plurality of memory cells in the NOR configuration may be configured as described before, e.g., with reference to Example 87 to 124.

In Example 174, the memory cell arrangement of Example 172 may optionally further include that the memory cells of the plurality of memory cells are in a NAND configuration. The plurality of memory cells in the NAND configuration may be configured as described before, e.g., with reference to Example 130 to 159.

Example 175 is a memory cell arrangement according to the memory cell arrangement of any one of Examples 172 to 174 in combination with the memory cell arrangement of any one of Examples 28 to 66 configured such that the electrode pillar is, forms, or includes each second electrode of the plurality of capacitor structures; wherein each capacitor structure of the plurality of capacitor structures corresponds to a respective capacitive memory structure such that the first electrode of each of the plurality of capacitor structures is formed by a corresponding electrode layer and that the memory material portion is or corresponds to the remanent-polarizable region.

Example 176 is a memory cell arrangement including: a plurality of memory cells in a NOR or NAND configuration, each of the plurality memory cells including: an electrode pillar having a bottom surface and a top surface; a first memory material portion surrounding a first lateral surface portion of the electrode pillar; a first electrode layer surrounding the first memory material portion and the first lateral surface portion of the electrode pillar, wherein the electrode pillar, the first memory material portion, and the first electrode layer form a first capacitive memory structure; a second memory material portion surrounding a second lateral surface portion of the electrode pillar different from the first lateral surface portion; a second electrode layer surrounding the memory material portion and the second lateral surface portion of the electrode pillar, wherein the electrode pillar, the second memory material portion, and the second electrode layer form a second capacitive memory structure; and a field-effect transistor structure including a gate structure, wherein the bottom surface of the electrode pillar faces the gate structure and is electrically conductively connected to the gate structure, and wherein the top surface of the electrode pillar faces away from the gate structure. The memory cell arrangement may further include one or more first control-lines (e.g., first word-lines) connected to the first electrode layer of each memory cell of a corresponding first subset of memory cells of one or more first subsets of memory cells of the plurality of memory cells; and one or more second control-lines (e.g., second word-lines) connected to the second electrode layer of each memory cell of the corresponding first subset of memory cells.

In Example 177, the memory cell arrangement of Example 176 may optionally further include that the first capacitive memory structure may have a first capacitance and that the second capacitive structure may have a second capacitance substantially equal to the first capacitance.

In Example 178, the memory cell of any one of Examples 167 to 171 may optionally further include that the plurality of control nodes is a plurality of first control nodes, that the plurality of capacitor structures is a plurality of first capacitor structures, and that the memory cell further includes a second control node and a second capacitor structure (e.g., a lever capacitor structure, e.g., a capacitive lever structure). The second capacitor structure may include a first electrode connected to the second control node, a second electrode connected to the gate region of the field-effect transistor structure. Each first capacitor structure may have a first capacitance (e.g., the same first capacitance, e.g., a respective first capacitance) and the second capacitor structure may have a second capacitance different from the first capacitance. An electrically isolating region may be disposed between the first electrode and the second electrode of the second capacitor structure.

Example 179 is a memory cell arrangement including: a plurality of memory cells, each memory cell of the plurality of memory cells is configured as the memory cell of Example 178; the memory cell arrangement may further include one or more first control-lines (e.g., first word-lines) connected to the corresponding control nodes of a first subset of memory cells of the plurality of memory cells; and one or more second control-lines (e.g., second word-lines) connected to the corresponding control nodes of a second subset of memory cells of the plurality of memory cells.

Each memory cell of the plurality of memory cells may further include: a third control node (e.g., a first source/drain node) coupled to a first region (e.g., to a first source/drain region) of the field-effect transistor structure and a fourth control node (e.g., a second source/drain node) coupled to a second region (e.g., to a second source/drain region) of the field-effect transistor structure.

Example 180 is a memory cell arrangement including: one or more memory cells, each memory cell of the one or more memory cells including: a field-effect transistor structure; a plurality of first control nodes; a plurality of first capacitor structures, each of the plurality of first capacitor structures including a first electrode connected to a corresponding first control node of the plurality of first control nodes, a second electrode connected to a gate region of the field-effect transistor structure, and a spontaneous-polarizable region disposed between the first electrode and the second electrode of the first capacitor structure; a second control node; and a second capacitor structure including a first electrode connected to the second control node and a second electrode connected to the gate region of the field-effect transistor.

In Example 181, the memory cell arrangement of Example 180 may optionally further include that each of the plurality of first capacitor structures is configured to be in one of at least two memory states.

In Example 182, the memory cell arrangement of Example 180 or 181 may optionally further include that each first capacitor structure of the plurality of first capacitor structures has a respective first capacitance and that the second capacitor structure has a second capacitance different from one or more of the first capacitances.

In Example 183, the memory cell arrangement of any one of Examples 172 to 182 may optionally further include that each memory cell of the one or more memory cells further includes a third control node coupled to a first region and/or second region of the field-effect transistor structure In Example 184, the memory cell arrangement of any one of Examples 180 to 183 may optionally further include that the one or more memory cells are a plurality of memory cells.

In Example 185, the memory cell arrangement of any one of Examples 172 to 179 or Example 184 may optionally further include that, the memory cell arrangement further including: a plurality of first control-lines including one or more first subsets of first control-lines, each first control-line of a first subset of first control-lines of the one or more first subsets of first control-lines connected to a corresponding first control node of a first subset of memory cells of the plurality of memory cells; and one or more second control-lines connected to the second control node of each memory cell of a second subset of memory cells of the plurality of memory cells.

In Example 186, the memory cell arrangement of any one of Examples 183 to 185 may optionally further include one or more third control-lines connected to the third control node of each memory cell of a corresponding first subset of memory cells of the one or more first subsets of memory cells.

In Example 187, the memory cell arrangement of Example 185 or 186 may optionally further include a control circuit configured to write a selected first capacitor structure of a selected memory cell of the plurality of memory cells; wherein writing the selected first capacitor structure includes: providing a write-voltage ($V_{FE,ACT}$) to a first control-line connected to the first control node of the selected first capacitor structure of the selected memory cell; and providing a first lever-voltage ($V_{LE,ACT}$) to a second control-line connected to the second control node of the selected memory cell.

In Example 188, the memory cell arrangement of Examples 183 and 187 may optionally further include that writing the selected first capacitor structure of the selected memory cell further includes: providing a first control-voltage ($V_{BL,ACT}$) to a third control-line connected to the third control node of the selected memory cell.

In Example 189, the memory cell arrangement of Example 187 or 188 may optionally further include that the control circuit is further configured to prevent a writing of the non-selected first capacitor structures of the selected memory cell during writing the selected first capacitor structure of the selected memory cell, wherein prevent a writing of the non-selected first capacitor structures includes: providing a first inhibit-voltage to each of the first control-lines connected to the first control nodes of the non-selected first capacitor structures of the selected memory cell.

In Example 190, the memory cell arrangement of any one of Examples 187 to 189 may optionally further include that the control circuit is further configured to prevent a writing of the first capacitor structures of one or more non-selected memory cells of the plurality of memory cells during writing the selected first capacitor structure of the selected memory cell, wherein prevent a writing of one or more non-selected memory cells includes: providing a second lever-voltage ($V_{LE,PAS}$) to a second control-line connected to the second control node of the non-selected memory cell in the case that the write-voltage ($V_{FE,ACT}$) is provided to the first control-line connected to the first control node of the non-selected memory cell, wherein the voltage value of the second lever-voltage ($V_{LE,PAS}$) is different from the voltage value of the first lever-voltage ($V_{LE,ACT}$).

In Example 191, the memory cell arrangement of any one of Examples 187 to 190 may optionally further include that the control circuit is further configured to prevent a writing of the first capacitor structures of one or more non-selected memory cells of the plurality of memory cells during writing the selected first capacitor structure of the selected memory cell, wherein prevent a writing of one or more non-selected memory cells includes: providing a second inhibit-voltage ($V_{FE,PAS}$) to one or more first control-lines connected to the first control nodes of the non-selected memory cell, wherein the voltage value of the inhibit-voltage value ($V_{FE,PAS}$) is different from the voltage value of the write-voltage ($V_{FE,ACT}$).

In Example 192, the memory cell arrangement of any one of Examples 185 to 191 may optionally further include that a control circuit configured to read a selected first capacitor structure of a selected memory cell of the plurality of memory cells; wherein reading the selected first capacitor structure includes: providing a read-voltage ($V_{FE,ACT}$) to a first control-line connected to the first control node of the selected first capacitor structure of the selected memory cell; and providing a first lever-voltage ($V_{LE,ACT}$) to a second control-line connected to the second control node of the selected memory cell.

In Example 193, the memory cell arrangement of Examples 184 and 192 may optionally further include that reading the selected first capacitor structure of the selected memory cell further includes: providing a first control-voltage ($V_{BL,ACT}$) to a third control-line connected to the third control node of the selected memory cell.

In Example 194, the memory cell arrangement of Example 192 or 193 may optionally further include that the control circuit is further configured to prevent a disturbance caused by non-selected first capacitor structures of the selected memory cell during reading the selected first capacitor structure of the selected memory cell, wherein prevent the disturb includes: providing a first inhibit-voltage to each of the first control-lines connected to the first control nodes of the non-selected first capacitor structures of the selected memory cell.

In Example 195, the memory cell arrangement of any one of Examples 192 to 194 may optionally further include that the control circuit is further configured to prevent a disturbance caused by the first capacitor structures of one or more non-selected memory cells of the plurality of memory cells during reading the selected first capacitor structure of the selected memory cell, wherein prevent the disturb includes: providing a second lever-voltage ($V_{LE,PAS}$) to a second control-line connected to the second control node of the non-selected memory cell in the case that the read-voltage ($V_{FE,ACT}$) is provided to the first control-line connected to the first control node of the non-selected memory cell, wherein the voltage value of the second lever-voltage ($V_{LE,PAS}$) is different from the voltage value of the first lever-voltage ($V_{LE,ACT}$).

In Example 196, the memory cell arrangement of any one of Examples 192 to 195 may optionally further include that the control circuit is further configured to prevent a disturbance caused by the first capacitor structures of one or more non-selected memory cells of the plurality of memory cells during reading the selected first capacitor structure of the selected memory cell, wherein prevent the disturb includes: providing a second inhibit-voltage ($V_{FE,PAS}$) to one or more first control-lines connected to the first control nodes of the non-selected memory cell, wherein the voltage value of the inhibit-voltage value ($V_{FE,PAS}$) is different from the voltage value of the read-voltage ($V_{FE,ACT}$).

In Example 197, the memory cell arrangement of any one of Examples 172 to 196 may optionally further include that the memory cells of the plurality of memory cells are in a NOR configuration. The plurality of memory cells in the NOR configuration may be configured as described before, e.g., with reference to Example 87 to 124.

In Example 198, the memory cell arrangement of any one of Examples 172 to 196 may optionally further include that the memory cells of the plurality of memory cells are in a NAND configuration. The plurality of memory cells in the NAND configuration may be configured as described before, e.g., with reference to Example 130 to 159.

Example 199 is a memory cell arrangement according to the memory cell arrangement of any one of Examples 172 to 198 in combination with the memory cell arrangement of Example 58 configured such that the electrode pillar is, forms, or includes each second electrode of the plurality of capacitor structures; wherein each capacitor structure of the plurality of capacitor structures corresponds to a respective capacitive memory structure such that the first electrode of each of the plurality of capacitor structures is formed by a corresponding first electrode layer of the one or more first electrode layers, and that the memory material portion is or corresponds to the remanent-polarizable region. The capacitive lever structure may correspond to the second capacitor structure.

Example 200 is a memory cell arrangement including: one or more memory cells, each memory cell of the one or more memory cells including: a field-effect transistor structure; a plurality of control nodes; and a plurality of capacitor structures, each of the plurality of capacitor structures including a first electrode connected to a corresponding control node of the plurality of control nodes, a second electrode connected to a gate region of the field-effect transistor structure, and a spontaneous-polarizable region disposed between the first electrode and the second electrode of the capacitor structure.

In Example 201, the memory cell arrangement of Example 200 may optionally further include that the one or more memory cells are a plurality of memory cells in a NOR or NAND configuration.

In Example 202, the memory cell arrangement of Example 201 may optionally include that the memory cells of the plurality of memory cells are in a NOR configuration and that the plurality of memory cells in the NOR configuration may be configured as described before, e.g., with reference to Example 87 to 124.

In Example 203, the memory cell arrangement of Example 201 may optionally include that the memory cells of the plurality of memory cells are in a NAND configuration and that the plurality of memory cells in the NAND configuration may be configured as described before, e.g., with reference to Example 130 to 159.

Example 204 is a memory cell arrangement according to the memory cell arrangement of any one of Examples 200 to 203 in combination with the memory cell arrangement of any one of Examples 28 to 66 configured such that the electrode pillar forms all of the second electrodes, that each first electrode layer of a plurality of electrode layers forms a corresponding first electrode, and that the spontaneous-polarizable region corresponds to the memory material portion.

Example 205 is a method, e.g., a method for operating a memory cell, the method including: applying a control voltage to a first control node selected from a plurality of first control nodes of a memory cell, each of the plurality of first control nodes being connected to a corresponding first capacitor structure of a plurality of first capacitor structures of the memory cell; applying a lever voltage to a second control node of the memory cell, the second control node being connected to a second capacitor of the memory cell; and, and applying a bit-line voltage to a third control node of the memory cell, the third control node being connected to at least one source/drain region of a transistor of the memory cell.

In Example 206, the method of Example 205 may optionally include that the control voltage is a write voltage ($V_{PP}$) or a read voltage ($V_G$).

It is noted that one or more functions described herein with reference to a memory cell, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
   an access device;
   a plurality of word-line nodes;
   a plurality of memory capacitor structures, each of the plurality of memory capacitor structures comprising a first electrode connected to a corresponding word-line node of the plurality of word-line nodes, a second electrode connected to the access device, and a spontaneous-polarizable region disposed between the first electrode and the second electrode.

2. The memory cell of claim 1, wherein the access device comprises an n-type field-effect transistor (FET), a p-type FET, an n-type-based transmission gate, or a p-type-based transmission gate.

3. The memory cell of claim 1, wherein the access device comprises a field-effect transistor structure and the second electrode is connected to the field-effect transistor structure.

4. The memory cell of claim 1,
   wherein each memory capacitor structure of the plurality of memory capacitor structures is configured to reside in one of at least two memory states.

5. The memory cell of claim 1, wherein the access device comprises a field-effect transistor structure, the memory cell further comprising:
   a bit-line coupled to a first source/drain region and/or second source/drain region of the field-effect transistor structure.

6. The memory cell of claim 5,
   wherein the plurality of word-line nodes allow for an individual operation of each of the plurality of memory capacitor structures via the access device.

7. The memory cell of claim 1,
   wherein the memory cell is configured to allow for an individual operation of a plurality of sub memory cells, each sub memory cell of the plurality of sub memory cells is provided by one of the plurality of memory capacitor structures and the access device and wherein each sub memory cell is configured to store information via writing the sub memory cell into one of at least two memory states.

8. The memory cell of claim 1,
   wherein the first electrode of each of the plurality of memory capacitor structures is a shared first electrode.

9. The memory cell of claim 8,
   wherein the second electrode of each of the plurality of memory capacitor structures is provided by a corresponding electrode layer electrode layer of a plurality of electrode layers;
   wherein the shared first electrode has a pillar shape and extends through the plurality of electrode layers.

10. A memory cell arrangement, comprising:
    a plurality of memory cells, each memory cell of the plurality of memory cells comprising:
       an access device;
       a plurality of control nodes;
       a plurality of memory capacitor structures, each of the plurality of memory capacitor structures comprising a first electrode connected to a corresponding control node of the plurality of control nodes, a second electrode connected to the access device, and a spontaneous-polarizable region disposed between the first electrode and the second electrode.

11. The memory cell arrangement of claim 10,
    wherein each memory capacitor structure of the plurality of memory capacitor structures is configured to reside in one of at least two memory states.

12. The memory cell arrangement of claim 10, wherein the access device comprises a field-effect transistor structure and each memory cell of the plurality of memory cells further comprises:
    a further control node coupled to a first source/drain region and/or second source/drain region of the field-effect transistor structure; and
    wherein the plurality of control nodes and the further control node are configured to allow for an operation a respective memory cell of the plurality of memory cells.

13. The memory cell arrangement of claim 12, further comprising:
    a bit-line and/or a source line to address a subset of memory cells of the plurality of memory cells, wherein the further control node of each memory cell of the subset of memory cells is connected to the bit-line and/or the source-line; and
    a plurality of control-lines to address the subset of memory cells, wherein the plurality of control-lines are connected to the plurality of control nodes of each memory cell of the subset of memory cells.

14. The memory cell arrangement of claim 10, further comprising:
    a control circuit configured to write a selected memory capacitor structure of a selected memory cell of the plurality of memory cells; wherein writing the selected memory capacitor structure comprises:
       providing a write-voltage to a control-line connected to a control node of the plurality of control nodes that corresponds to the selected memory capacitor structure of the selected memory cell.

15. The memory cell arrangement of claim 14, wherein the access device comprises a field-effect transistor structure and each memory cell of the plurality of memory cells further comprises:
    a further control node coupled to a first region and/or second region of the field-effect transistor structure;
    wherein writing the selected memory capacitor structure of the selected memory cell further comprises:
       providing a control-voltage to a bit-line and/or a source-line connected to the further control node of the selected memory cell.

16. The memory cell arrangement of claim 14,
    wherein the control circuit is further configured to prevent a writing of non-selected memory capacitor structures of the selected memory cell during writing the selected memory capacitor structure of the selected memory cell, wherein prevent the writing of the non-selected memory capacitor structures comprises:
       providing a first inhibit-voltage to each control-line that is connected to a control node of the plurality of control nodes associated with the non-selected memory capacitor structures of the selected memory cell.

17. The memory cell arrangement of claim 14,
    wherein the control circuit is further configured to prevent a writing of the plurality of memory capacitor structures of a non-selected memory cell of the plurality of memory cells during writing the selected memory capacitor structure of the selected memory cell, wherein prevent the writing of the plurality of memory capacitor structures of the non-selected memory cell comprises:
       providing an inhibit-voltage to a plurality of control-lines connected to the plurality of control nodes of the non-selected memory cell, wherein a voltage value of the inhibit-voltage value is different from a voltage value of the write-voltage.

18. The memory cell arrangement of claim 10, further comprising:
- a control circuit configured to read a selected memory capacitor structure of a selected memory cell of the plurality of memory cells; wherein reading the selected memory capacitor structure comprises:
  - providing a read-voltage to a control-line connected to the control node of the selected memory capacitor structure of the selected memory cell.

19. The memory cell arrangement of claim 18, wherein the access device comprises a field-effect transistor structure and each memory cell of the plurality of memory cells further comprises:
- a further control node coupled to a first source/drain region and/or second source/drain region of the field-effect transistor structure;
  wherein reading the selected memory capacitor structure of the selected memory cell further comprises:
- providing a control-voltage to a bit-line and/or a source-line connected to the further control node of the selected memory cell.

20. The memory cell arrangement of claim 10,
wherein, for each memory cell of the plurality of memory cells, the first electrode of each of the plurality of memory capacitor structures is a shared first electrode; and
wherein the second electrode of each of the plurality of memory capacitor structures is provided by a corresponding electrode layer electrode layer of a plurality of electrode layers; and
wherein the shared first electrode has a pillar shape and extends through the plurality of electrode layers.

\* \* \* \* \*